(12) United States Patent
Stoykovich et al.

(10) Patent No.: US 8,133,534 B2
(45) Date of Patent: Mar. 13, 2012

(54) METHODS AND COMPOSITIONS FOR FORMING PATTERNS WITH ISOLATED OR DISCRETE FEATURES USING BLOCK COPOLYMER MATERIALS

(75) Inventors: Mark P. Stoykovich, Dover, NH (US); Huiman Kang, Madison, WI (US); Konstantinos C. Daoulas, Goettingen (DE); Juan J. de Pablo, Madison, WI (US); Marcus Muller, Goettingen (DE); Paul Franklin Nealey, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 62 days.

(21) Appl. No.: 11/879,758

(22) Filed: Jul. 17, 2007

(65) Prior Publication Data

US 2008/0299353 A1     Dec. 4, 2008

Related U.S. Application Data

(63) Continuation-in-part of application No. 11/286,260, filed on Nov. 22, 2005.

(60) Provisional application No. 60/831,736, filed on Jul. 17, 2006, provisional application No. 60/630,484, filed on Nov. 22, 2004.

(51) Int. Cl.
  *B05D 5/00* (2006.01)
(52) U.S. Cl. ...................................... 427/256
(58) Field of Classification Search .................... 427/256
  See application file for complete search history.

(56) References Cited

U.S. PATENT DOCUMENTS

| | | | |
|---|---|---|---|
| 3,444,732 | A | 5/1969 | McKinley et al. |
| 5,948,470 | A | 9/1999 | Harrison et al. |
| 6,746,825 | B2 | 6/2004 | Nealey et al. |
| 6,893,705 | B2 | 5/2005 | Thomas et al. |
| 6,926,953 | B2 | 8/2005 | Nealey et al. |
| 2003/0091752 | A1 * | 5/2003 | Nealey et al. ............. 427/558 |
| 2004/0143063 | A1 | 7/2004 | Chen et al. |
| 2006/0134556 | A1 | 6/2006 | Nealey et al. |
| 2008/0299353 | A1 | 12/2008 | Stoykovich et al. |
| 2009/0087653 | A1 | 4/2009 | Nealey et al. |
| 2009/0087664 | A1 | 4/2009 | Nealey et al. |
| 2009/0196488 | A1 | 8/2009 | Nealey et al. |
| 2009/0260750 | A1 | 10/2009 | Nealey et al. |

FOREIGN PATENT DOCUMENTS

| | | |
|---|---|---|
| JP | 2007125699 | 5/2007 |
| JP | 2007/138052 | 6/2007 |
| JP | 2007/313568 | 12/2007 |
| WO | WO 2006112887 | 6/2006 |
| WO | 2007/111215 A | 10/2007 |
| WO | 2009/146086 | 3/2010 |

OTHER PUBLICATIONS

Peters et al., "Combining advanced lithographic techniques and self-assembly of thin films of diblock copolymers to produce templates for nanofabrication," J. Vac. Sci. Technol. B 18(6), Nov./Dec. 2000, pp. 3530-3534.*
U.S. Appl. No. 11/645,060, filed Oct. 5, 2006, Nealey et al.
U.S. Appl. No. 11/580,694, filed Oct. 12, 2006, Nealey et al.
International Search Report dated May 2, 2007 issued in WO2006112887.
Written Opinion dated May 2, 2007 issued in WO2006112887.
Preliminary Examination Report dated May 30, 2007 issued in WO2006112887.
Asakawa et al. (2002) Nanopatterning with Microdomains of Block Copolymers using Reactive-Ion Etching Selectivity, *Jpn. J. Appl. Phys.*vol. 41 (2002) pp. 6112-6118.
Bates et al. (1990) Block Copolymer Thermodynamics: Theory and Experiment, *Annu.Rev.Phys. Chem.*, 1990, 41: pp. 525-557.
Bates et al. (1997) Polymeric Bicontinuous Microemulsions, *Phy Rev Ltrs*, vol. 69, No. 5, Aug. 4, 1997.
Bates et al. (1995) Isotropic Lifshitz Behavior in Block Copolymer-Homopolymer Blends, *Phy Rev Ltrs*, vol. 75, No. 24, Dec. 11, 1995.
Berreman et al. (1990) Use of trilevel resists for high-resolution soft-x-ray projection lithography, *Appl. Phys Lett.* 56 (22), May 28, 1990, p. 2180.
Black et al. (2001) Integration of self-assembled diblock copolymers for semiconductor capacitor fabrication, *Applied Physics Letters*, vol. 79, No. 3, Jul. 16, 2001, pp. 409-411.
Black et al. (2004) High-Capacity, Self-Assembled Metal-Oxide-Semiconductor Decoupling Capacitors, *IEEE Electron Device Ltrs*, vol. 25, No. 9, Sep. 2004.
Boltau et al. (1998) Surface-induced structure formation of polymer blends on patterned substrates, *Nature*, vol. 391, Feb, 1998, p. 877.
Broseta et al. (1990) Phase equilibria in copolymer/homopolymer ternary blends: Molecular weight effects, *J. Chem. Phy.*, 93(4), Aug. 15, 1990.

(Continued)

*Primary Examiner* — William Phillip Fletcher, III
(74) *Attorney, Agent, or Firm* — Weaver Austin Villeneuve & Sampson LLP

(57) ABSTRACT

Methods of directing the self assembly of block copolymers on chemically patterned surfaces to pattern discrete or isolated features needed for applications including patterning integrated circuit layouts are described. According to various embodiments, these features include lines, t-junctions, bends, spots and jogs. In certain embodiments a uniform field surrounds the discrete feature or features. In certain embodiments, a layer contains two or more distinct regions, the regions differing in one or more of type of feature, size, and/or pitch. An example is an isolated spot at one area of the substrate, and a t-junction at another area of the substrate. These features or regions of features may be separated by unpatterned or uniform fields, or may be adjacent to one another. Applications include masks for nanoscale pattern transfer as well as the fabrication of integrated circuit device structures.

22 Claims, 44 Drawing Sheets

OTHER PUBLICATIONS

Burgaz et al. (2000) T-Junction Grain Boundaries in Block Copolymer-Homopolymer Blends, *Macromolecules*, vol. 33, pp. 8739-8745.

Campbell et al. (2000) Fabrication of photonic crystals for the visible spectrum by holographic lithography, Nature, vol. 404, Mar. 2, 2000, p. 53.

Cardinale et al. (1999) Demonstration of pattern transfer into sub-100 nm polysilicon line/space features patterned with extreme ultraviolet lithography, *J. Va. Sci. Technol.B* vol. 17(6), Nov./Dec. 1999.

Chan et al. (1999) Ordered Bicontinuous Nanoporous and Nanorelief Cermamic Films from Self Assembling Polymer Precursors, *Science*, 286, 1716 (1999); DOI: 10.1126/Science.386.5445.1716.

Chen et al. (1998) Morphology of thin block copolymer fiilms on chemically patterned substrates, Journal of Chemical Physics, Apr. 22, 1998, vol. 108, No. 16, p. 6897.

Cheng et al (2001) Formation of a Cobalt Magnetic Dot Array viz Block Copolymer Lithography, *Adv Mater 2001*, 13, No. 15 Aug. 3, 2001, p. 1174.

Cheng et al. (2002) Fabrication of nanostructures with long-range order using block copolymer lithography, *Applied Physics Letters*, vol. 81, No. 19, Nov. 4, 2002, p. 3657.

Cheng et al. (2003) Templated Self-Assembly of Block Copolymers: Effect of Substrate Topography, *Advanced Materials* 2003, vol. 15, No. 19, Oct. 2, pp. 1599-1602.

Cheng et al.(2001) Formation of a Cobalt Magnetic Dot array via Block Copolymer Lithography, *Advanced Materials*, 2001, vol. 13, No. 15, Aug. 3, pp. 1174-1178.

Corvazier et al. (2001) Lamellar phases and microemulsions in model ternary blends containing amphiphilic block copolymers, The Royal Society of Chemistry, J. Mater. Chem, 2001, 11, pp. 2864-2874.

Coulon et al. (1989) Surface-Induced Orientation of Symmetric, Diblock Copolymers: A Secondary Ion Mass Spectrometry Study, *Macromolecules*, vol. 22, pp. 2581-2589.

Coulon et al. (1993) Time Evolution of the Free Surface of Ultrathin Copolymer Films, Macromolecules, vol. 26, pp. 1582-1589.

Daoulas et al. (2006) Fabrication of Complex Three-Dimensional Nanostructures from Self-Assembling Block Copolymer Matrials on Two-Dimensional Chemically Patterned Templates with Mismatched Symmetry, *Physical Review Letters*, Jan. 27, 2006, PRL 96, 036104.

Daoulas et al. (2006) Morphology of multi-component polymer systems: single chain in mean field simulation studies, *The Royal Society of Chemistry, Soft Matter*, 2006, vol. 2, pp. 573-583.

Düchs et al. (2003) Fluctuation Effects in Ternary AB + A + B Polymeric Emulsions, Macromolecules V36, pp. 9237-9248.

Düchs et al. (2004) Formation and structure of the microemulsion phase in two-dimensional ternary Ab+A+B Polymeric emulsions, Jnl of Chem Phy, vol. 121, No. 6, Aug. 8, 2004, p. 2798.

Edwards et al. (2004) Precise Control over Molecular Dimensions of Block-Copolymer Domains Using the Interfacial Energy of Chemically Nanopatterned Substrates, *Advanced Materials*, 2004, vol. 16, No. 15, Aug. 4, pp. 1315-1319.

Fasolka et al. (2000) Morphology of Ultrathin Supported Diblock Copolymer Films: Theory and Experiment, *Macromolecules* vol. 33, pp. 5702-5712.

Floudas et al. (1997) Microphase separation in block copolymer/ homopolymer blends: Theory and experiment, *J. Chem. Phys.* 106 (8), Fe. 22, 1997, p. 3318.

Fukukawa et al. (2005) Synthesis and Characterization of Silicon-Containing Block Copolymers from Nitroside-Mediated Living Free Radical Polymerization, Macromolecules vol. 38, pp. 263-270.

Helfand et al. (1972) Theory of the Interface between Immiscible Polymers,II, Journal of Chemical Physics, vol. 56, No. 7, Apr. 1, 1972.

Hillmyer et al. (1991) Model Bicontinuous Microemulsions in Ternary Homopolymer/Block Copolymer Blends, J. Phy. Chem. B 1999, 103, pp. 4814-4824.

Huang et al. (1991) Modeling Copolymer Adsorption on Laterally Heterogeneous Surfaces, Physical Review Letters, Feb 4, 1991, vol. 66, No. 5, p. 620.

Jeong et al. (2002) Asymmetric Block Copolymers with Homopolymers: Routes to Multiple Length Scale nanostructures, Adv. Mater 2002.,14, No. 4, Feb. 19, 2002, p. 274.

Jeong et al. (2003) Precise Control of Nanopore Size in Thin Film Using Mixtures of Asymmetric Block Copolymer and Homopolymer, Macromolecules 2003, 36, pp. 10126-10129.

Kim et al. (2000) Chemical Modification of Self-Assembled Monolayers by Exposure to Soft X-rays in Air, J. Phys. Chem.,vol. 104, No. 31, 2000, pp. 7403-7410.

Kim et al. (2003) Epitaxial self-assembly of block copolymers on lithographically defined nanopatterned substrates, Nature, vol. 424, Jul. 24, 2003, Nature Publishing Group, p. 411.

Krishnan et al. (2001) Shear-Induced Nano-Macro Structural Transition in a Polymeric Bicontinuous Microemulsion, Phy Rev Ltrs, vol. 87, No. 9, Aug. 27, 2001, p. 098301-1.

Li et al. (2000) Dense arrays of ordered GaAs nanostructures by selective area growth on substrates patterned by block copolymer lithography, Applied Physics Letters, vol. 76, No. 13, Mar. 27, 2000, pp. 1689-1691.

Mansky et al. (1997) Ordered Diblock Copolymer Films on Random Copolymer Brushes, Macromolecules 1997, 30, pp. 6810-6813.

Mansky et al. (2006) Controlling Polymer-Surface Interactions with Random Copolymer Brushes, http://www.jstor.org/, Wed. Aug. 16, 2006.

Messe et al. (2003) Effect of the Molecular weight of the homopolymers on the morphology in ternary blends of polystyrene, polyisoprene, polystyrene-block-polyisoprene copolymer, Polymer, 44 (2003) pp. 7397-7403.

Morkved et al. (1999) Dynamics of ternary polymer blends: Disordered, ordered and bicontinouous microemulsion phases, Faraday Discuss.,1999, 112, pp. 335-350.

Morkved et al. (2001) Static and Dynamic Scattering from Ternary Polymer Blends: Bicontinuous Microemulsions, Lifshitz lines, and amphiphilicity, *Jnl of Chem Phy*, V.114, No. 16, Apr. 22, 2001, p. 7247.

Mortensen et al. (2000) Ternary mixture of homopolymer blend and diblock copolymer studied near the Lifshitz composition by small-angle neutron scattering, J. Appl. Cryst., 2000, 33, pp. 686-689.

Muller et al. (2005) Phase Separation in Binary Mixtures Containing Polymers: A Quantitative Comparison of Single-Chain-In-Mean-Field Simulations and Computer Simulations of the Corresponding Multichain Systems, *Jnl of Polymer Science: Part B: Polymer Physics*, vol. 43, pp. 934-958; published on-line in Wiley InterScience (www.interscience.wiley.com).

Naito et al. (2002) 2.5-Inch Disk Patterned Media Prepared by an Artificially Assisted Self-Assembling Method, *IEEE Trans.on Magnetics*, vol. 38, No. 5, Sep. 2002, p. 1949.

Orso et al. (1999) Phase Behavior of Thin Film Blends of Block Copolymers and Homopolymers: Changes in Domain Dimensions, *Macromolecules*, 32, pp. 1087-1092.

Park et al. (1997) Block Copolymer Lithography: Periodic Arrays of $\sim 10^{11}$ Holes in 1 Square Centimeter, *Science*, vol. 276, May 30, 1997, pp. 1401-1404.

Park et al. (2003) Enabling nanotechnology with self assembled block copolymer patterns, *Polymer*, vol. 44 (2003) pp. 6725-6760; www.sciencedirect.com.

Pereira et al. (1998) Diblock Copolymer Thin Films on Heterogeneous Striped Surfaces: Commensurate, Incommensurate and inverted Lamellae, *Physical Review Letters*, vol. 80, No. 13, Mar. 30, 1998, p. 2849.

Peters et al. (2000) Using Self-Assembled Monolayers Exposed to X-rays to Control the Wetting Behavior of Thin Films of Diblock Copolymers, *Langmuir*, vol. 16, No. 10, 2000, pp. 4625-4631.

Rockford et al. (1999) Polymers on Nanoperiodic, Heterogeneous Surfaces, *Phy. Rev. Ltrs, The American Physical Society*, vol. 82, No. 12, p. 2602.

Russell et al. (1989) Characteristics of the Surface-Induced Orientation for Symmetric Diblock PS/PMMA Copolymers, *Macromolecules*, vol. 22, pp. 4600-4606.

Schattenburg et al. (1995) Optically matched trilevel resist process for nanostructure fabrication, *J. Vac. Sci Technol. B*, 15(6), Nov./Dec. 1995, p. 3007.

Schwahn et al. (1999) Crossover from 3D Ising to Isotropic Lifshitz Critical Behavior in a Misture of a Homopolymer Blend and Diblock Copolymer, *Phy. Rev. Ltrs, The American Physical Society*, vol. 82, No. 25, Jun. 21, 1999, p. 5056.

Schwahn et al. (2000) Thermal Composition fluctuations near the isotropic Lifshitz critical point in a ernary mixture of a homopolymer blend and diblock copolymer, *Jnl. Chem. Phy.*, vol. 112, No. 12, Mar. 22, 2000, p. 5454.

Solak, Harun H. (2006) Nanolithography with coherent extreme ultraviolet light, *Jnl. Of Physics D: App. Phys*,39 (2006) R171-R188.

Stoykovich et al. (2005) Directed Assembly of Block Copolymer Blends into Nonregular Device-Oriented Structures, *Science*, vol. 308, Jun. 3, 2005, www.sciencemag.org, p. 1442.

Stoykovich et al. (2006) Block Copolymers and Conventional Lithogrphy, *Materialstoday*, vol. 9, No. 9, Sep. 2006, p. 20.

Stoykovich et al. (2006) Phase Behavior of Symmetric Ternary Block Copolymer-Homopolymer Blends in Thin Films and on Chemically Patterned Surfaces, *Physical Review Letters*, Oct. 6, 2006, PRL 97, 147802 (2006).

Teubner et al. (1987) Origin of the Scattering Peak in Microemulsions, *J. Chem. Phys.*, 87(5), Sep. 1, 1997, p. 3195.

Thurn-Albrecht et al. (2000) Nanoscopic Templates from Oriented Block Copolymer Films, Communications, *Advanced Materiels*, vol. 12, No. 11, pp. 787-791.

Thurn-Albrecht et al. (2000) Ultrahigh-Density Nanowire Arrays Grown in Self-Assembled Diblock Copolymer Templates, *Science*, Dec. 15, 2000, vol. 290, pp. 2126-2129.

Torikai et al. (1997) Lamellar Domain Spacings of Diblock Copolymer/Homopolymer Blends and Conformations of Block Chains in Their Microdomains, *Macromolecules*, 30, pp. 5698-5703.

Urbas et al. (2000) Tunable Block Copolymer/Homopolymer Photonic Crystals, Advanced Materials, vol. 12, No. 11 p. 812.

Urbas et al. (2002) Bicontinuous Cubic Block Copolymer Photonic Crystals, *Advanced Materials*, vol. 14, No. 24, Dec. 17, 2002, p. 1850.

Wang et al. (2000) Symmetric diblock copolymer thin films confined between homogeneous and patterned surfaces: Simulations and theory, *Journal of Chemical Physics*, vol. 112, No. 22, Jun. 8, 2000, pp. 9996-10010.

Whitesides et al. (1991) Molecular self-Assembly and Nanochemistry: A Chemical Strategy for the Synthesis of Nanostructures, *Articles, Science* vol. 254, p. 1312, Nov. 29, 1991.

Whitesides et al. (2002) Self-Assembly at All Scales, *Science*, AAAS, 295, p. 2418.

Xu et al. (2001) The Influence of molecular weight on nanoporous polymer films, *Polymer*, 42 (2001) pp. 9091-9095; www.elsevier.com/locate/polymer.

Yang et al. (2000) Guided Self-Assembly of Symetric Diblock Copolymer Films on Chemically Nanopatterned Substrates, *Macromolecules 2000*, 33, pp. 9575-9582.

Nealey, Paul Franklin, et al., "Density Multiplication and Improved Lithography by Directed Block Copolymer Assembly," U.S. Appl. No. 12/329,484 filed Dec. 5, 2008.

International Search Report and Written Opinion of the International Searching Authority mailed Aug. 24, 2009, Application No. PCT/US 2008/085742, 14 pages.

Park, C., et al., "Enabling Nanotechnology with Self Assembled Block Copolymer Patterns," *Polymer*, Elsevier Science, Publishers B.V., GB, vol. 44, No. 22, Oct. 1, 2003, pp. 6725-6760.

Black, C.T., et al, "Polymer Self Assembly in Semiconductor Microelectronics," IBM Journal of Research and Development, International Business Machines Corporation, New York, vol. 51, No. 5, Sep. 1, 2007, XP007905680, pp. 605-633.

Stuen, K., et al., "Imaging Layers for the Directed Assembly of Block Copolymer Films: Dependence of the Physical and Chemical Properties of Patterned Polymer Brushes on Brush Molecular Weight," *Journal of Vacuum Science and Technology*, Part B, AVS/AIP, Melville, New York, vol. 25, No. 6, Dec. 6, 2007, pp. 1958-1962.

Stoykovich, M.P., et al, "Block Copolymers and Conventional Lithography," *Materials today*, Elsevier Science, Kidlington, GB, vol. 9, No. 9, Sep. 1, 2006, pp. 20-29.

Edwards, E., et al., "Dimensions and Shapes of Block Copolymer Domains Assembled on Lilthographically Defined Chemically Patterned Substrates," *Macromolecules*, vol. 40, Dec. 14, 2006, XP-002540679, pp. 90-96.

Nealey, Paul Franklin, et al., "Methods and Compositions for Forming a Periodic Patterned Copolymer Films," U.S. Appl. No. 11/286,260, filed Nov. 22, 2005.

U.S. Office Action mailed Jul. 31, 2009, from U.S. Appl. No. 11/286,260.

Nealey, Paul Franklin, "Fabrication of Complex Three-Dimensional Structures Based on Directed Assembly of Self-Assembling Materials on Activated Two-Dimensional Templates," U.S. Appl. No. 11/545,060, filed Oct. 5, 2006.

U.S. Office Action mailed Apr. 3, 2009, from U.S. Appl. No. 11/545,060.

Nealey, Paul Franklin, "Directed Assembly of Triblock Copolymers," U.S. Appl. No. 11/580,694, filed Oct. 12, 2006.

Bates, et al., "Block Copolymers—Designer Soft Materials," Physics Today, Feb. 1999, 7 pages.

Bohbot-Raviv, et al., "Discovering New Ordered Phases of Block Copolymers," The American Physical Society, vol. 85, No. 16, Oct. 16, 2000, 4 pages.

Craig, et al., "Self Assembly of Block Copolymers on Lithographically Defined Nano Patterned Substrate," Journal of Photopolymer Science & Technology, vol. 20, No. 4, Jun. 4, 2007, 7 pages.

Daoulas, et al., "Directed Assembly of Copolymer Materials on Patterned Substrates: Balance of Simple Symmetries in Complex Structures," *Journal of Polymer Science*, Copyright 2006, vol. 44, pp. 2589-2604.

Daoulas, et al., "Directed Copolymer Assembly on Chemical Substrate patterns: A Phenomenological and Single-Chain-in-Main-Field Simulations Study of the Influence of Roughness in the Substrate Pattern," *American Chemical Society*, Langmuir, published Dec. 8, 2007, vol. 24, pp. 1284-1295.

Detcheverry, et al., Monte Carlo Simulation of Coarse Grain Polymeric Systems, *The American Physical Society*, May 15, 2009, PRL 102(19) 197801(4), pp. 197801-1-197801-4.

Detcheverry, et al., Monte Carlo Simulations of a Course Grain Model for Block Copolymers and Nanocomposites, published Jun. 11, 2008, vol. 41, pp. 4989-5001.

Edwards, et al., Binary Blends of diblock Copolymers as an Effective route to Multiple, Length Scales in Perfect Directed Self-Assembly of Diblock Copolymer Thin Films, J. Vac. Sci., Technol., vol. 24, No. 1, Jan./Feb. 2006, pp. 340-344.

Edwards, et al., "Long-Range Order and Orientation of Cylinder-Forming Block Copolymers on Chemically Nanopatterned Striped Surfaces," *American Chemical Society*, Macromolecules, published Apr. 13, 2006, vol. 39, pp. 3598-3607.

Edwards, et al., "Mechanism and Kinetics of Ordering in Diblock Copolyer Thin Films on Chemically Nanopatterned Substrates," *Journal of Polymer Science*: Part B, Polymer Physics, 2005, vol. 43, pp. 3444-3459.

Ekinci, et al., "20 nm Line/Space Patterns in HSQ Fabricated by EUV Interference Lithography," Photon Lithography, MNE 2006 Micro- and Nano-Engineering, 2 pages.

Hirai, et al., "One-Step Direct-Patterning Template Utilizing Self-Assembly of POSS-Containing Block Copolymers," *Adv. Mater.*, 2009, vol. 21, pp. 4334-4338.

Galatsis, K., et al., Patterning and Templating for Nanoelectronics., *Advanced Materials*, 2010, vol. 22, pp. 769-778.

Han, et al., "Effect of Composition of Substrate-Modifying Random Copolymers on the Orientation of Symmetric and Asymmetric Diblock Copolymer Domains," *American Chemical Society*, Published Nov. 6, 2008, vol. 41, pp. 9090-9097.

Han, et al., Perpendicular Orientation of Domains in Cylinder-Forming Block Copolymer Thick Films by Controlled Interfacial Interactions, *American Chemical Society*, Macromolecules Article, Published Jun. 11, 2009, vol. 42, pp. 4896-4901.

Hong, A., et al., "Metal Nanodot Memory by Self-Assembled Block Copolymer Lift-Off," *American Chemical Society*, Nano Left 2010, vol. 10, pp. 224-229.

In, et al., Side-Chain-Grafted Random Copolymer Brushes as Neutral Surfaces for Controlling the Orientation of Block Copolymer Microdomains in Thin Films, American Chemical Society, Langmuir, published Aug. 1, 2006, vol. 22, pp. 7855-7860.

Ji, et al., "Generalization of the Use of Random Copolymers to Control the Wetting Behavior of Block Copolymer Films," American Chemical Society, published Nov. 11, 2008, vol. 41, pp. 9098-9103.

Ji, et al., "Preparation of Neutral Wetting Brushes for Block Copolymer Films from Homopolymer Blends," Advanced Materials, 2008 vol. 20, pp. 3054-3060.

Ji, Shengxiang, et al., "Molecular Transfer Printing Using Block Copolymers," *ACSNano* vol. 4, No. 2, 2010, pp. 599-609.

Kang, et al., "Control of the Critical Dimensions and Line Edge Roughness With Pre-Organized Block Copolymer Pixelated photoresists," *J. Vac. Sci. Technol.* vol. 27, No. 6, Nov./Dec. 2009, pp. 2993-2997.

Kang, et al., "Hierarchical Assembly of Nanoparticle Superstructures from Block Copolymer-Nanoparticle Composites," published Apr. 9, 2008, vol. 100(4), pp. 148303-1-148303-4.

Kang, et al., "Directed Assembly of Asymmetric Ternary Block Copolymer-Homopolymer Blends Using Symmetric Block Copolymer into Checkerboard Trimming Chemical Patterns," *J. Vac. Sci. Technol.*, vol. 26, No. 5, Nov./Dec. 2008, pp. 2495-2499.

Kim, et al., "Defect Structure in Thin Films of a Lamellar Block Copolymer Self-Assemble on Neutral Homogeneous and Chemically Nanopatterned Surfaces," *American Chemical Society*, Macromolecules, published Jul. 13, 2006, vol. 39, 5466-5470.

Kim, et al., "Synthesis of Photacid Generator-Containing Patternable Diblock Copolymers by Reversible Addition—Fragmentation Transfer Polmerization," Chemistry of Materials, *American Chemical Society*, Jul. 6, 2009, pp. 3030-3032.

La, et al., "Directed Assembly of Cylinder-Forming Block Copolymer Films and Thermochemically Induced Cylinder to Sphere Transition: A Hierarchical Route to Linear Arrays of Nanodots," Nano Letter 2005, published May 28, 2005, *American Chemical Society*, vol. 5, No. 7, pp. 1379-1384.

La, et al, "Directed Assembly of Cylinder-Forming Block Copolymers into Patterned Structures to Fabricate Arrays of Spherical Domains and Nanoparticles," *Chemistry of Materials*, 2007:19(18), pp. 4538-4544.

Liu, et al., "Modification of a Polystyrene Brush Layer by Insertion of Poly(methyl methacrylate) Molecules," *J. Vac Sci. Technol.*, vol. 27, No. 6, Nov./Dec. 2009 3038-3042.

Liu, et al., "Phase Behavior and Dimensional Scaling of Symmetric Block Copolymer—Homopolymer Ternary Blends in Thin Films," *American Chemical Society*, Macromolecules, vol. 42 Mar. 26, 2009, pp. 3063-3072.

Morin, et al., "Assembly of Nanocrystal Arrays by Block-Copolymer-Directed Nucleation," Angew. Chem. Inc., Ed. 2009, vol. 48, pp. 2135-2139.

Nakano, et al., Single-Step Single-Molecure PCR of DNA with a Homo-Priming Sequence Using a Single Primer and Hot-Startable DNA Polymerase, *Journal of Bioscience and Bioengineering*, 2000, vol. 90 No. 4, pp. 456-458.

Nath, et al., "Density Functional Theory of Molecular Structure for Thin Diblock Copolymer Films on Chemically Heterogeneous Surfaces," *Journal of Chemical Physics*, vol. 110 No. 15, Apr. 15, 1999, pp. 7483-7490.

Park, et al., "Characterization of Cylinder-Forming Block Copolymers Directed to Assemble on Spotted Chemical Patterns," *American Chemical Society*, Macromolecules, Published Nov. 4, 2008, vol. 41, pp. 9118-9123.

Park, et al., "Combinatorial Generation and Replication-Directed Assembly of Complex and Varied Geometries with Thin Films of Diblock Copolymers," *American Chemical Society*, Langmuri, published Jul. 24, 2007, vol. 23, pp. 9037-9045.

Park, et al., "Controlled growth of InGaAs/InGaAsP Quantum Dots on InP Substrates Employing Diblock Copolymer Lithography," *American Institute of Physics*, Allied Physics Letters 95, 2009, pp. 113111-1 to 113111-3.

Park, et al., "Selective Growth and Characterization of InGaAs Quantum Dots on Patterned InP Substrates Utilizing a Diblock Copolymer Template," *IEEE* 978-4244-3433-6/09, copyright 2009, pp. 52-54.

Park, et al., "Square Arrays of Vertical Cylinders of PS-b-PMMA on Chemically Nanopatterned Surfaces," *American Chemical Society*, Macromolecules, published Jul. 15, 2007, vol. 40, pp. 5084-5094.

Park, Sang-Min, "Morphological Reconstruction and Ordering in Films of Sphere-Forming Block Copolymers on Striped Chemically Patterned Surfaces," *American Chemical Society*, published Nov. 4, 2008, vol. 41, pp. 9124-9129.

Peters, et al., A Near Edge X-ray Absorption Fine Structure Spectroscopy Investigation of the Structure of Self Assembled Films of Octadecyltrichlorosilane, *American Chemical Society*, Langmuir, published Jan. 24, 2002, vol. 18, pp. 1250-1256.

Peters, et al., "Combining Advanced Lithographic Techniques and Self-Assembly of Thin Films of Diblock Copolymers to Produce Templates for Nanofabrication," *J. Vac Sci. Technol.*, vol. 18(6), Nov./Dec. 2000, pp. 3530-3534.

Peters, et al., "Morphology of Thin Films of Diblock Copolymers on Surfaces Micropatterned with Regions of Different Interfacial Energy," *American Chemical Society*, Macromolecules, published Jan. 26, 2002, vol. 35, pp. 1822-1834.

Peters, et al., "Wetting Behavior of Block Copolymers on Self Assembled Films of Alkylchlorosiloxanes: Effect of Grafting Density," *American Chemical Society*, Langmuir, published Oct. 21, 2000, vol. 16, pp. 9620-9626.

Pike, et al., "Theoretically Informed Coarse Grain Simulations of Polymeric Systems," *The Journal of Chemical Physics*, Published Aug. 27, 2009, vol. 131, pp. 084903-1 to 084903-10.

Ruiz, et al., "Density Multiplication and Improved Lithography by Directed block Copolymer Assembly," Science, vol. 321, Aug. 15, 2008, pp. 936-939.

Solak, et al., "Sub-50 nm Period Patterns With EUV Interference Lithography," Microelectronic Engineering 67-68 (2003) 56-62.

Son, et al., "Placement Control of Nanomaterial Arrays on the Surface-Reconstructed Block Copolymer Thin Films," *ACSNano*, vol. 3, No. 12, 2009, pp. 3927-3934.

Son, et al., "Surfactant-Assisted Orientation of Thin Diblock Copolyer films," *Advanced Materials*, 2008, vol. 20, pp. 3643-3648.

Stoykovich, M.P., et al, "Remediation of Line Edge Roughness in Chemical Nanopatterns by the Directed Assembly of Overlying Block Copolymer Films," Macromolecules, American Chemical Society, vol. 43, Feb. 10, 2010, pp. 2334-2342.

Stuen, et al., In situ Characterization of Block Copolymer Ordering on Chemically Nanopatterned Surfaces by time-resolved small angle X-ray Scattering, *J. Vac. Sci. Technol.* vol. 26(6), published Dec. 1, 2008, pp. 2504-2508.

Stuen, K., et al., "Dimensional Scaling of Cylinders in Thin Films of Block Copolymer-Homopolymer Ternary Blends," *Am. Chem. Society*, Macromolecules Jun. 25, 2009, vol. 42, pp. 5139-5145.

Suh, Hyo Seon, et al., "Orientation of Block Copolymer Resists on Interlayer Dielectrics with Tunable Surface Energy," American Chemical Society, vol. 43, Nov. 13, 2009, pp. 461-466.

Ting, et al., "Plasma Etch Removal of Poly (methyl methacrylate) in Block Copolymer Lithography," J. Vac. Sci. Technol., vol. 26(5), Sep./Oct. 2008, pp. 1684-1689.

Wang, et al., Behavior of Single Nanoparticle/ Homopolymer Chain in Ordered Structures of Diblock Copolymers, *Journal of Chemical Physics*, Jun. 22, 2003, vol. 118, No. 24, pp. 11278-11285.

Wang, et al., "Lamellar Structures of Symmetric Diblock Copolymers: Comparisons Between Lattice Monte Carlo Simulations and Self-Consistent Mean-Field Calculations," *American Chemical Society*, Macromolecules, published Nov. 8, 2002, vol. 35, pp. 9563-9573.

Wang, et al., "Monte Carlo Simulations of Asymmetric Diblock Copolymer Thin Films Confined Between two Homogeneous Surfaces," *American Chemical Society*, Macromolecules, published Apr. 6, 2001, vol. 34, pp. 3458-3470.

Wang, et al., "Simulations of the Morphology of Cylinder-Forming Asymmetric Diblock Copolymer Thin Films on Nanopatterned Substrates," *American Chemical Society*, Macromolecules published Feb. 7, 2003, vol. 36, pp. 1731-1740.

Wang, et al., Monte Carlo Simulations of Diblock Copolymer Thin Films Confined Between Chemically Heterogeneous Hard Surfaces, *American Chemical Society*, Macromolecules, published May 17, 2000, vol. 33, pp. 4512-4525.

Wang, et al., Monte Carlo Simulations of Diblock Copolymer Thin Films Confined Between two Homogeneous Surfaces, Journal of Chemical Physics 20001 112(1): 450-464.

Welander, et al., "Impact of Trench Width Roughness on the Graphoepitaxial Assembly of Block Copolymers," *J. Vac Sci. Technol.*, vol. 26(6), Nov./Dec. 2008, pp. 2484-2489.

Welander, et al., "Rapid Directed Assembly of Block Copolymer Films at Elevated Temperatures," *American Chemical Society*, Macromolecules, vol. 41, Published Apr. 1, 2008, pp. 2759-2761.

Xiao, et al., "Graphoepitaxy of Cylinder-forming Block Copolymers for Use as Templates to Pattern Magnetic Metal Dot Arrays," Institute of Physics Publishing, Nanotechnology, vol. 16, 2005, pp. S324-S329.

Yang et al., "Imaging the Substrate Film Interface of Thin Films of Diblock Copolymers on Chemically Patterned Surfaces," *American Chemical Society*, Macromolecules, published Feb. 16, 2002, vol. 35, pp. 2406-2409.

Yang, et al., "Patterning of Self-Assembled Monolayers with Lateral Dimensions of 0.15 um Using Advanced Lithography," *J. Vac Sci. Technol.*, vol. 17(6), Nov./Dec. 1999, pp. 3203-3207.

Yang, et al., "Proximity X-ray Lithography Using Self-Assembled Alkylsiloxane Films: Resolution and Pattern Transfer," *American Chemical Society*, Langmuir, published Dec. 8, 2000, vol. 17, 228-233.

U.S. Office Action mailed Jan. 25, 2010, from U.S. Appl. No. 11/286,260.

U.S. Office Action mailed Nov. 30, 2009, from U.S. Appl. No. 11/545,060.

U.S. Office Action mailed Dec. 2, 2009, from U.S. Appl. No. 11/580,694.

U.S. Office Action mailed Jun. 25, 2010, from U.S. Appl. No. 11/286,260.

U.S. Office Action mailed Jul. 10, 2010, from U.S. Appl. No. 11/545,060.

U.S. Final Office Action mailed Jun. 10, 2010, from U.S. Appl. No. 11/580,694.

Todo et al., "Domain-Boundary Structure of Styrene-Isoprene Block Copolymer Films Cast From Solutions .III. Preliminary-Results on Spherical Microdomains," *Polymer Engineering and Science*, 17 (8): 587-597 1977.

Morkved et al., "Local control of microdomain orientation in diblock copolymer thin films with electric fields," Science, 273 (5277): 931-933 Aug. 16, 1996, pp. 931-933.

Kim, S.H., et al., "Highly oriented and ordered arrays from block copolymers via solvent evaporation," *Advanced Materials*, Feb. 3, 2004, 16 (3), pp. 226-231.

Fasolka, MJ, et al., Block copolymer thin films: Physics and applications, Annual Review of Materials Research, 2001, 31, pp. 323-355.

Tanaka, H, et al., "Ordered Structure in Mixtures of a Block Copolymer and Homopolymers . 1. Solubilization of Low-Molecular-Weight Homopolymers," Macromolecules, 24 (1), Jan. 7, 1991, pp. 240-251.

Hamley, et al., Nanostructure fabrication using block copolymers, *Nanotechnology*, Oct. 2003, 14 (10), pp. R39-R54.

Segalman, RA, et al., "Graphoepitaxy of spherical domain block copolymer films," Advanced Materials, Aug. 3, 2001, 13 (15) pp. 1152-1155.

U.S. Office Action mailed Dec. 27, 2010, from U.S. Appl. No. 11/545,060.

Office Action mailed Oct. 7, 2010 for U.S. Appl. No. 12/416,816.

U.S. Final Office Action mailed Dec. 13, 2010, from U.S. Appl. No. 11/286,260.

U.S. Office Action mailed Mar. 15, 2011, from U.S. Appl. No. 11/545,060.

* cited by examiner

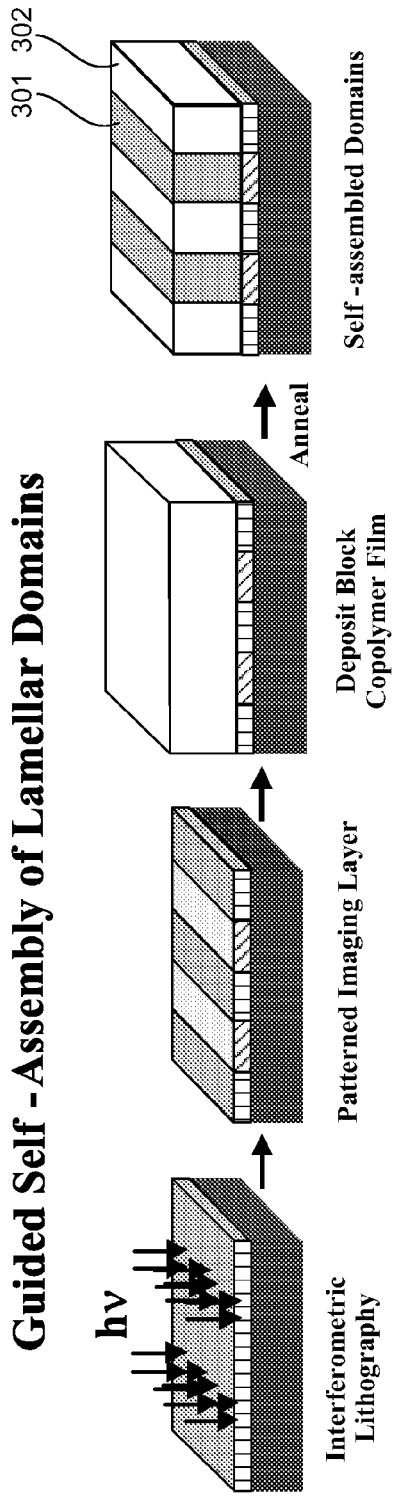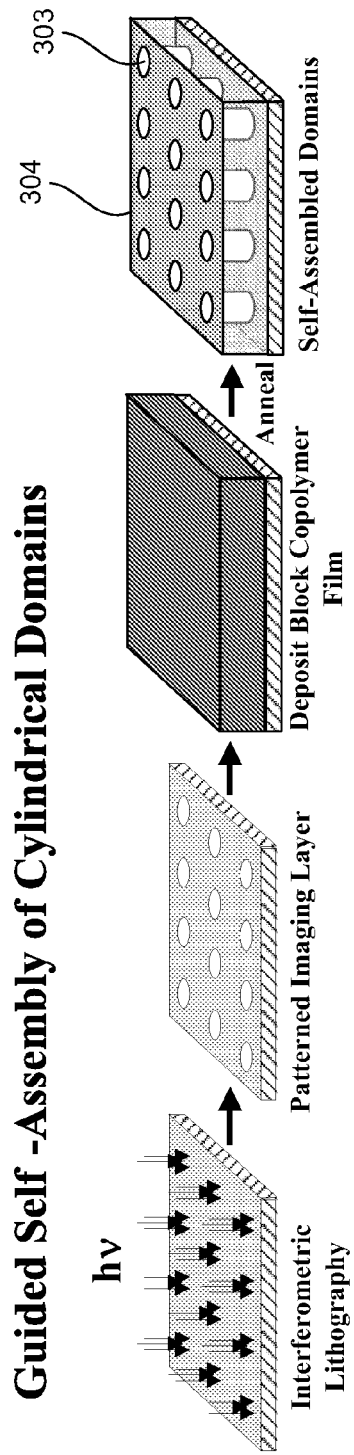

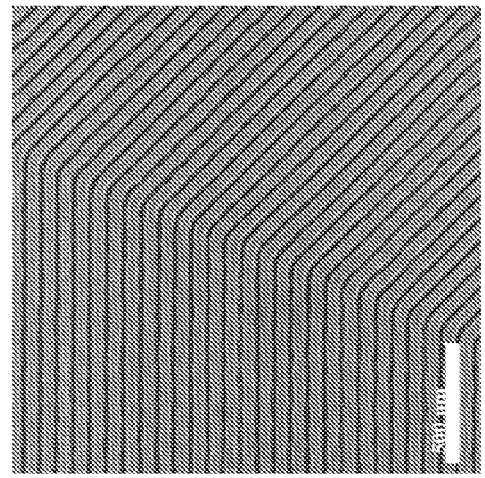
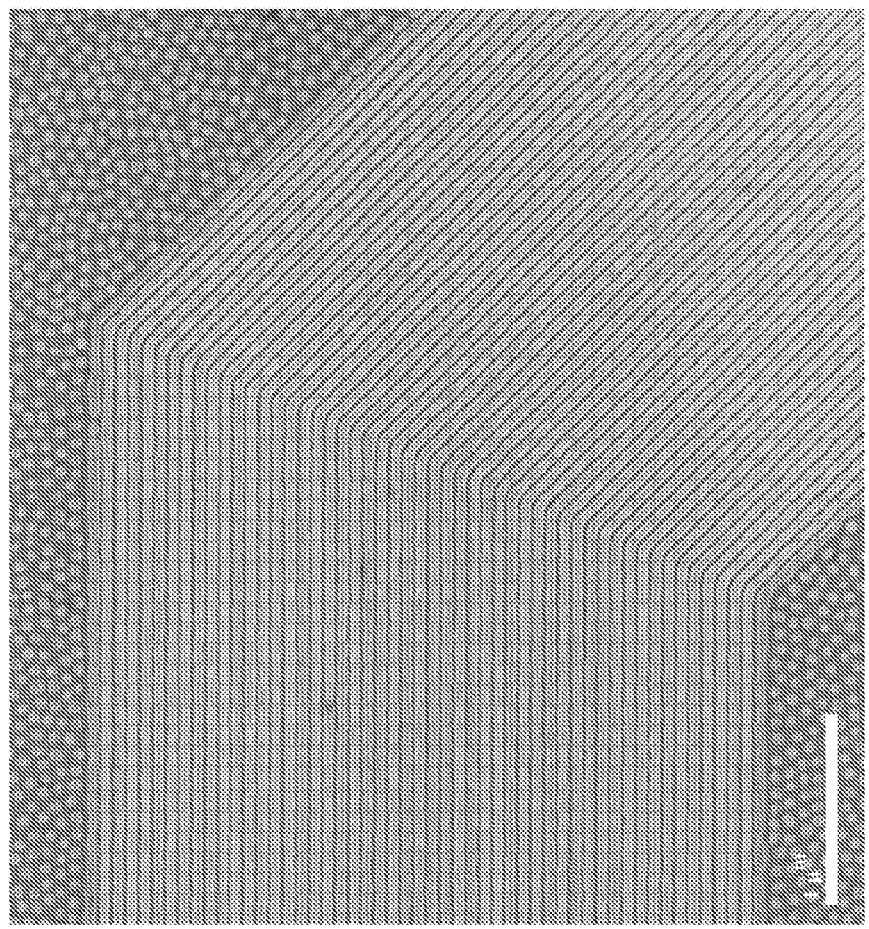
135° Angled Lamellae with $L_S$ = 70 nm
FIG. 9

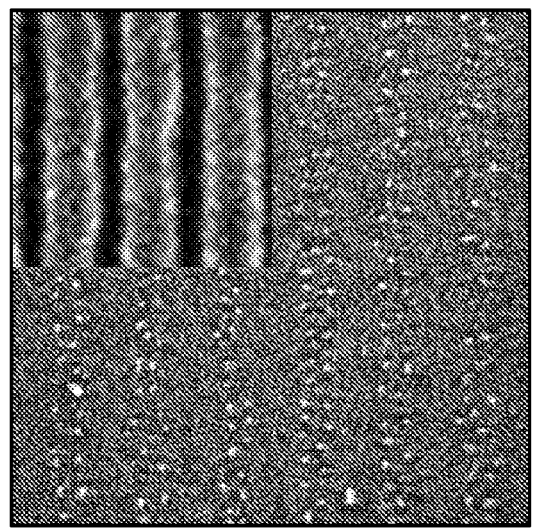
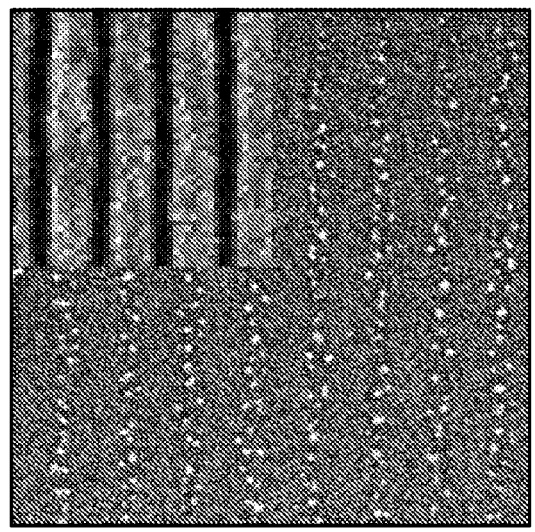
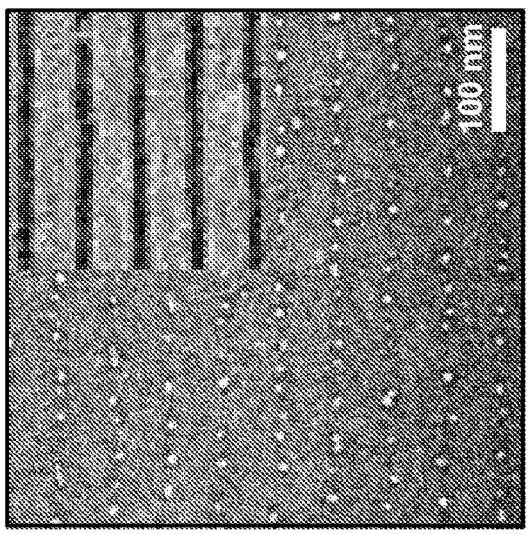
FIG. 15B

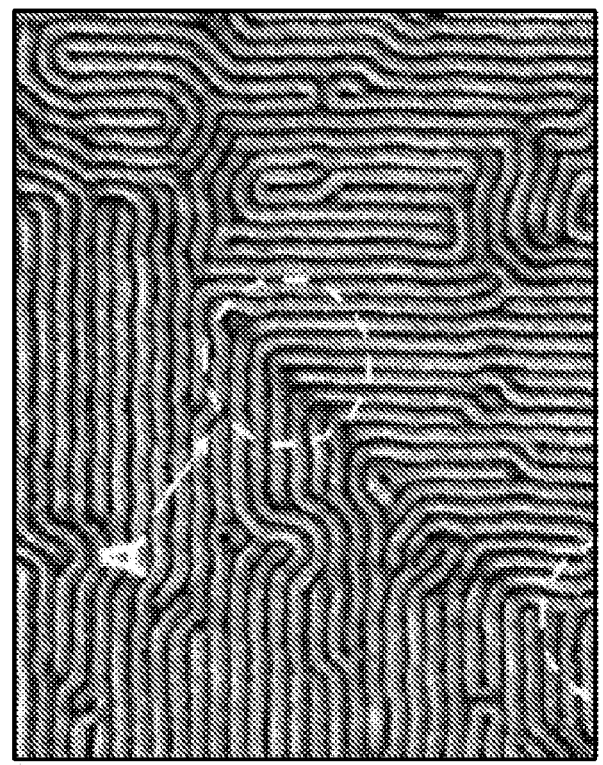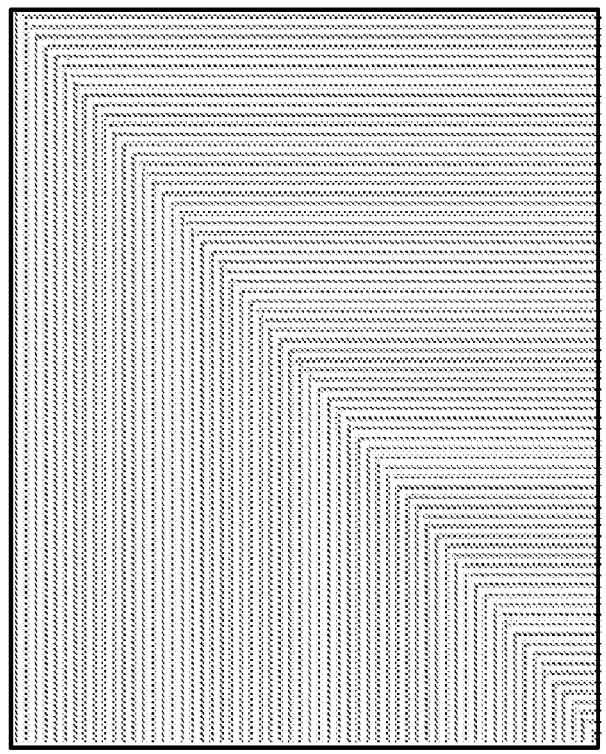
FIG. 18

135° Angled Lamellae with $L_S = 65$ nm

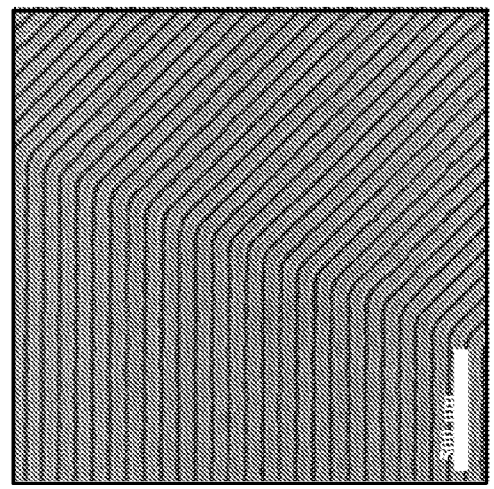
*FIG. 19B*
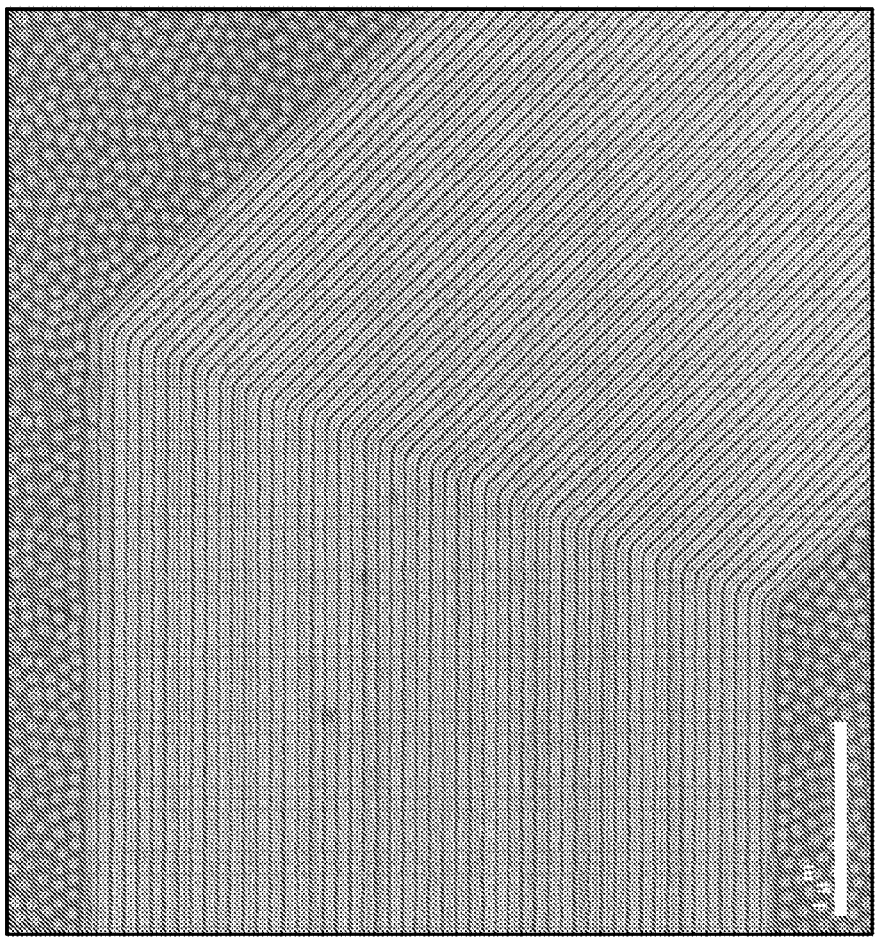
135° Angled Lamellae with $L_S$ = 70 nm

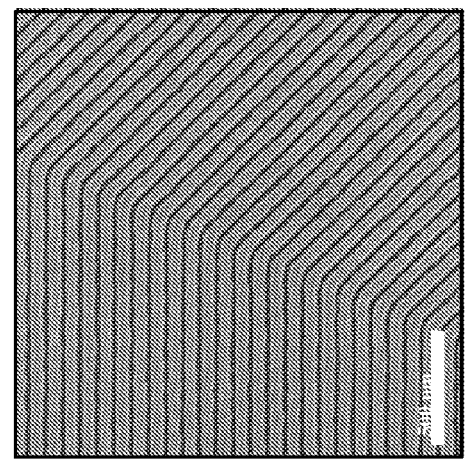
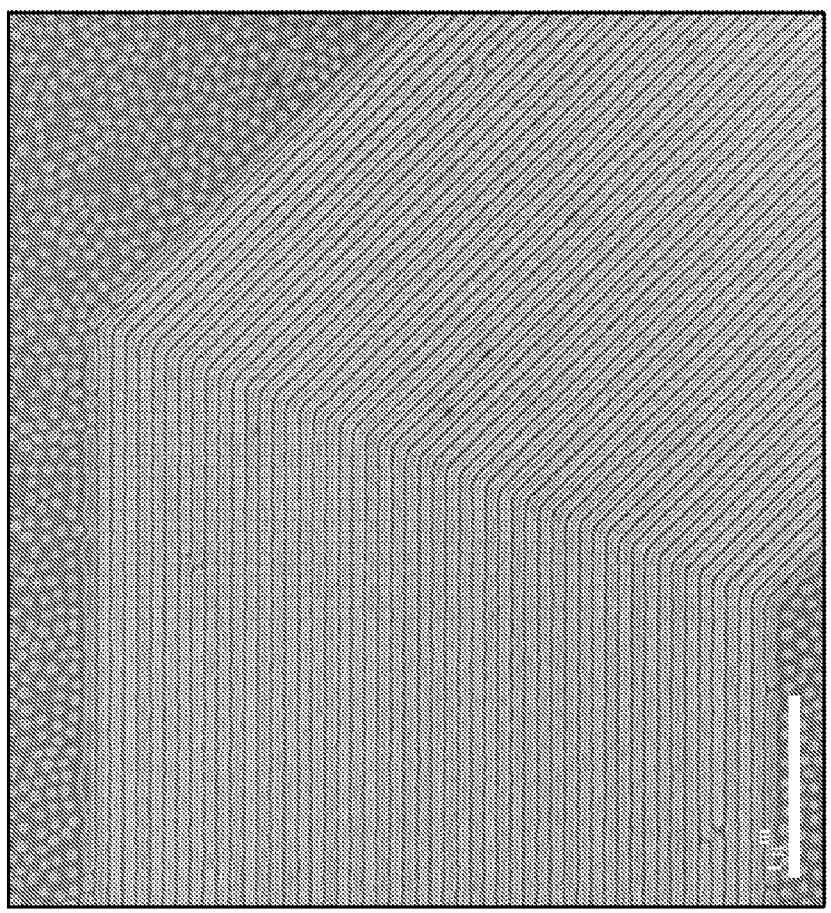
135° Angled Lamellae with $L_S = 75$ nm
FIG. 19C

135° Angled Lamellae with $L_S = 80$ nm

90° Angled Lamellae with $L_S = 65$ nm

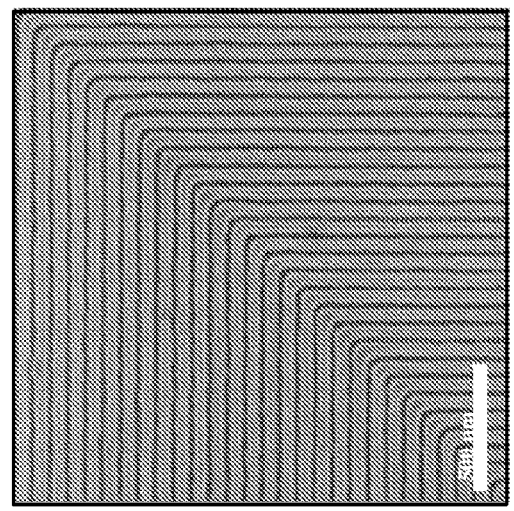
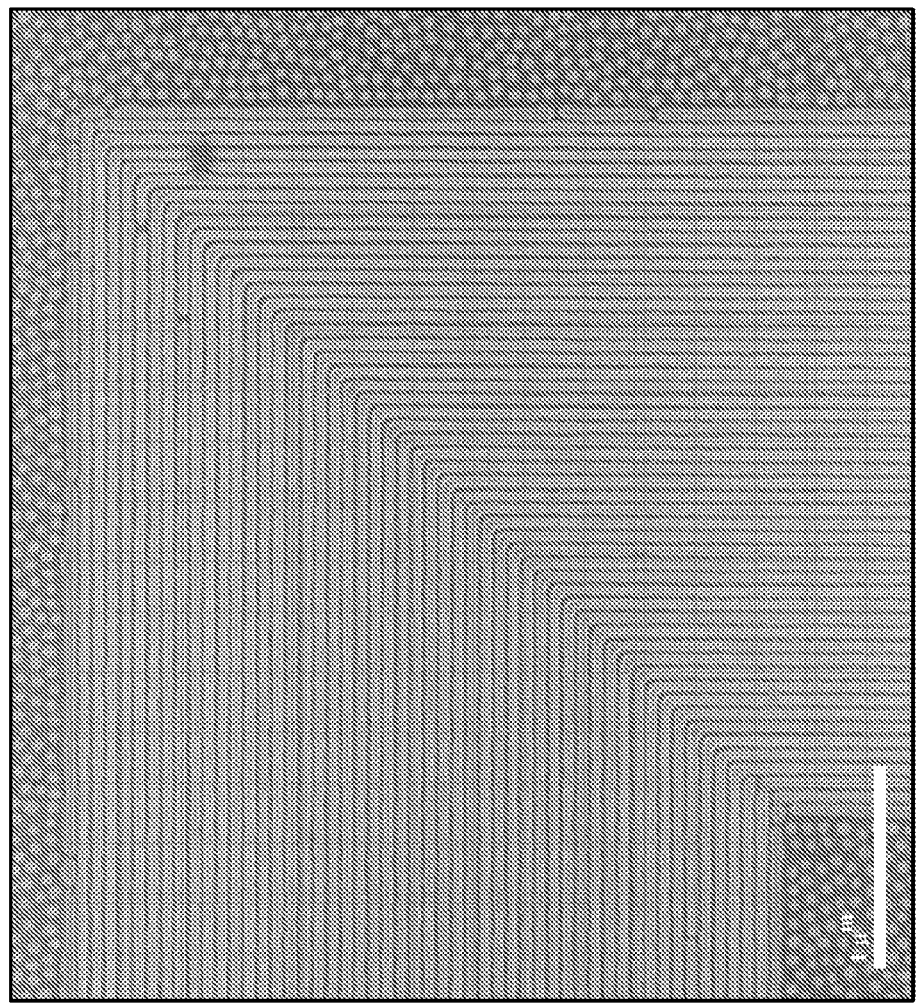
90° Angled Lamellae with $L_S$ = 70 nm
FIG. 20B

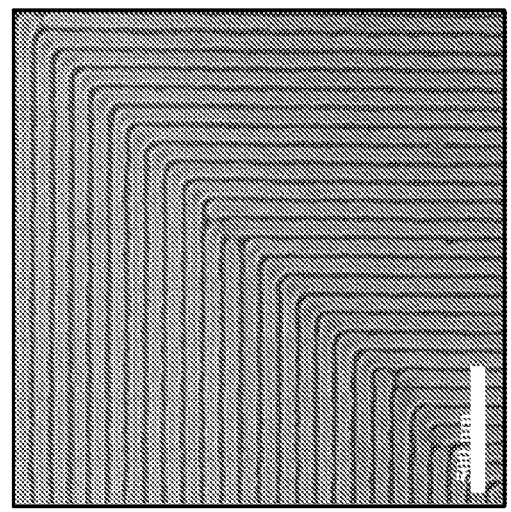
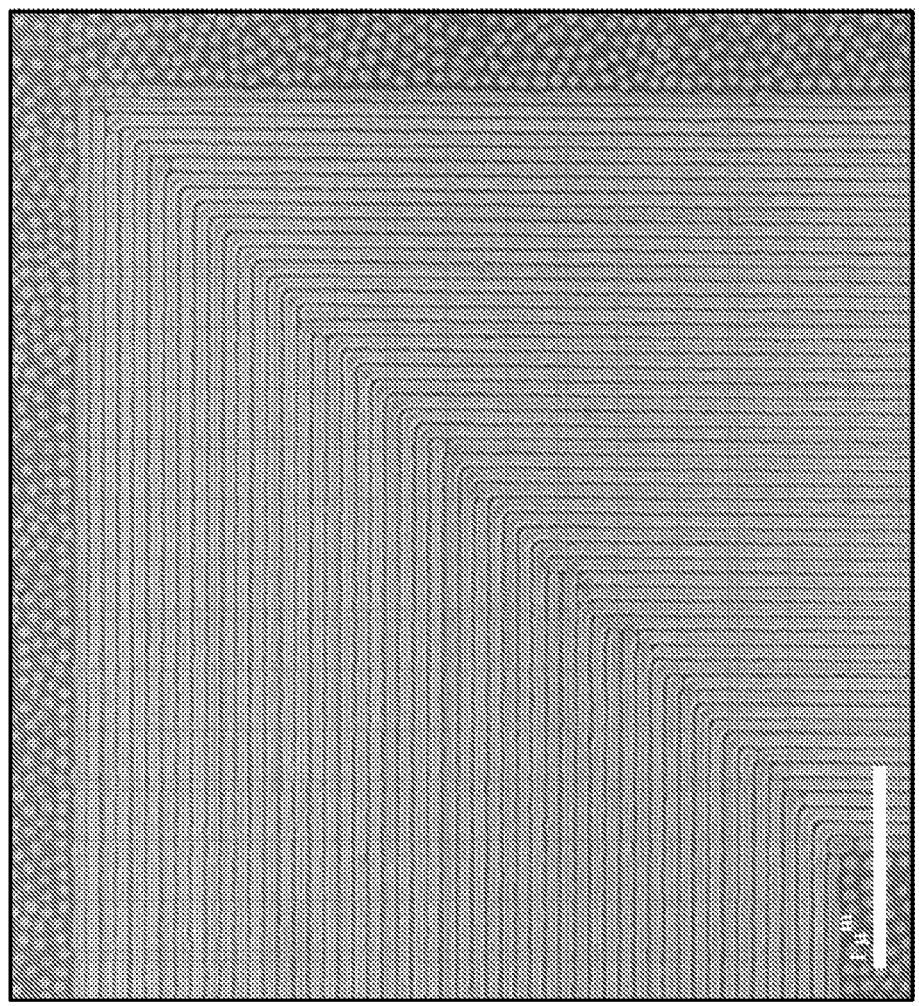
90° Angled Lamellae with $L_S$ = 75 nm
*FIG. 20C*

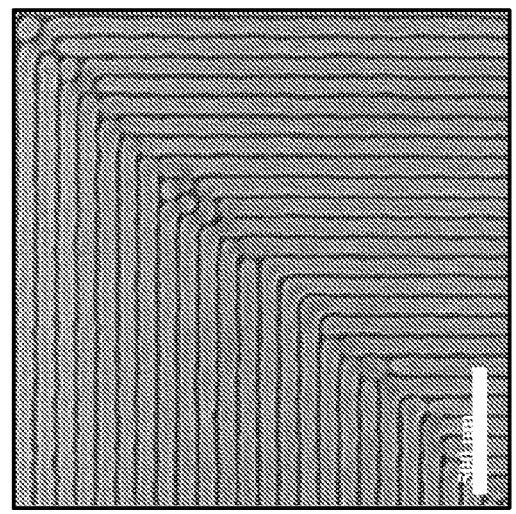
*FIG. 20D*
90° Angled Lamellae with $L_S$ = 80 nm
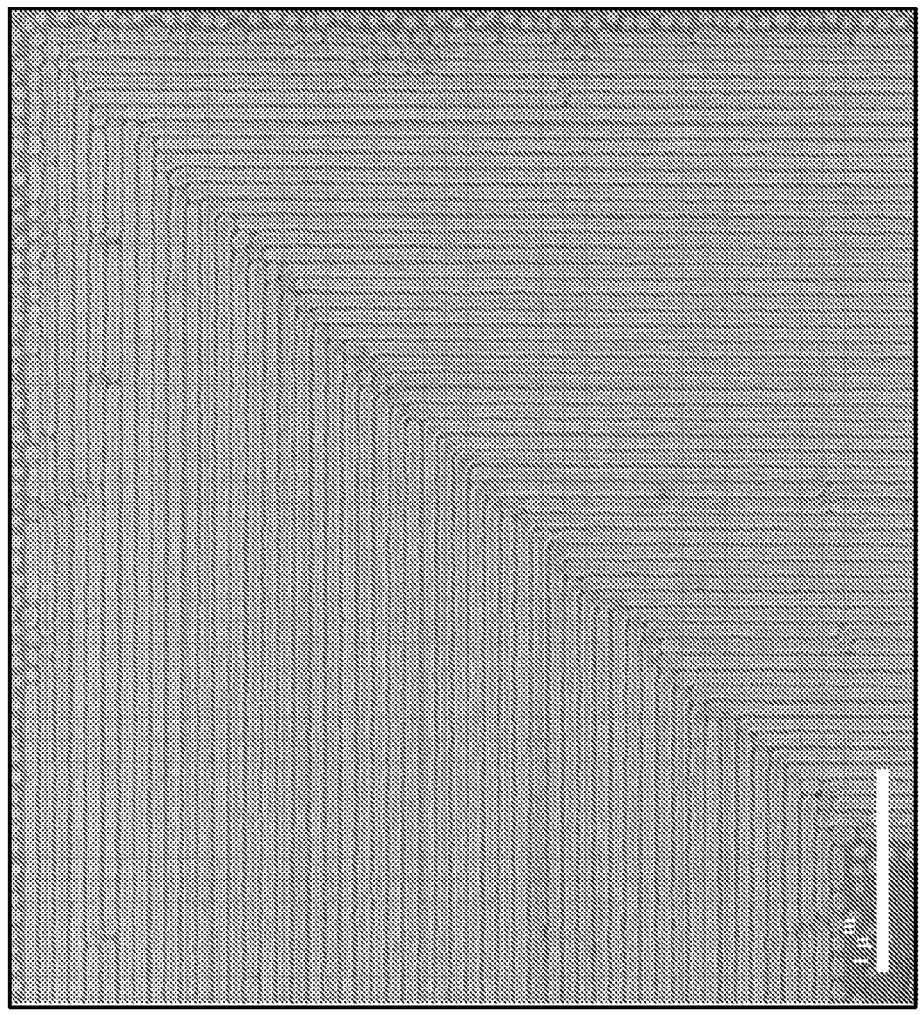

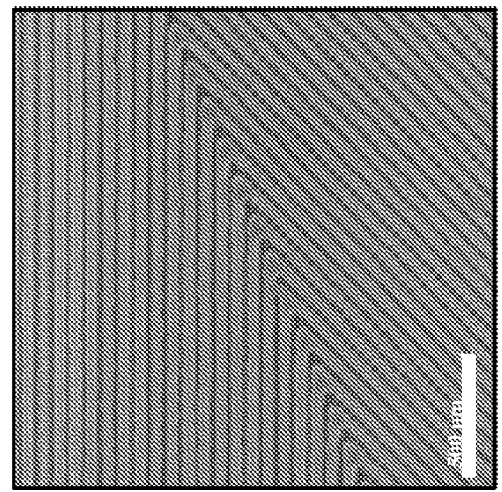
FIG. 21A
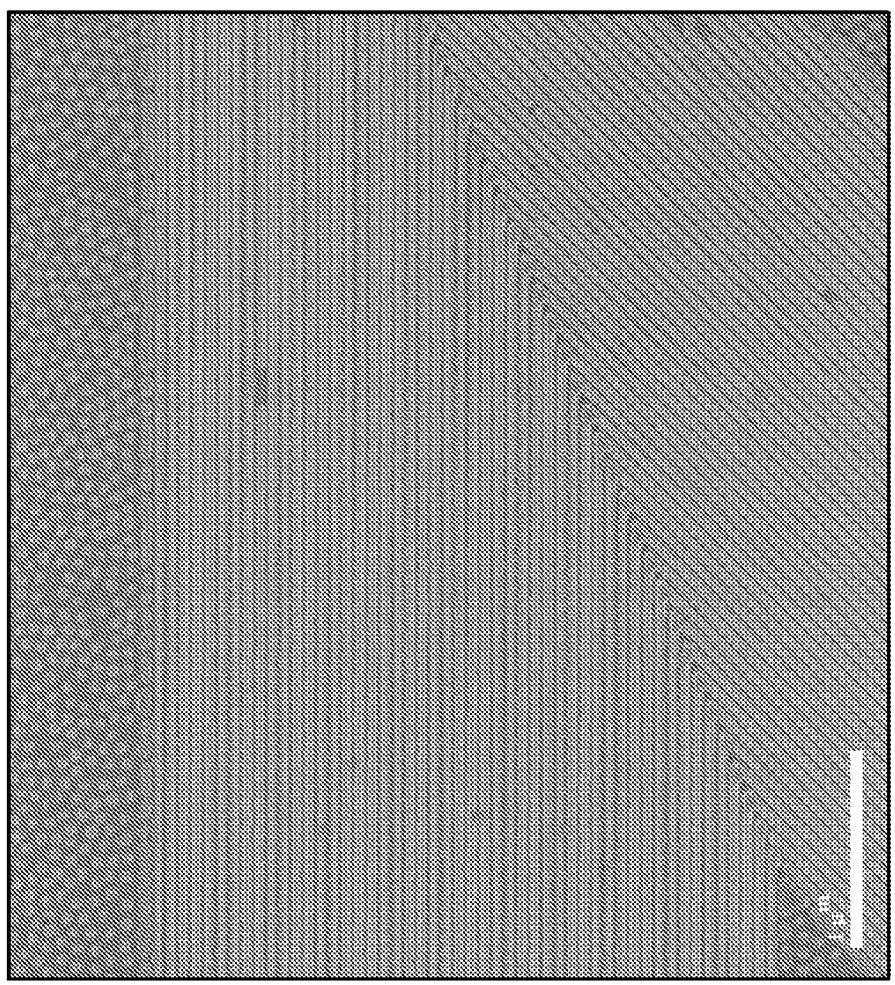
45° Angled Lamellae with $L_S = 65$ nm

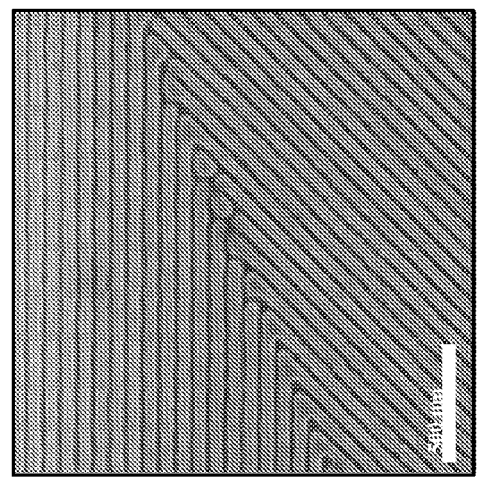
FIG. 21B
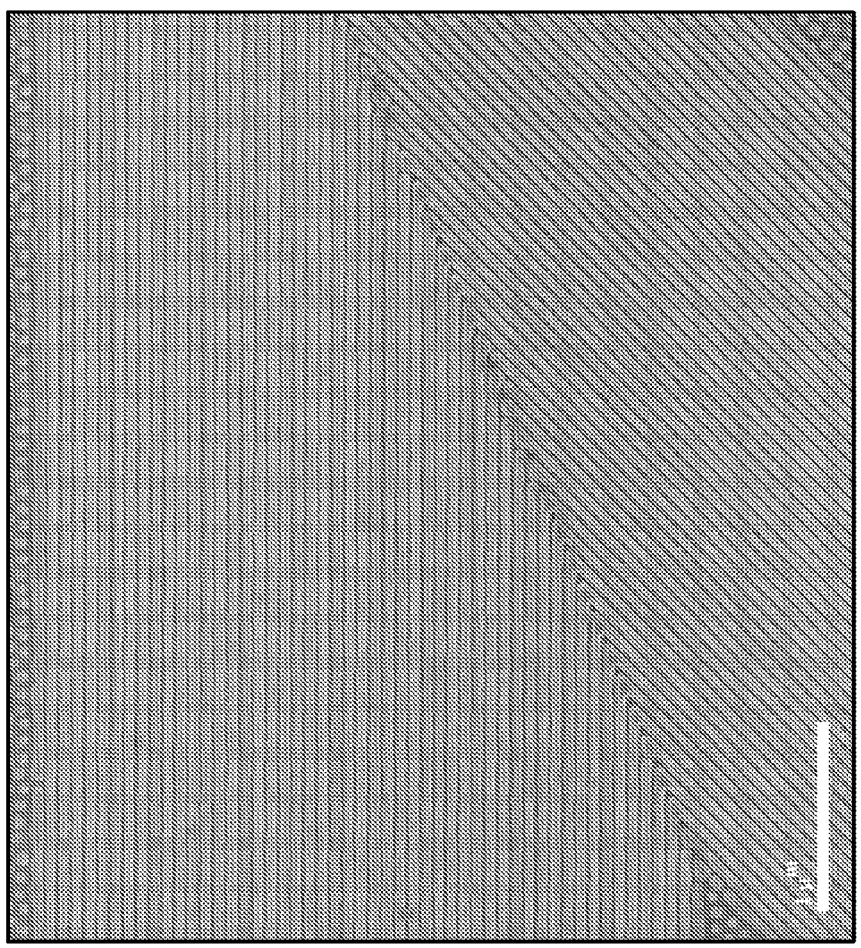
45° Angled Lamellae with $L_S = 70$ nm

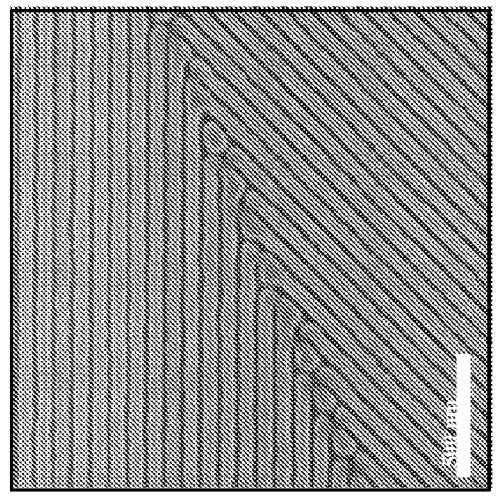
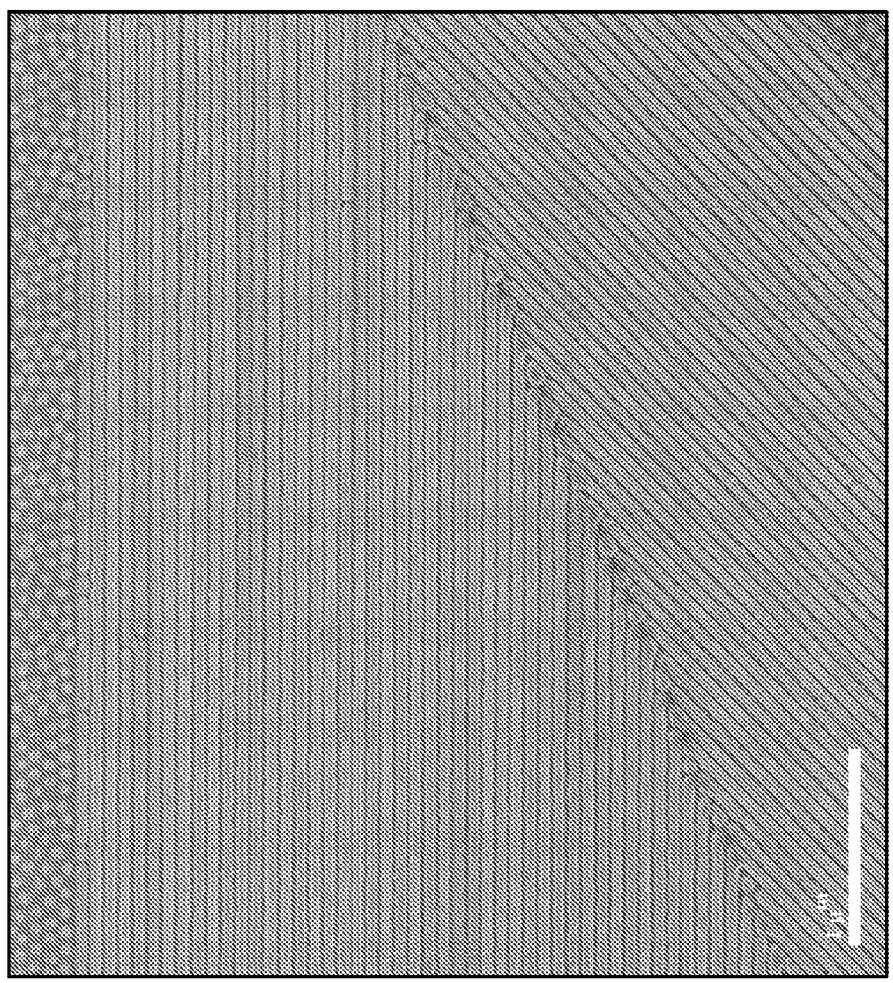
45° Angled Lamellae with $L_S$ = 75 nm
FIG. 21C

45° Angled Lamellae with $L_S$ = 80 nm

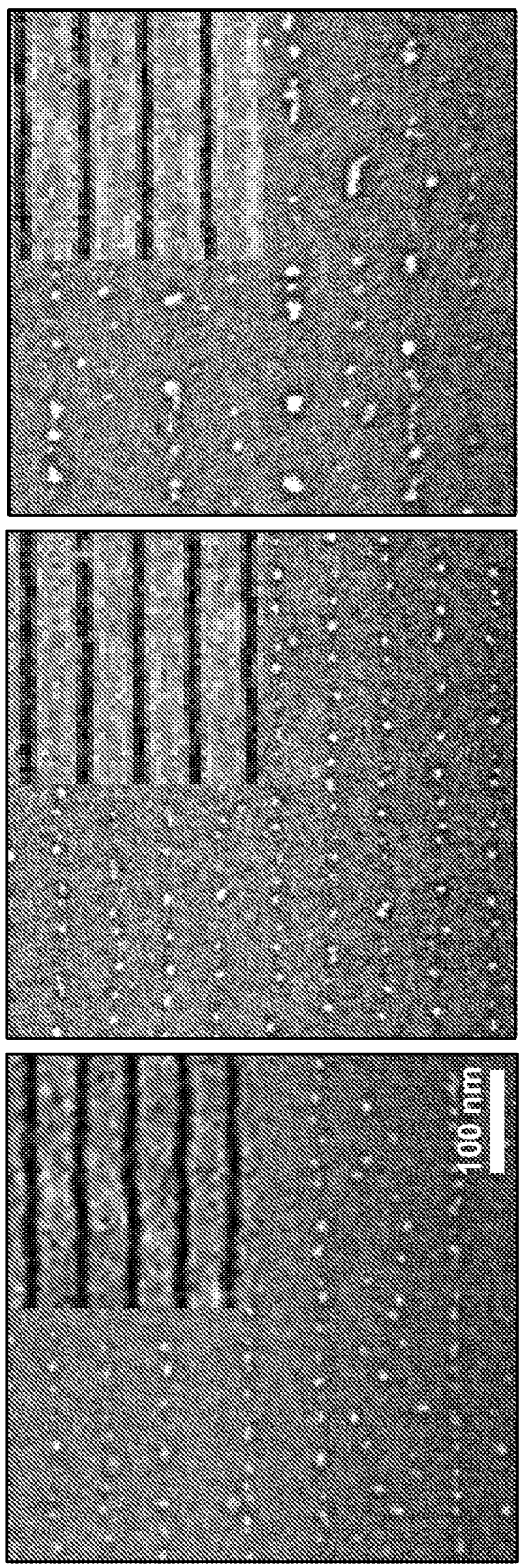

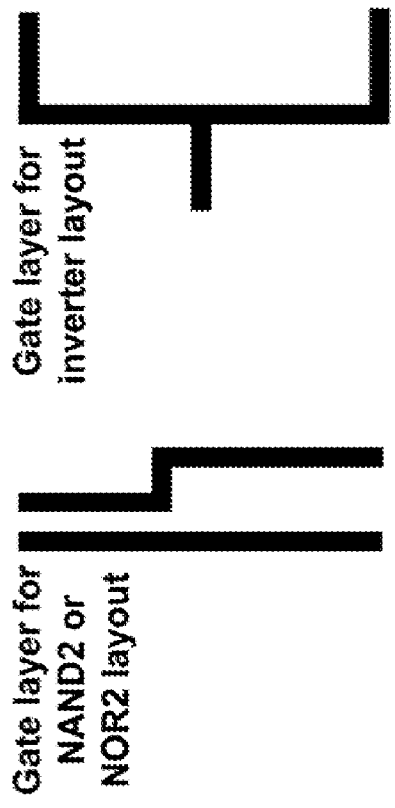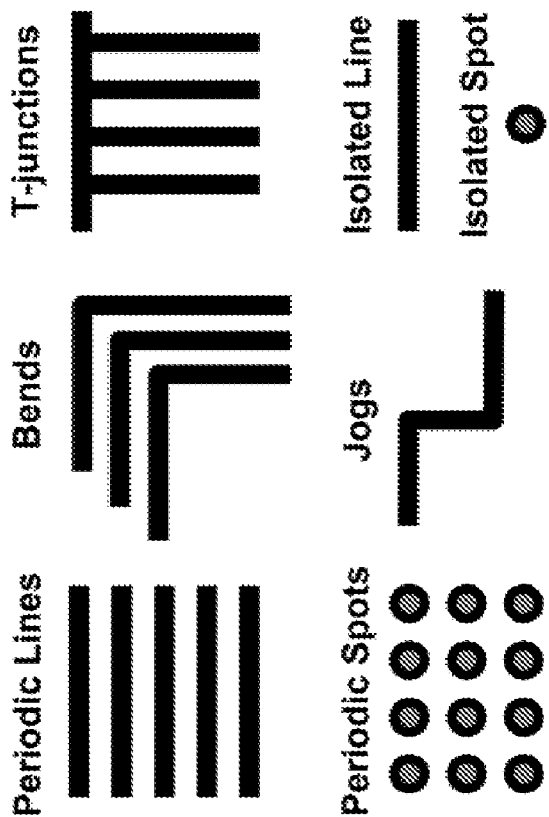
FIG. 24A
FIG. 24B

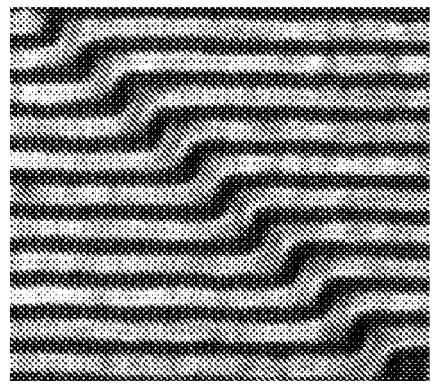
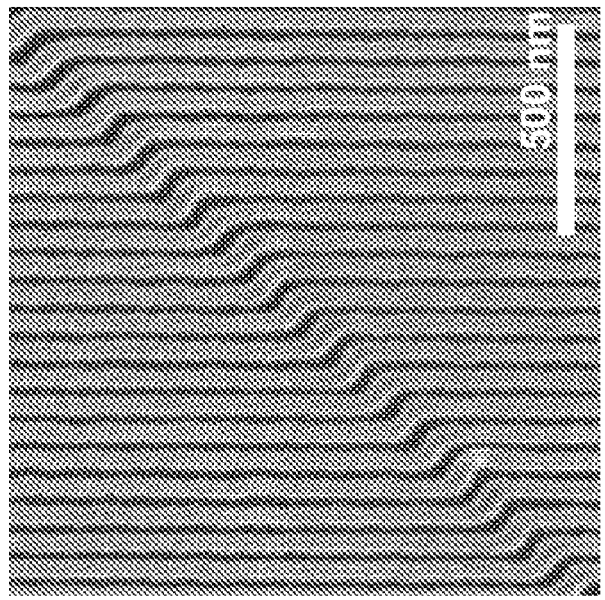
FIG. 25

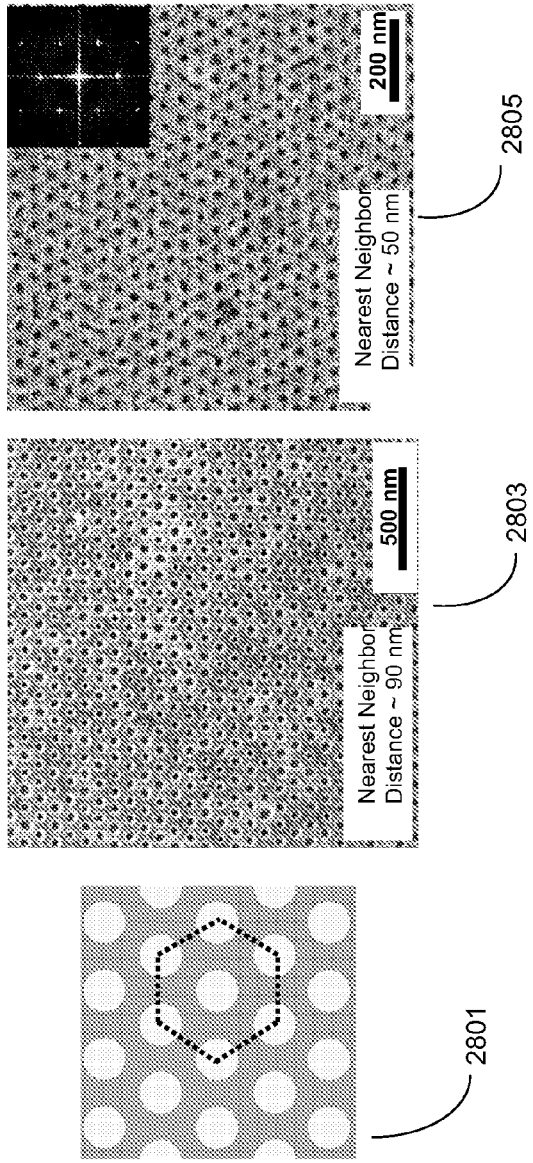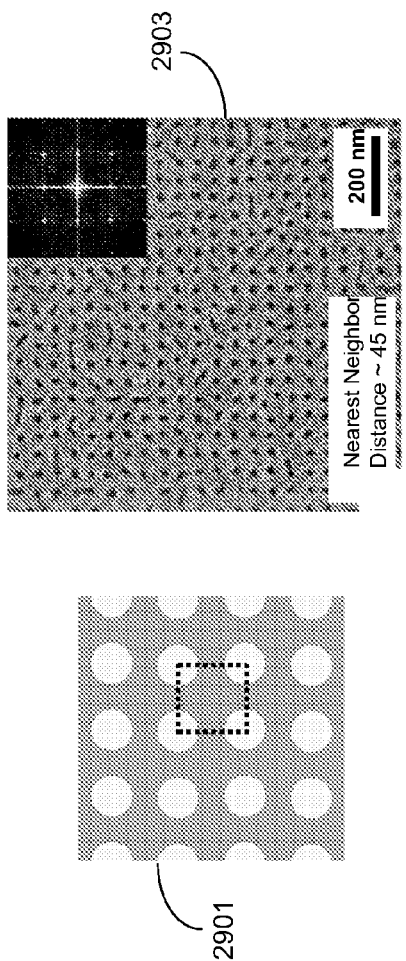
FIG. 28
FIG. 29

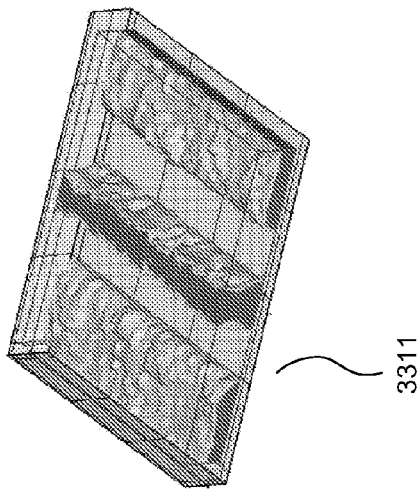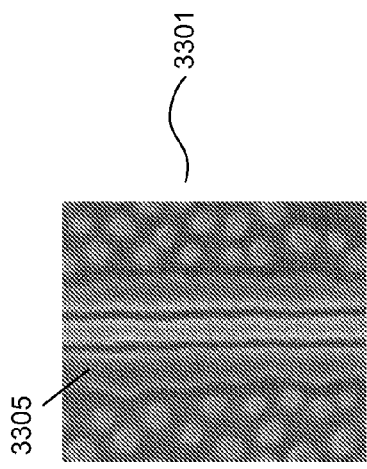
FIG. 33

METHODS AND COMPOSITIONS FOR FORMING PATTERNS WITH ISOLATED OR DISCRETE FEATURES USING BLOCK COPOLYMER MATERIALS

CROSS-REFERENCE TO RELATED APPLICATIONS

This application claims benefit under 35 U.S.C. 119(e) of U.S. Provisional Application No. 60/831,736, filed Jul. 17, 2006. This application is also a continuation-in-part of and claims priority under 35 U.S.C. 120 from U.S. patent application Ser. No. 11/286,260, published as U.S. Publication No. US-2006-0134556-A1, filed Nov. 22, 2005, which in turn claims benefit under 35 U.S.C. 119(e) of U.S. Provisional Application No. 60/630,484, filed Nov. 22, 2004. All of these applications are incorporated by reference herein in their entireties and for all purposes.

STATEMENT OF GOVERNMENT SUPPORT

This invention was made with United States government support awarded by the following agency: NSF 0425880. The United States government has certain rights in this invention.

FIELD OF THE INVENTION

The invention relates to methods of nanofabrication techniques. More specifically, the invention relates to patterning materials at the nanoscale level utilizing block copolymers.

BACKGROUND OF THE INVENTION

As the development of nanoscale mechanical, electrical, chemical and biological devices and systems increases, new processes and materials are needed to fabricate nanoscale devices and components. This is especially true as the scale of these structures decreases into the tens of nanometers. There is a particular need for materials and methods that are able to duplicate nanoscale patterns over large areas with perfect or near-perfect registration of the pattern features. Block copolymer materials are useful in nanofabrication because they self-assemble into distinct domains with dimensions in the tens of nanometers or lower.

In the past nanostructures and functional devices fabricated using block copolymers, including quantum dots, magnetic storage media, flash memory devices, semiconductor capacitors, photonic crystals, and nanopores, have either required or benefited from the highly ordered and periodic nature of the self-assembled material. For many applications in advanced lithography and the semiconductor industry, however, features must be patterned in complex geometries that lack such long-range order.

SUMMARY OF THE INVENTION

Provided herein are methods of directing the self assembly of block copolymers on chemically patterned surfaces to pattern discrete or isolated features needed for applications including patterning integrated circuit layouts. According to various embodiments, these features include lines, t-junctions, bends, spots and jogs. In certain embodiments a uniform field surrounds the discrete feature or features. Examples include a jog or a set of jogs in a periodic set of parallel lines. In certain embodiments, a layer contains two or more distinct regions, the regions differing in one or more of type of feature, size, and/or pitch. An example is an isolated spot at one area of the substrate, and a t-junction at another area of the substrate. These features or regions of features may be separated by unpatterned or uniform fields, or may be adjacent to one another. Applications include masks for nanoscale pattern transfer as well as the fabrication of integrated circuit device structures.

Aspects of the invention include copolymer structures. In certain embodiments, a copolymer structure having a patterned substrate and a copolymer layer on the substrate having one or more isolated features registered with the underlying substrate are provided. The features may be isolated by unpatterned or uniform regions of the block copolymer material. Isolated features that can be formed include a periodic array of spots, an isolated spot, a t-junction, a jog, an isolated line, periodic line segments, and a bend. In certain embodiments, the material includes a nested array of one or more features. In certain embodiments, the isolated feature such as a jog is embedded in a uniform region, e.g., lamella. In structures that have two or more isolated features, the features may be different sizes and/or pitches.

The substrate may have regions in which the pattern scale or period is commensurate with the scale or period of the copolymer material in the bulk ($L_s$ is commensurate with $L_o$ or $L_B$) on which the copolymer material self-assembles into perpendicular-oriented domains that are or include the isolated features. The substrate may have regions in which the pattern scale or period is incommensurate with the scale or period of the copolymer material in the bulk ($L_s$ is at least twice $L_o$ or $L_B$) on which the copolymer material self-assembles into parallel-oriented domains. In certain embodiments, the copolymer structure includes a patterned substrate; a first region having one or more perpendicular-oriented domains of the copolymer material, wherein said domains are registered with the underlying substrate; and a second region having one or more parallel-oriented domains of the copolymer material. Parallel-oriented domains of block copolymer material can act as an etch mask in substrate etching applications. In certain embodiments, the perpendicular-oriented domains include at least one of the following features: a periodic array of spots, an isolated spot, a t-junction, a jog, an isolated line, periodic line segments, and a bend. The substrate pattern may comprises one or more regions in which the scale $L_s$ of the pattern is at least twice the scale $L_B$ or $L_0$ of the block copolymer material and one or more regions in which the scale $L_s$ of the pattern is commensurate with the scale $L_B$ or $L_0$ of the block copolymer material. In certain embodiments, a structure may include multiple perpendicular domains of a copolymer material. Examples include one more line segments oriented perpendicular to and registered with the underlying substrate.

Aspects of the invention also include methods of forming isolated or discrete features on a substrate. In certain embodiments, the methods include providing a patterned substrate, said pattern having at least one feature isolated by a uniformed or unpatterned region; depositing a layer of a block copolymer material onto the said patterned substrate; and directing the assembly of the block copolymer material in accordance with the underlying pattern. The isolated features may be selected from a jog, a bend, a t-junction, an isolated line segment, an isolated array of spots, periodic line segments, and an isolated spot. The pattern may have regions of discrete features separated by uniform or unpatterned regions. In certain embodiments, the block copolymer material assembles into perpendicular-oriented domains separated by parallel-oriented domains. Regions of discrete features on the patterned substrate may be patterned at a scale $L_s$ commensurate with the scale $L_B$ or $L_o$ of the copolymer material.

An isolated or discrete feature may be separated by regions on the patterned substrate that are preferential to one of the components of the block copolymer material. Methods may also include selectively removing a component of the block copolymer material and etching the substrate. Parallel-oriented domains may act as an etch mask.

BRIEF DESCRIPTION OF THE DRAWINGS

FIGS. 3A and 3B show methods of directing assembly of lamellar and cylindrical copolymer domains on substrates.

FIG. 9 shows a block copolymer film performed on a pattern substrate in accordance with one embodiment of the invention.

FIG. 15B shows CdSe nanoparticles selectively aligned using block copolymer materials on substrates having different patterns.

FIG. 18 is an image of a replicated pattern containing a 90° bend.

FIGS. 19A-D are images of replicated patterns containing 135° bends.

FIGS. 20A-D are images of replicated patterns containing 90° bends.

FIGS. 21A-D are images of replicated patterns containing 45° bends.

FIGS. 23A-C show SEM images of a block copolymer material containing nanoparticles as ordered on a patterns having various periods.

FIG. 24A shows generalized layouts for gate layers for a NAND2 or NOR2 layout and an inverter layout.

FIG. 24B shows pattern geometries needed for pattern transfer and integrated circuit fabrications including jogs, t-junctions, bends, line segments, periodic arrays of spots, and isolated spots.

FIG. 25 shows top-down SEM images of a PS/PMMA ternary blend directed to assemble into nested arrays of jogs.

FIG. 28 shows top-down SEM images of PS-b-PMMA block copolymer materials directed to assemble into hexagonal arrays of cylinders, and the chemical pattern used to direct the assembly.

FIG. 29 shows a top-down SEM image of PS-b-PMMA block copolymer material directed to assemble into a square array of cylinders, and the chemical pattern used to direct the assembly.

FIG. 33 shows a top SEM image of a 60:20:20 PS-b-PMMA:PS:PMMA ternary blend directed to assemble on a chemical surface pattern with 2 PMMA preferential lines. Also shown are results of SCMF simulations performed for the directed assembly of 60:20:20 and 60:11:29 PS/PMMA ternary blends on chemical surface patterns with 2 PMMA preferential lines.

DESCRIPTION OF THE INVENTION

Reference will now be made in detail to specific embodiments of the invention. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Figure 1:
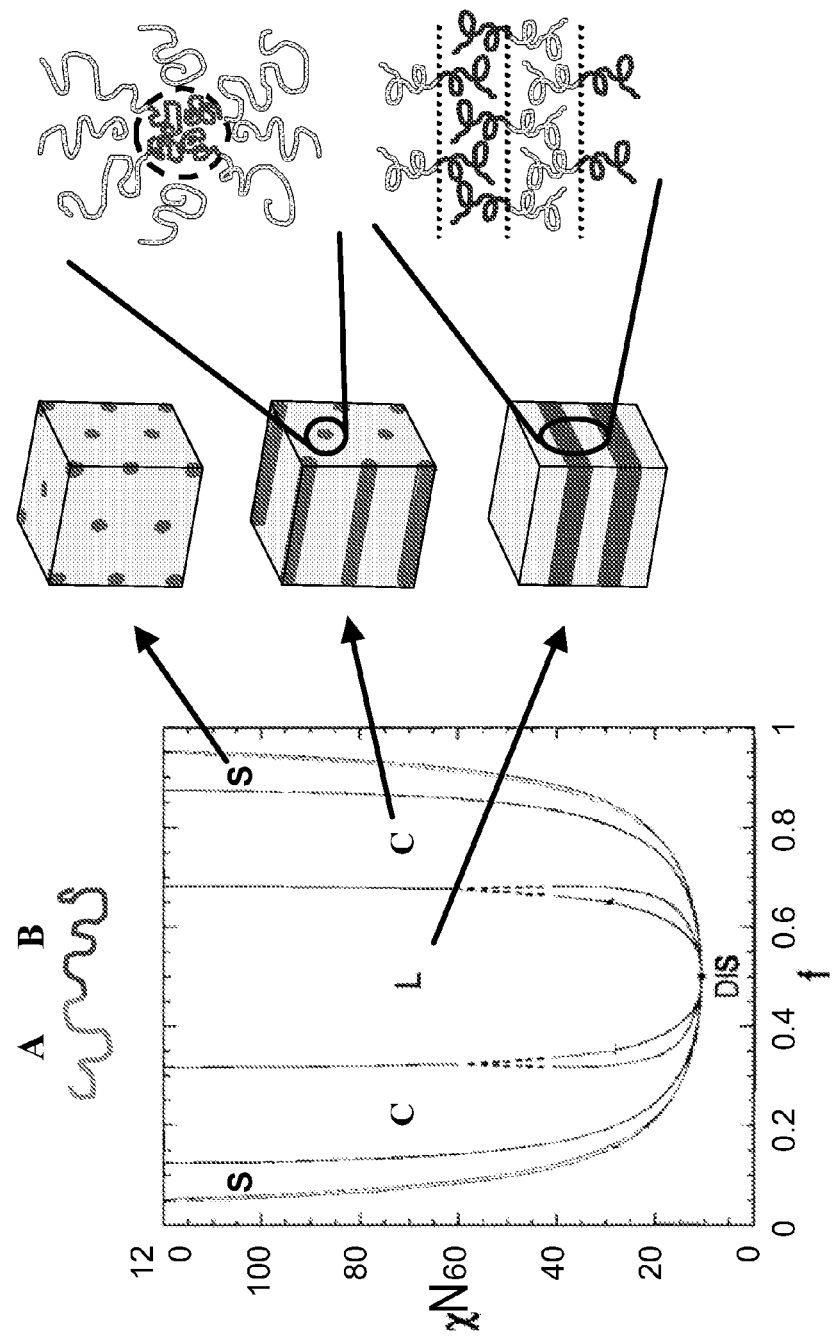
FIG. 1 shows ideal base behavior of diblock copolymers.

Block copolymers are a class of polymers synthesized from two or more polymeric blocks. The structure of diblock copolymer AB may correspond, for example, to AAAAAAA-BBBBBBBB. FIG. 1 shows ideal phase behavior of diblock copolymers. The graph in FIG. 1 shows, $\chi N$ (where $\chi$ is the Flory-Huggins interaction parameter and N is the degree of polymerization) as a function of the volume fraction, f, of a block (A) in a diblock (A-b-B) copolymer. $\chi N$ is related to the energy of mixing the blocks in a diblock copolymer and is inversely proportional to temperature. FIG. 1 shows that at a particular temperature and volume fraction of A, the diblock copolymers microphase separate into domains of different morphological features. As indicated in FIG. 1, when the volume fraction of either block is around 0.1, the block copolymer will microphase separate into spherical domains (S), where one block of the copolymer surrounds spheres of the other block. As the volume fraction of either block nears around 0.2-0.3, the blocks separate to form a hexagonal array of cylinders (C), where one block of the copolymer surrounds cylinders of the other block. And when the volume fractions of the blocks are approximately equal, lamellar domains (L) or alternating stripes of the blocks are formed. Representations of the cylindrical and lamellar domains at a molecular level are also shown. Domain size typically ranges from 5-50 nm. The phase behavior of block copolymers containing more than two types of blocks (e.g. A-b-B-b-C), also results in microphase separation into different domains.

The size and shape of the domains depend on the molecular weight and composition of the copolymer.

Figure 2:
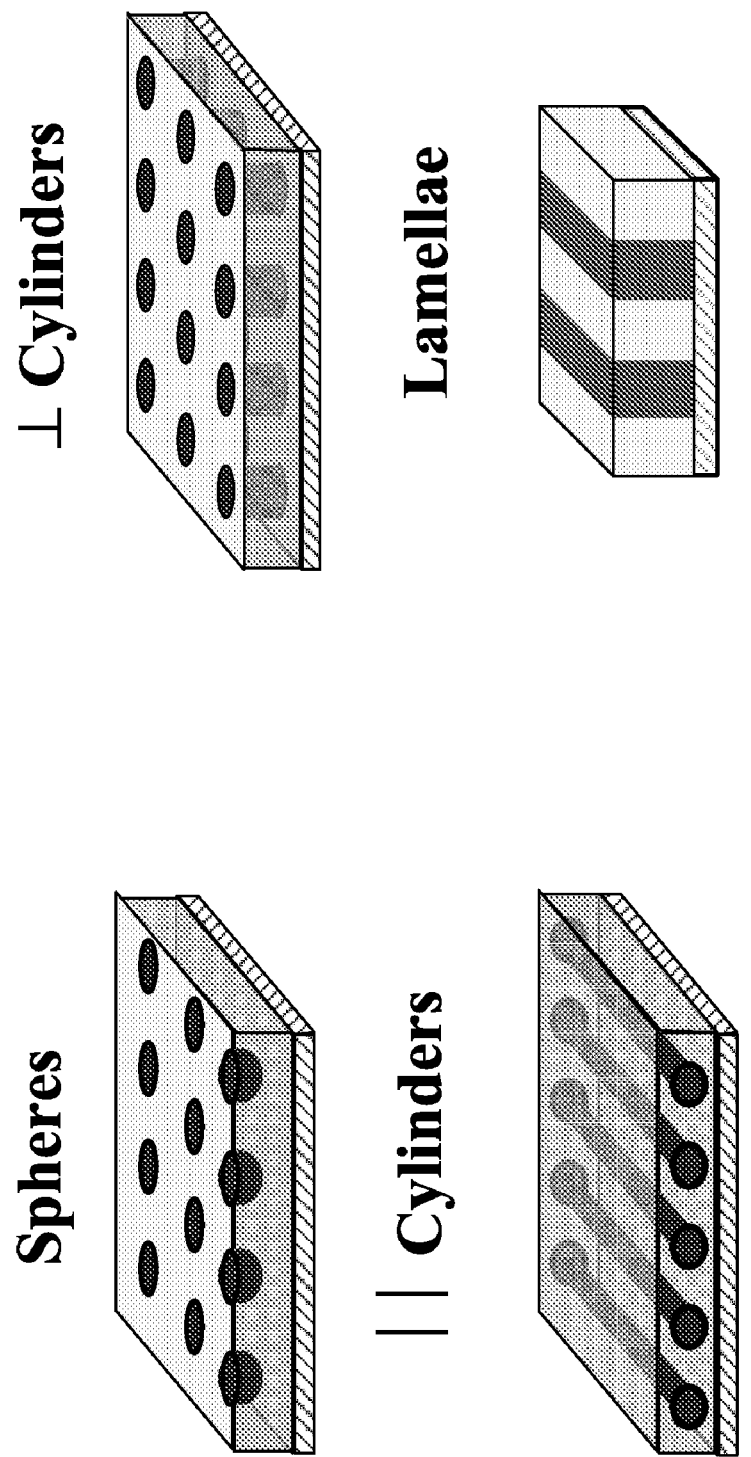
FIG. 2 shows spherical, cylindrical and lamellar ordered copolymer domains formed on substrates.

FIG. 2 shows spherical, cylindrical and lamellar ordered domains formed on substrates. Domains (spheres, cylinders or lamellae) of one block of the copolymer are surrounded by the other block copolymer. As shown in FIG. 2, cylinders may form parallel or perpendicular to the substrate.

Ordered domains as shown in FIG. 2 may be used as a templates for patterns. Park et al. (Science, 1997 276, 1401) describe diblock copolymer films deposited on silicon substrates. The diblock copolymer microphase separated into a periodic array of spheres. The block that formed the spheres was removed, leaving the remaining block with spherical holes, similar to that shown in FIG. 2. The remaining block was then used as a mask to etch a dense array of holes (approximately $10^{11}$ holes/cm$^2$) into the silicon substrate. Li et al. (Applied Physics Letters, 2000, 76, 1689) describe using block copolymers as a template to pattern a silicon nitride hard mask, which was then used to grow gallium arsenide nanostructures. Both of these uses of diblock copolymers require a breakthrough etch step to transfer the pattern from the block to the substrate. Asakawa et al. (Jpn. J. Applied Physics, 2002, 41, 6112) describe etching a spherically ordered polystyrene-b-poly methyl methacylate (PS-b-PMMA) diblock copolymer film on a substrate with reactive ion etching (RIE). RIE preferentially etched the PMMA, resulting in a direct transfer of the pattern from the block copolymer film to the substrate. Applications for using block copolymer domains as templates for patterning include growing ultrahigh density nanowire arrays (see Thurn-Albrecht et al., Science, 2000, 290, 2126) and fabricating low-voltage scalable nanocrystal FLASH memory (Guarini et al., IBM Semiconductor Research and Development Center, 2004 IEEE IEDM Conference presentation). All of the above references are hereby incorporated by reference for all purposes.

The block copolymer films in the above-described techniques self-assemble without any direction or guidance. This undirected self-assembly results in patterns with defects. Because undirected self-assembly results in defects, it is not appropriate for applications requiring long-range ordering, pattern perfection, registration of domains with the underlying substrate and the creation of addressable arrays.

Approaches to long-range ordering of diblock copolymer films include graphoepitaxy, the use of temperature gradients, solvent casting and shear techniques. However, none of these techniques have shown truly macroscopic ordering and perfect or near-perfect registration of the domains with the substrate.

Another approach described in U.S. Pat. No. 6,746,825, herein incorporated by reference in its entirety and for all purposes, combines advanced lithography with self-block copolymer self-assembly. Lithographically patterned surfaces are used to direct assembly of block copolymer domains. The approach achieves macroscopic ordering of the domains with registration of the underlying chemical pattern. FIGS. 3A and 3B show how lamellar and cylindrical domains may be formed on a substrate by this technique. FIG. 3A shows guided self-assembly of lamellar domains on a substrate covered with an imaging layer. In the first step, interferometric lithography is used to create a periodic pattern in the imaging layer. In this case, a linear striped pattern is created. A block copolymer film is then deposited on the patterned imaging layer. The copolymer film is then annealed to form an array of self-assembled domains of one block 301 of the copolymer that are surrounded by the other block 302. Selective functionalization of the patterned structure may then be carried out, for example, by removing one block and then filling the opening with another material. FIG. 3B shows guided self-assembly of cylindrical domains. The process is the same as that lamellar domains, only differing in the pattern created in the imaging layer. In this case, the pattern is a hexagonal array of circles. Cylindrical domains of one block 303 surrounded by the other block 304 are formed.

As mentioned above, interferometry is used to pattern substrates with regions of different chemical functionality in spatial arrangements commensurate with the characteristic dimensions of the domain structure of the block co-polymer. Interferometric patterning is well suited for preparing substrates to guide self-assembly of the morphologies shown in FIG. 2. This is because the interference patterns and the block copolymer morphologies exhibit the same periodicity. Crossing two beams of light, for example, results in the alternating stripes pattern shown in FIG. 3A used to guide the self-assembly of lamellar domains. Double exposure of stripes with an included angle of 120° results in spots of constructive interference in a hexagonal array which are used to guide the self-assembly of cylindrical domains, also shown in FIG. 3B.

Figure 4:
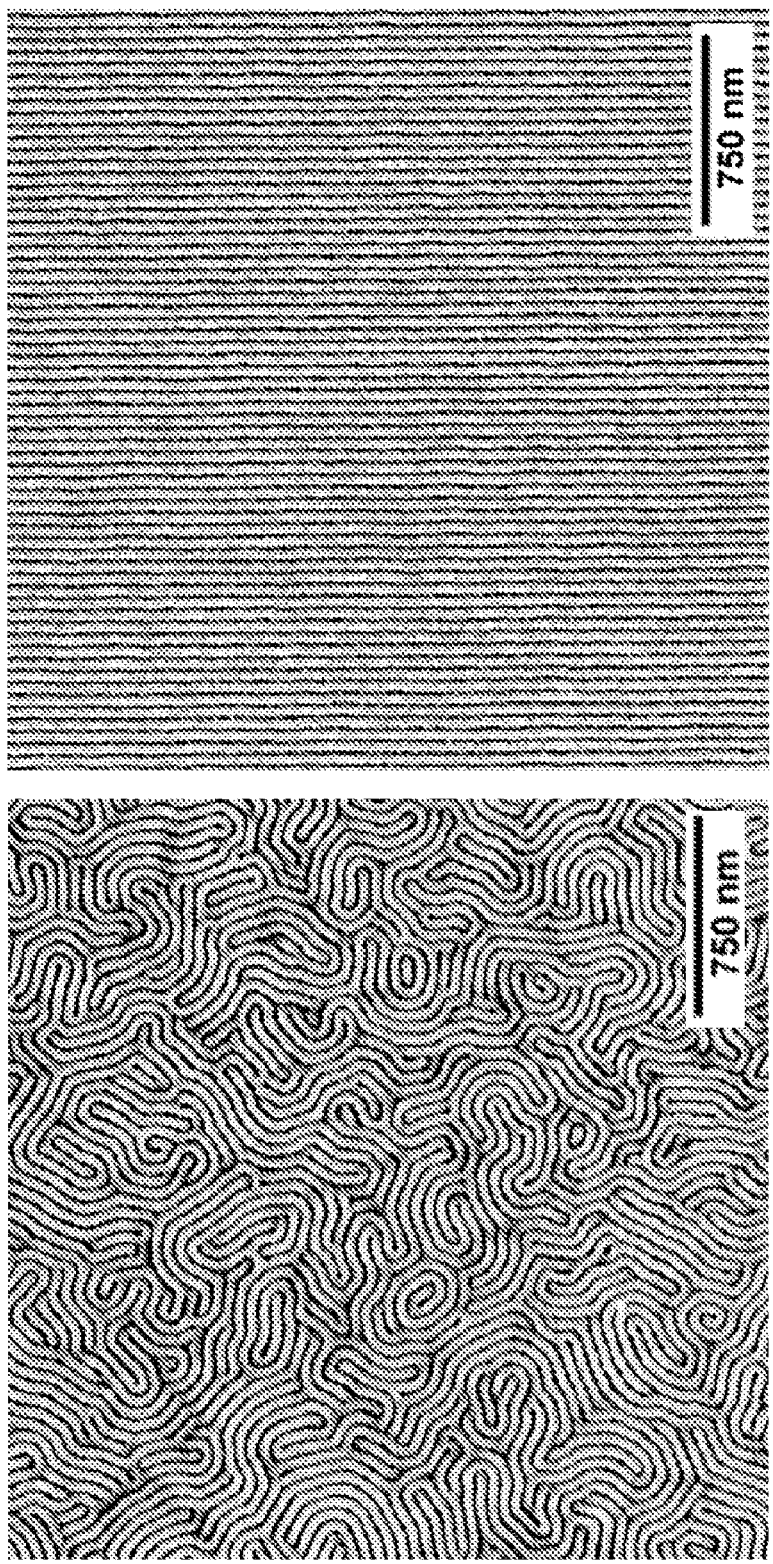
FIG. 4 shows self assembled PS-b-PMMA copolymer on an unpatterned and the patterned substrate.

The difference between undirected and directed assembly over a macroscopic area can be seen in FIG. 4. FIG. 4 shows macroscopic self-assembly of PS-b-PMMA on an unpatterned and on a patterned substrate. As shown in FIG. 4, an unpatterned surface results in disordered assembly of the block copolymer. Utilizing a periodic patterned surface as discussed above results in perfect epitaxial assembly of the block copolymer film. Epitaxial assembly is possible over arbitrarily large areas. In example, perfect epitaxial assembly has been achieved over a rectangular area of 8×5 $\mu m^2$, along linear distances of 50 $\mu m$ perpendicular to the pattern (the maximum perpendicular dimension of the patterned area) and 400 $\mu m$ along one lamella.

Guided self-assembly on a pattern surface as shown in FIG. 4 requires some correlation between the block copolymers and the patterns. Block copolymer films have a bulk lamellar period, $L_o$. For diblock copolymers, $L_o$ is the length of one diblock in the bulk. Similarly, periodic patterns have pattern periods. The pattern period $L_s$ of an alternating stripes pattern used to direct diblock lamellar domain assembly is the distance between alternate interfaces on the pattern (i.e. the width of two stripes). For cylindrical and spherical domain structures, the periodicity of the bulk domain structures can be characterized by the distance between the cylinders or spheres in the hexagonal array. Guided self-assembly requires that the pattern period be commensurate with bulk period of the microphase separated block copolymer film.

Figure 5:
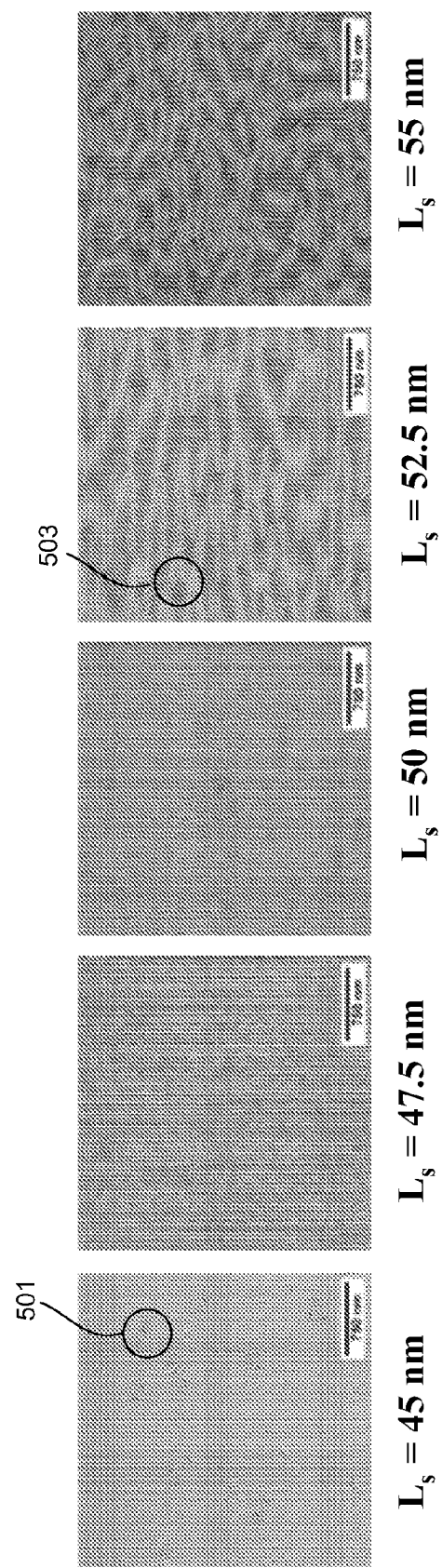
FIG. 5 shows self assembled lamellar domains of PS-b-PMMA on patterned substrates with pattern periods of 45 nm, 47.5 nm, 50 nm, 52.5 nm and 55 nm.

This is demonstrated by FIG. 5, which shows the effects of varying the pattern period $L_s$ on the registration and ordering of lamellar domains of PS-b-PMMA. $L_o$ of symmetric PS-b-PMMA is 48 nm. Directed self-assembly of PS-b-PMMA on pattern periods of 45 nm, 47.5 nm, 50 nm, 52.5 nm and 55 nm is shown in FIG. 5. As shown for $L_s$=45 nm, a pattern period significantly less than the bulk lamellar period of 48 nm results in dislocation defects, such as defect 501. This is because the lamellae are compressed into a smaller area than their bulk period. Pattern periods significantly greater than the bulk lamellar period result in herringbone patterns (e.g., area 503 for $L_s$ of 52.5 nm) and tilted and unregistered lamellae due to the lamellae trying to fit onto an area larger than their natural bulk period. Perfect or near-perfect duplication and registration is achieved for an $L_S$ of 47.5 nm. The more the pattern period $L_s$ differs from the bulk lamellar period, the more defects will be present in the duplicated pattern. Achieving perfect duplication and registration with the substrate pattern requires that $L_s$ be approximately equal to or commensurate with $L_o$. Similarly, the periodicity of the cylindrical and spherical patterns must be commensurate with the period of the bulk microphase separated block copolymer film.

Figure 6A:
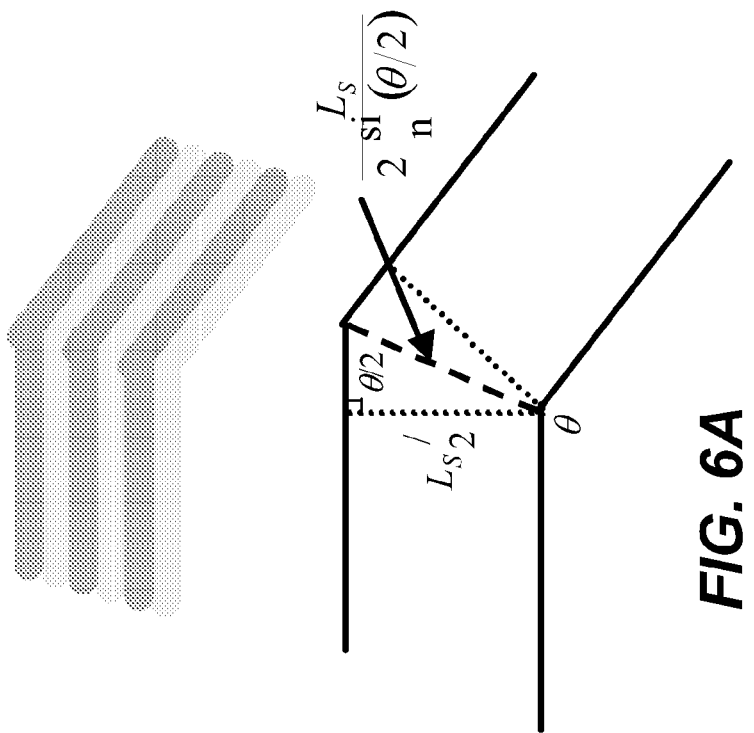
FIG. 6A shows the effective period of a bend in a pattern.
Figure 6:
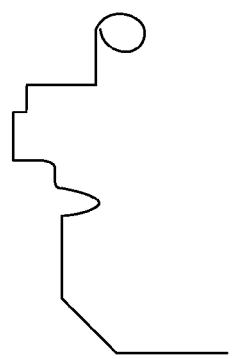
FIG. 6 shows a rough schematic of aperiodic pattern.

Many applications of nanoscale fabrication require patterns that are aperiodic and/or contain irregular features. FIG. 6 shows a rough schematic of an example of such a pattern. Methods that require periodic substrate patterns cannot be used to direct self-assembly of these irregularly-featured or aperiodic patterns. Further, methods where pattern period must be approximately equal to the bulk lamellar period are limited in their application. This is because the effective period is not constant throughout the pattern. FIG. 6A shows the distance between interfaces of an irregular feature (a bend) in a pattern. Assuming a symmetric pattern where the dark and light stripes are of equal width, the distance between interfaces is ½ $L_s$ along the linear portions of the pattern. At the bend, however, the distance between interfaces is $L_s/2 \sin(\theta/2)$—comparable to having a period of $L_s/\sin(\theta/2)$. Thus the effective period at the bend is $L_s/\sin(\theta/2)$. The nonlinear portions of the pattern in FIG. 6 have different periods than the linear portions. Thus, methods requiring the pattern period to be approximately equal to the bulk lamellar period are not appropriate for duplication of an aperiodic or irregularly-featured pattern such as the one in FIG. 6.

Figure 7:
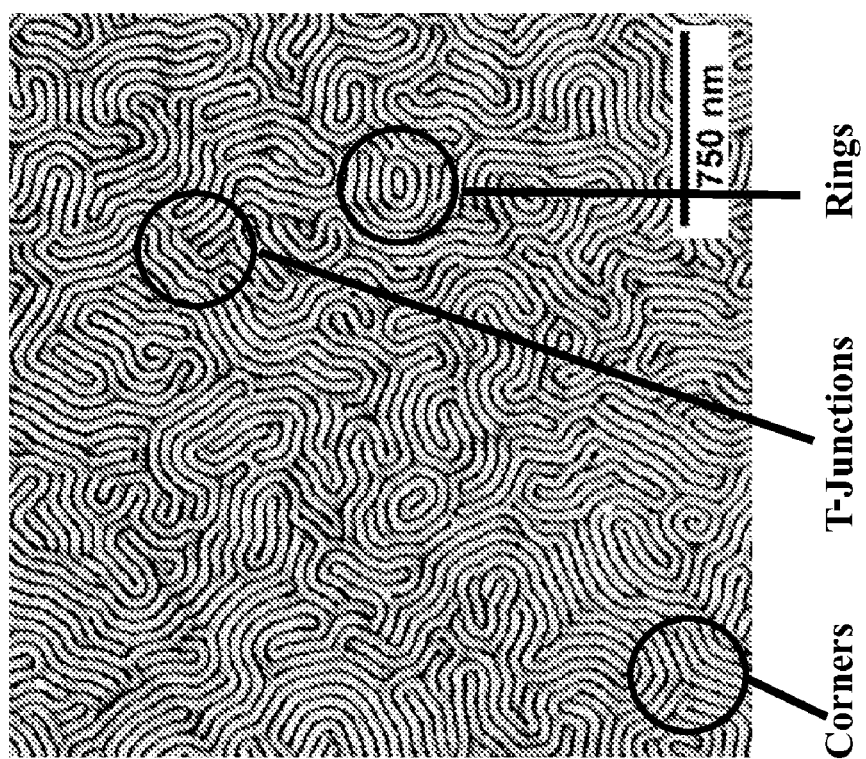
FIG. 7 is an image of irregular features in block copolymer assembled on an unpatterned surface.

Methods of the present invention may be used to replicate the aperiodic patterns or patterns with irregular features in block copolymer layers. FIG. 7 shows a block copolymer film deposited on a neutral wetting (i.e. unpatterned) surface. As can be seen in FIG. 7, many different irregular features can be identified in the film, including corners, t-junctions and rings. For all morphologies, irregular features are features different from the bulk microphase separated domains. In embodiments wherein the block copolymer material exhibits lamellar morphology, irregular features include all non-linear features, including corners, angles, t-junctions and rings. In embodiments wherein the block copolymer material exhibits parallel cylindrical array morphology, irregular features also include all non-linear features. The methods of the present invention may be used to replicate a pattern containing any irregular feature found in the chaotic structure of an undirected block copolymer film. In some embodiments, the methods of the invention may be used to replicate a pattern containing both aperiodic and periodic regions. In some embodiments, the methods of the invention may be used to replicate patterns containing both irregular features and features corresponding to the bulk microphase separated domains (such as those depicted in FIG. 2).

Figure 8:
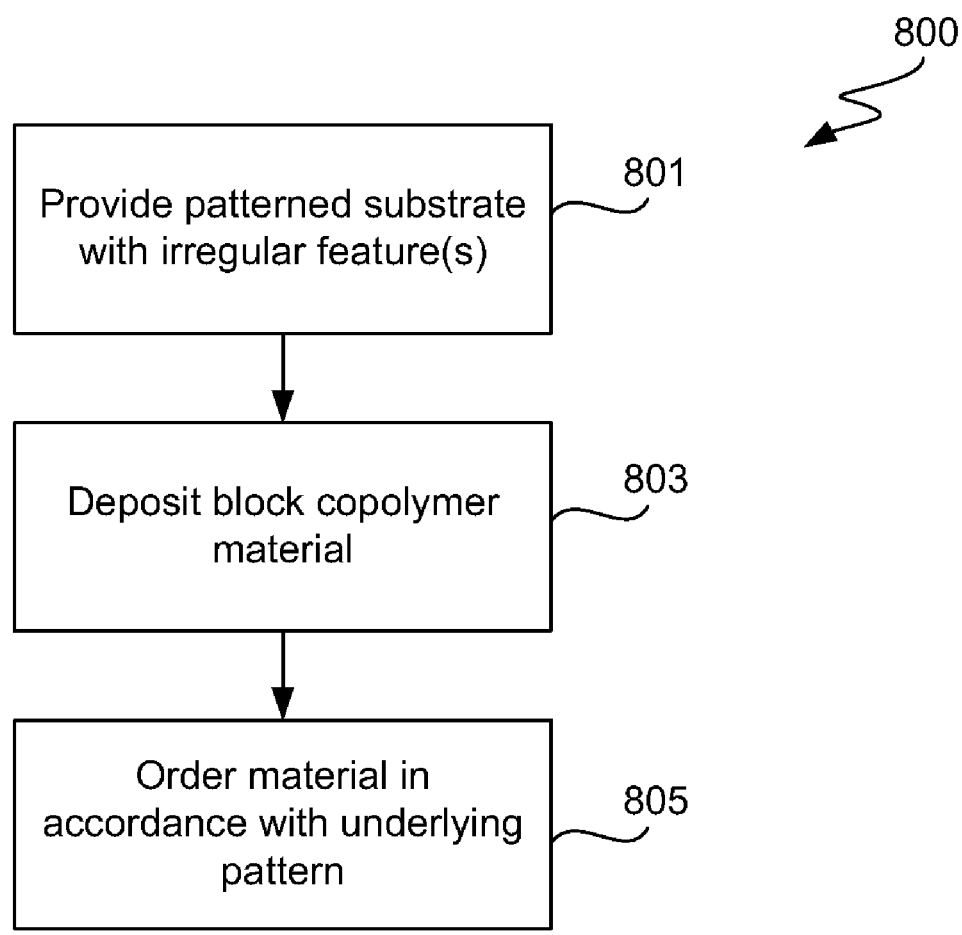
FIG. 8 is a flowchart showing a process of replicating an aperiodic pattern on a substrate according to one embodiment of the invention.

FIG. 8 is a flowchart showing the operations of a process 800 according to one embodiment of the invention. At operation 801, a patterned substrate having irregular features is provided. The substrate may be chemically patterned or otherwise activated. At operation 803, a layer of material comprising a block copolymer is deposited on the substrate. For example, the material may be a block copolymer/homopolymer blend. Components of the block copolymer material are then ordered in accordance with the underlying pattern in operation 805 to replicate the pattern in the copolymer layer. To induce ordering, the block copolymer material is typically annealed above the glass transition temperature of the blocks of the copolymer material.

FIG. 9 shows a block copolymer film formed on a patterned substrate in accordance with an embodiment of the invention. The pattern contains an irregular feature, i.e. a 135° angle bend. As can be seen in FIG. 9, the method produces perfect or near-perfect duplication and registration with the underlying pattern. This is true even at the bend (shown close-up in the 500 nm image.)

Figure 10:
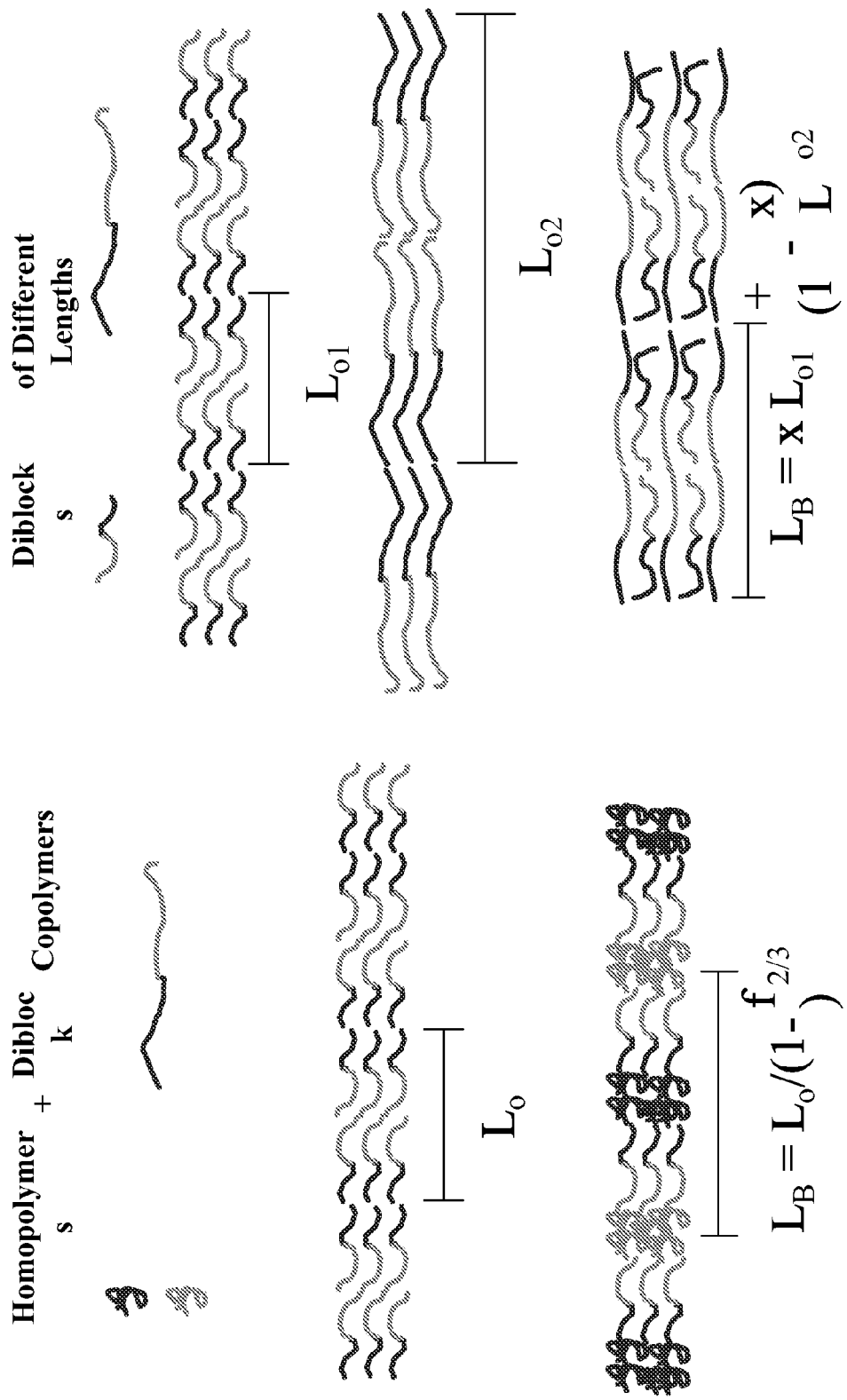
FIGS. 10A and 10B show bulk lamellar periods of copolymer/copolymer and copolymer/homopolymer blends.

According to various embodiments, ordering of the copolymer in accordance with the aperiodic pattern is facilitated through the use of blends of the copolymer material. FIGS. 10A and 10B show how target feature size may be shifted through the use of block copolymer/block copolymer or block copolymer/homopolymer blends. For example, one can shift the period of the copolymer material by blending the block copolymer with another block copolymer of a different length as shown in FIG. 10B. Block copolymer 1 has a bulk lamellar period $L_{o1}$ and block copolymer 2 has a bulk lamellar period $L_{o2}$. The resulting period of the blend, $L_B$, is a function of the periods $L_{o1}$ and $L_{o2}$ of the diblocks, and the composition of the blend. Homopolymers may also be blended with the block copolymer in the copolymer material as shown in FIG. 10A. The block copolymer has a period $L_o$. The resulting period of the blend, $L_B$, is a function of the period of the diblock copolymer period $L_o$ and the composition of the blend.

Figure 11:
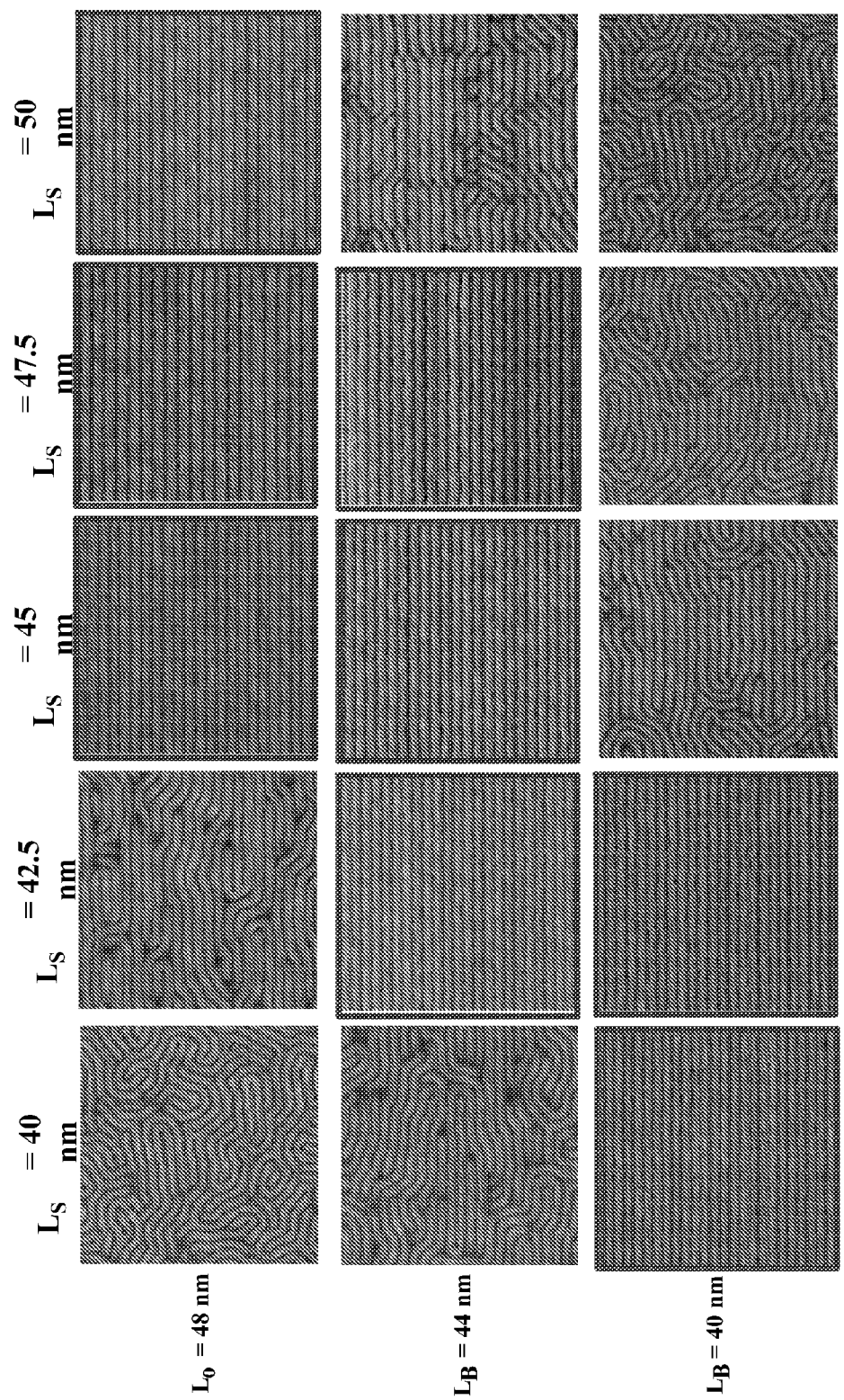
FIG. 11 shows the results of deposition of copolymer blends of periods of 40 and 44 nm and unblended copolymer material of period 48 nm on patterned surfaces of 40 nm, 42.5 nm, 45 nm, 47.5 nm and 50 nm.

Blends may be used to duplicate patterns of any period. FIG. 11 shows layers of unblended block copolymer ($L_o$=48 nm) and two blends ($L_B$=44 nm and $L_B$=40) deposited on substrates with pattern periods of 40 nm, 42.5 nm, 45 nm, 47.5 nm and 50 nm. For substrate pattern with a period of 50 nm, good ordering was achieved with the unblended block copolymer of $L_o$=48 nm. Both the 45 nm and 47.5 nm patterns were well-ordered with use of the unblended copolymer and the 44 nm blend. For the substrate pattern with $L_s$=42.5 nm, good ordering was achieved with use of each of the blends and the $L_s$=40 nm was well-ordered when covered with the 40 nm blend. The results show that it is possible to achieve good ordering of a block copolymer blend on a substrate pattern of a particular period by appropriately blending the material. Blends may used to improve ordering of periodic (as shown in FIG. 11) and aperiodic patterns by tailoring the material used to the particular period or (range of effective periods) in the pattern.

Figure 12:
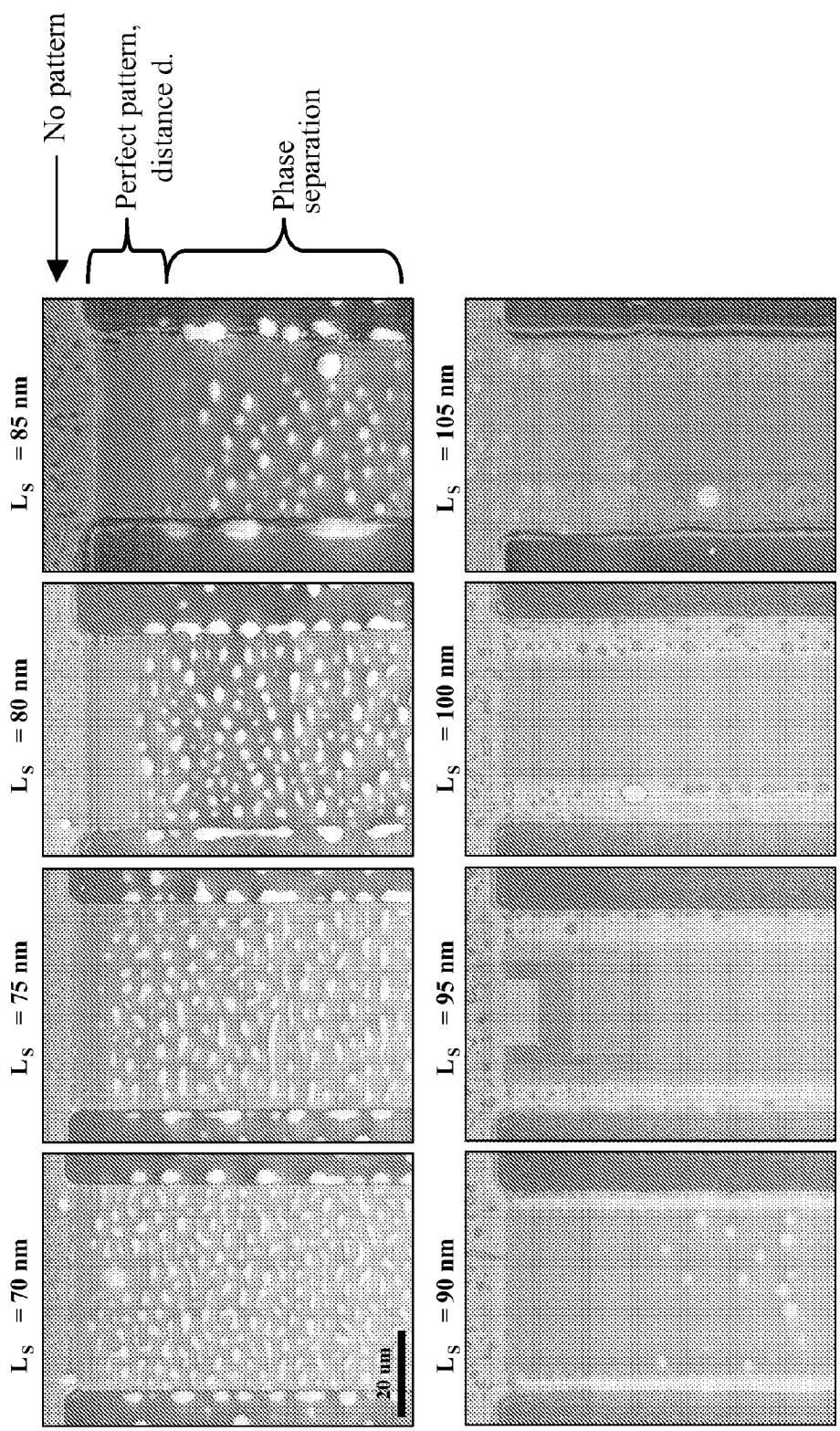
FIG. 12 shows the results of deposition of a PS-b-PMMA/PS/PMMA blend on patterned substrates with pattern periods ranging from 70 nm to 105 nm.

In preferred embodiments, the blend contains a homopolymer or other swellable material. FIG. 12 shows results of deposition of a blend of PS-b-PMMA block copolymer with PS and PMMA homopolymers on substrates with pattern periods ranging from 70-105 nm. The homopolymer volume fraction $\phi_H$ in the PS-b-PMMA/PS/PMMA blend was 0.6. The blend period $L_B$ was around 100 nm.

Deposition on substrate patterns of 95 nm-105 nm resulted in well-ordered duplication and registration of the striped pattern (the pattern features cannot be distinguished because of the scale of the image (about 40 μm/inch). This is because the pattern period $L_S$ is commensurate with the blend period $L_B$ of about 100 nm.

However, deposition on substrate patterns with lower periods (i.e. 90 nm, 85 nm, 80 nm, 75 nm and 70 nm) exhibits phase-separated domains of homopolymer. These are the white spots on the images. However, near the top of each image there is also an area of perfect patterning of distance d. The amount of phase separation of the homopolymer and the distance of perfect patterning, d, is a function of the pattern period $L_S$. The area outside the patterned area acts as a reservoir to which excess homopolymer can flow. Thus, although the blend has a $\phi_H$ of 0.6, the perfectly patterned area has a $\phi_H$ of less than 0.6.

The ability of the homopolymer to diffuse, leaving an area of perfect patterning at any particular pattern period suggests that virtually any substrate pattern can be accommodated by the correct blend. With such a blend, the homopolymer could diffuse from a pattern feature, for example, with a small effective period to a pattern feature with a large effective period. The larger pattern period region would accommodate the homopolymer without phase separation. Both the small and large period areas would be patterned by the blend. For example, a ternary PS-b-PMMA/PS/PMMA (0.6/0.2/0.2 volume fraction) blend with $L_B$ of 70 nm resulted in perfectly ordered and registered lamellae on surfaces having $L_S$ ranging from 60 to 80 nm. (See Stoykovich, M. P., Müller, M., Kim, S. O., Solak, H. H., Edwards, E. W., de Pablo, J. J., Nealey, P. F., Directed Assembly of Block Copolymer Blends into Non-regular Device Oriented Structures, *Science* (accepted for publication, 2005), which is hereby incorporated by reference in its entirety and for all purposes.

Figure 21D:
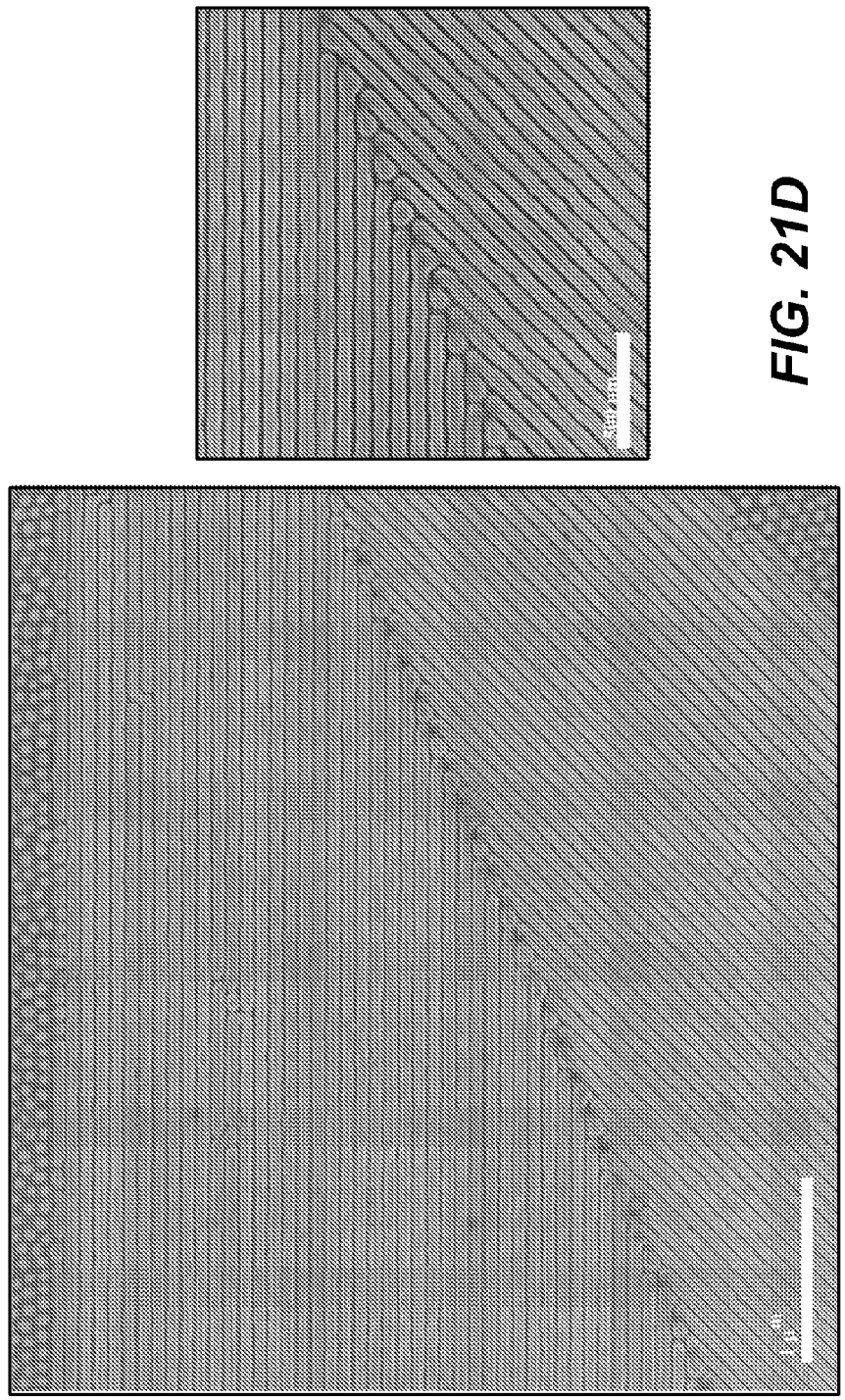

Another example of this is shown in FIG. 21A, which is an image of directed self-assembled copolymer material on a pattern containing a 45° bend. The pattern period is 65 nm along the linear portions of the pattern. As discussed above in the context of FIG. 6A, the effective pattern period at the bend is $L_s/\sin(\theta/2)$ or approximately 170 nm. The bulk lamellar period of the blend was 70 nm. Dark areas on the light stripes appear at the bend. While the invention is not limited by this theory, these dark areas are believed to indicate the concentration of the homopolymer at the bend. Homopolymer diffused from the 65 nm region of the pattern to the bend. The larger area at the bend requires more material, which that was supplied by the diffused homopolymer. This effect is also discussed in Stoykovich et al. (referenced above).

The appropriate blend composition for a desired pattern can be determined by matching the volume fraction of a polymer in a blend to the "light" or "dark" area fraction of the pattern. For example, if the "dark" area fraction of a pattern is 0.6, a ternary blend of PA-b-PB/PA/PB could be fixed so that volume fraction of A in the blend would be 0.6. In some embodiments, a reservoir may be provided to supply or take up homopolymer as needed. The reservoir may or may not be a functional part of the pattern.

The block copolymer may be blended with any number of copolymers and/or any number of homopolymers but is not limited to blending with copolymers and homopolymers. For example, the block copolymer may be blended with any swellable material that would have the ability to diffuse to regions of the pattern requiring more material. Examples of swellable materials include non-volative solvents, plasticizers, supercritical fluids or any other diluent. As with homopolymers, a reservoir may be provided to supply or take up the swellable material.

In some embodiments of the invention, ordering of the copolymer in accordance with the pattern, including aperiodic or irregularly-featured patterns, is facilitated through the configuring of substrate patterns so that regions of the substrate pattern interact in a highly preferential manner with at least one of the components in the copolymer material.

The preferential interaction may be based on any property of the substrate pattern material and/or the copolymer material. In some embodiments, a region of the substrate pattern interacts with a component of the copolymer film due to the interfacial energy between them. For example, if the block copolymer material is a PS-b-PMMA block copolymer, the substrate pattern may be configured so that a region of the pattern is highly preferential to either PS or PMMA. This may be done by tailoring the composition of the substrate pattern.

Figure 13:
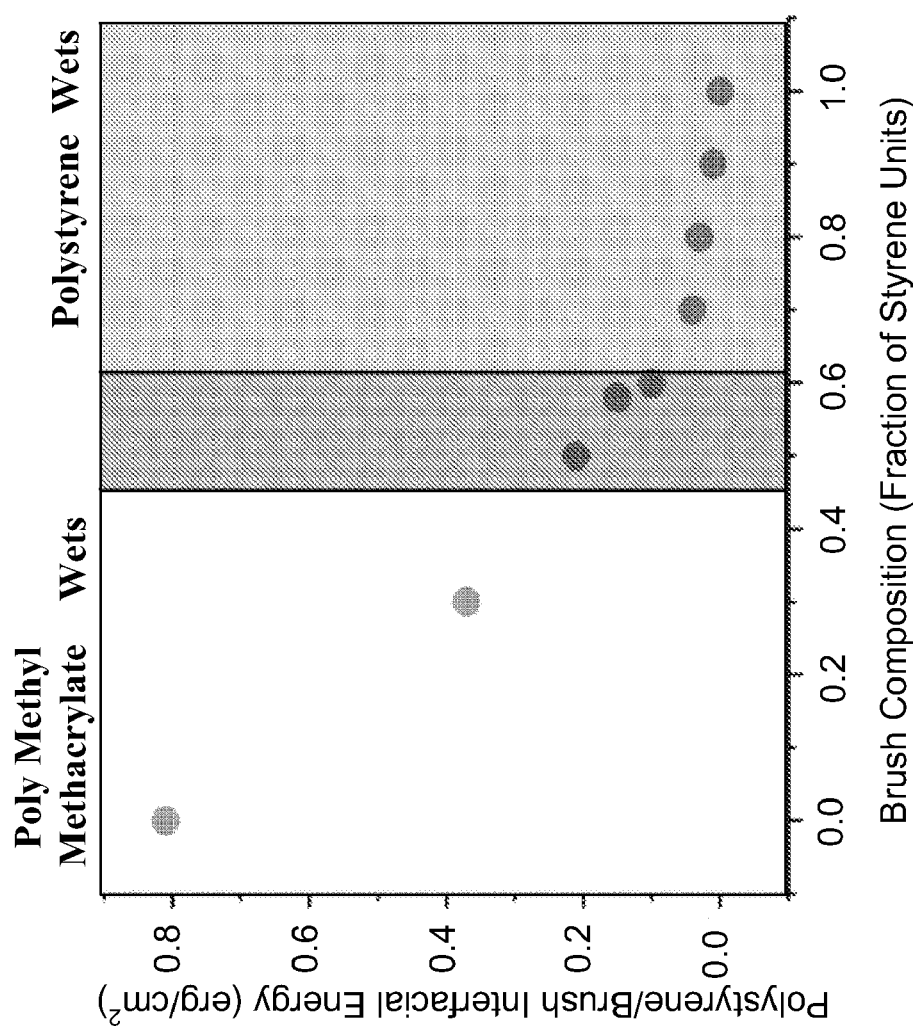
FIG. 13 shows the interfacial energy between polystyrene and the random styrene/methyl methacrylate brush as function of brush composition.

FIG. 13 shows interfacial energy between polystyrene and a random styrene/methyl methacrylate copolymer brush as a function of the composition of the brush. As the fraction of styrene in the brush decreases, the interfacial energy between the polystyrene and the brush increases (see Mansky et al., Science, 1997, 275, 1468, which is hereby incorporated by reference in its entirety.) The wetting behavior of block copolymer thin films has been shown to depend upon the interfacial energy between each block of the copolymer and the substrate, with the block having the lower interfacial energy preferentially wetting the substrate.

Figure 14:
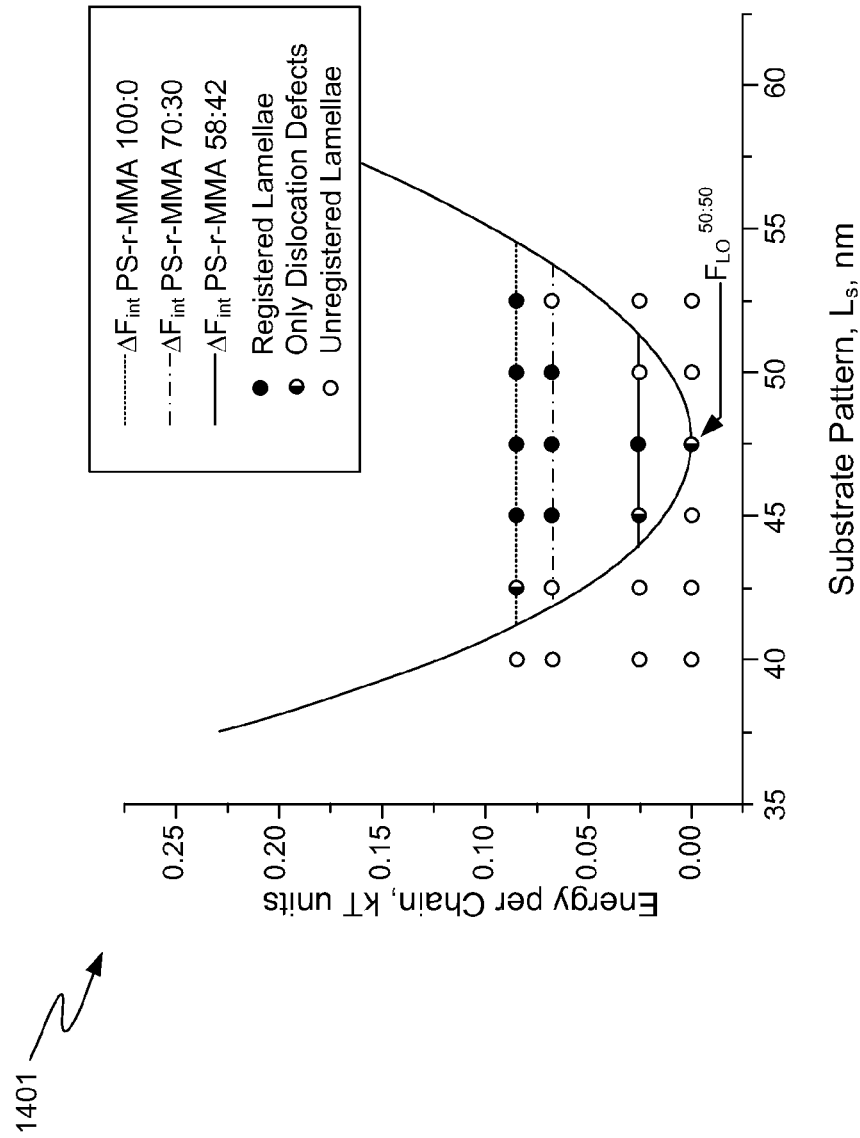
FIG. 14 is a graph showing the energy required to stretch/compress copolymer blocks as a function of substrate pattern period.

In some embodiments, one or more components of the copolymer material may be stretched or compressed to facilitate registration with the underlying pattern. Compression may occur when the bulk lamellar period of the copolymer material is greater than that of the pattern. Stretching may occur when the bulk lamellar period of the copolymer material is less than that of the pattern. Stretching and compressing the components of the block copolymer allows them to register with a wider range of substrate pattern periods. However, compression and stretching require energy. FIG. 14 shows a graph 1401 showing the energy required to stretch/compress the copolymer blocks as a function of substrate pattern period $L_s$ (see Advanced Materials, 16(15), 1315-1319, 2004, hereby incorporated by reference in its entirety and for all purposes). The parabolic line may correspond to a polymer brush substrate pattern region. As long as the interfacial energy contrast is within the parabola, the block copolymer can register with the underlying pattern (by compressing and/or stretching components of the copolymer material). Thus, increasing the interfacial energy contrast results in registration of the block copolymer film over a larger range of substrate pattern periods.

Figure 15A:
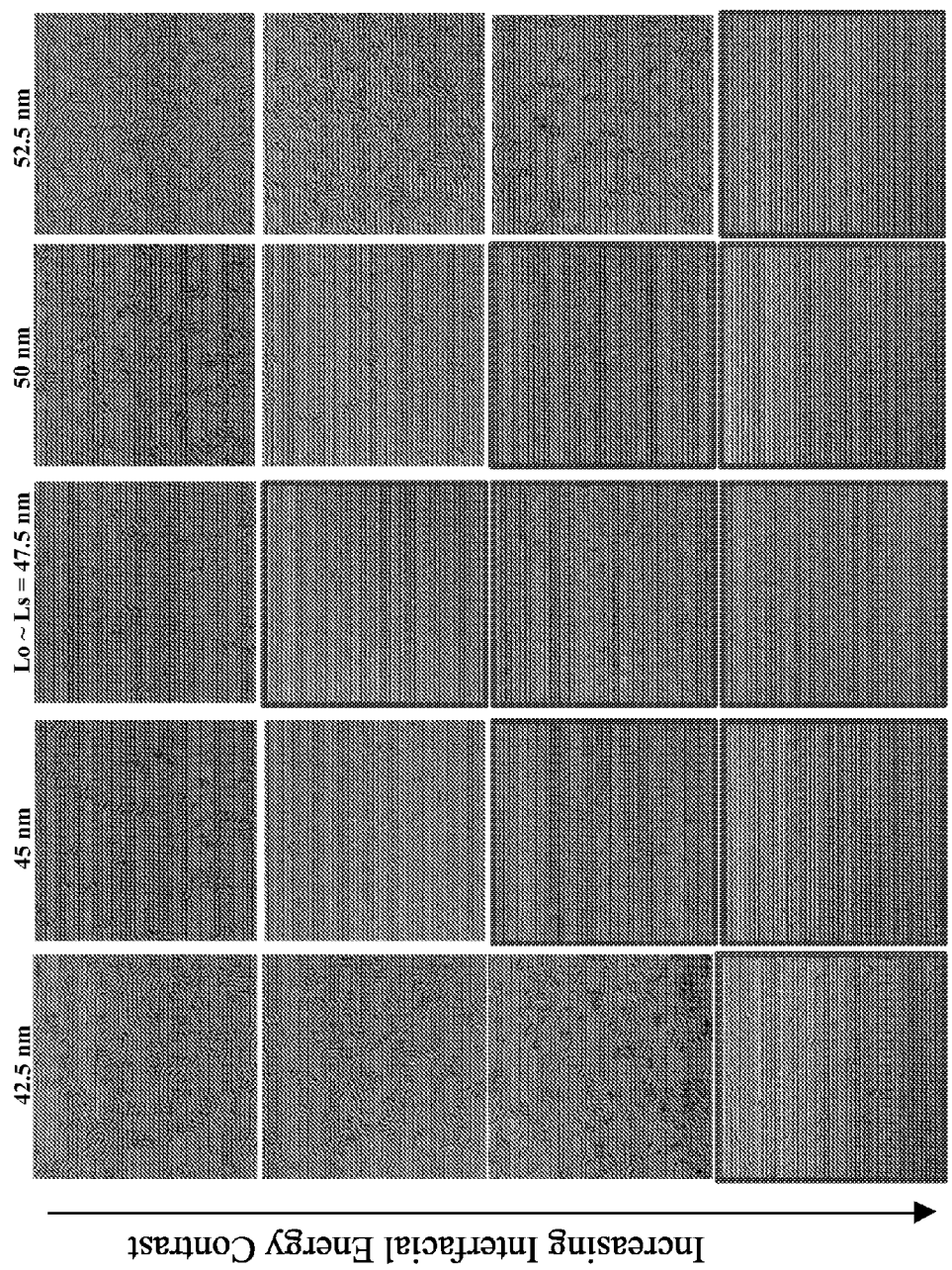
FIG. 15A shows block copolymer films of period 48 nm deposited on substrates of pattern periods of 42.5 nm 45 nm 47.5 nm and 50 nm and 52.5 nm for various interfacial energy contrasts.

The improvement in process latitude that comes with increasing interfacial energy contrast is shown in FIG. 15A. FIG. 15A shows block copolymer films of $L_o$=48 nm deposited on substrates with pattern periods of 42.5 nm, 45 nm, 47.5 nm, 50 nm and 52.5 nm for various interfacial energy contrasts. At the lowest interfacial energy contrast, all of the films show at least some defects, including where $L_s$ is approximately equal to the $L_o$ of 48 nm. As the interfacial energy contrast increases, the films become more ordered. At the highest interfacial energy contrast, the copolymer film is well ordered even on a substrate pattern period of 52.5 nm. Thus, increasing interfacial energy contrast increases process latitude and may be used advantageously with all (periodic and aperiodic) patterns.

Another example of the improvement in process latitude is shown in FIG. 15B, which shows CdSe nanoparticles selectively aligned using a block copolymer material. Nanoparticles are one example of a diluent that may be included in the copolymer material. They can be chosen based to surface chemistry to selectively agglomerate in one of the phases or components of copolymer material, or at the interface of the phases. When the copolymer material is deposited and ordered, the nanoparticles are selectively aligned with that phase (or at the interface). In some embodiments, the copolymer material used to deposit the nanoparticles is then removed, leaving the nanoparticles in the desired pattern. The improvement in process latitude described above thus also extends to selectively aligning nanoparticles. This is shown in FIG. 15B, which shows stripes of nanoparticles of three different widths. The pattern periodicity of the chemically patterned substrate is 55 nm, 60 nm and 75 nm, respectively (from left to right). By appropriately selecting the material used to align the nanoparticles, it is possible to selectively align nanoparticles in any desired pattern. Examples of other nanoparticles that may be deposited include gold, silver and silicon nanoparticles. Improvement in process latitude for aligning nanoparticles is also shown in FIGS. 23A-C, which show nanoparticles aligned on substrate patterns having different periods using one copolymer material.

Figure 16:
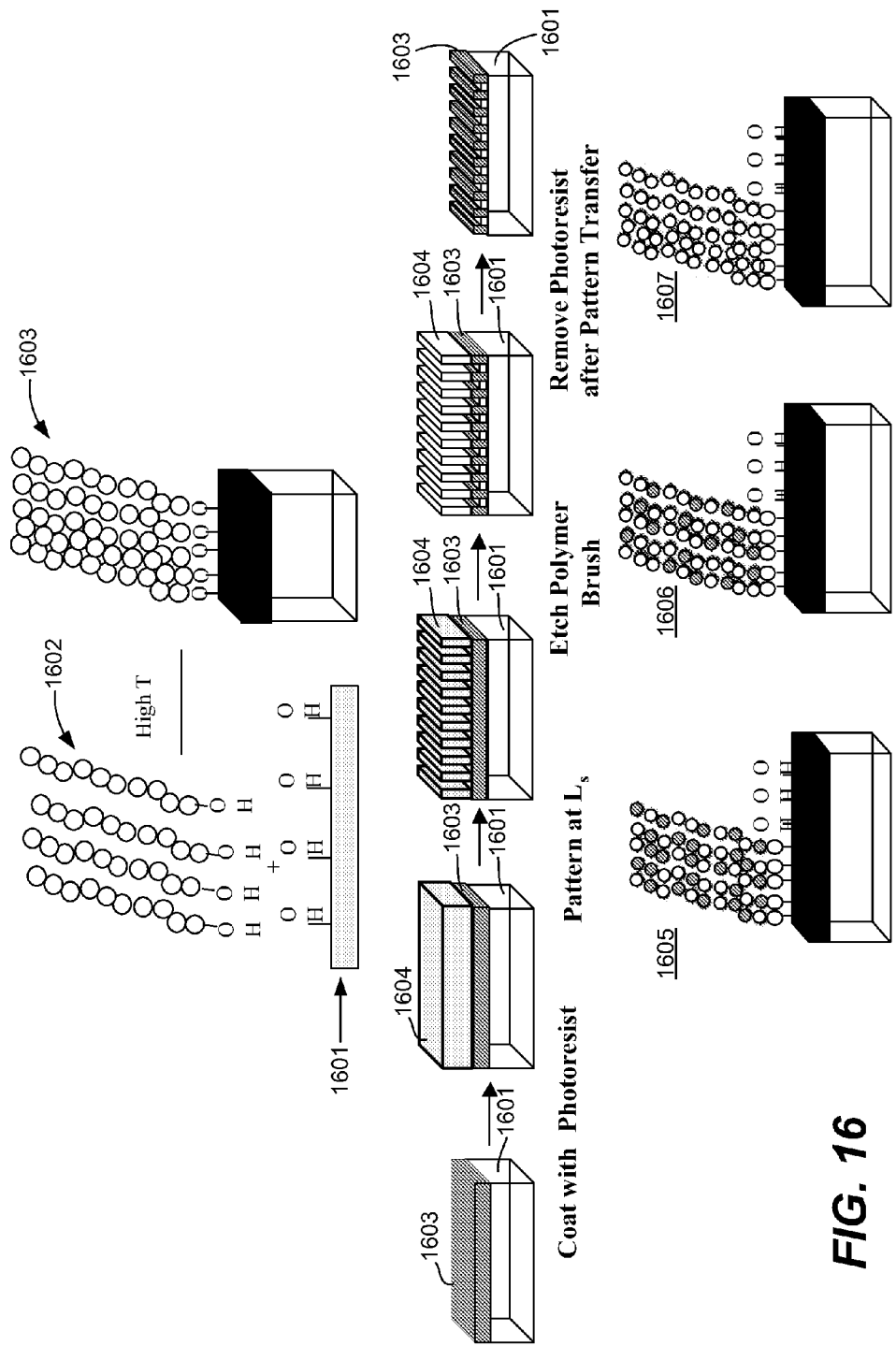
FIG. 16 shows a process of creating a patterned or activated surface using a random copolymer brush imaging layer.

FIG. 16 shows one process of creating a patterned or activated surface using a random copolymer brush imaging layer. The process involves coating the substrate 1601 with the random copolymer brush 1602 to create an imaging layer 1603. The imaging layer 1603 is then coated with photoresist 1604. Optical lithography is then used to pattern the resist 1604. The polymer brush imaging layer 1603 is then etched, transferring the pattern. The photoresist is removed after the pattern transfer. The result is a substrate patterned with regions of polymer brushes and regions of hydroxyl groups such as the patterned substrates 1605, 1606 and 1607. This technique may be used to create patterned polymer brushes of varying compositions such as those on substrates 1605, 1606 and 1607, each of which has a different chemical composition (as represented by the lighter and darker molecules in the brush).

In the example shown in FIG. 16, the pattern is a periodic pattern with a period $L_s$, however, the substrate may be patterned with any pattern including aperiodic or irregularly featured patterns.

Although the above discussion refers to creating a preferential interaction based on interfacial energy, the invention is not so limited. Preferential interactions between a region of the pattern and a component of the block copolymer may be based on any property including interfacial energy, hydrogen bonding, or any other chemical, mechanical or electrical property.

Isolated Features and Dense Device-Oriented Geometries

Another aspect of the invention relates to the formation of discrete or isolated features on a substrate. Discrete features are useful for many applications, including integrated circuit fabrication. In the past, nanostructures and functional devices fabricated using block copolymers, including quantum dots, magnetic storage media, flash memory devices, semiconductor capacitors, photonic crystals, and nanopores have either required or benefited from the highly ordered and periodic nature of the self-assembled material. For many applications in advanced lithography and the semiconductor industry, however, features must be patterned in complex geometries that lack such long-range order. For example, FIG. 24A shows generalized layouts for gate layers for a NAND2 or NOR2 layout and an inverter layout. The NAND2 or NOR2 gate layer has a jog at 2401 and the inverter gate layer has t-junction at 2403 and sharp 90° angles at 2405. In addition to jogs, t-junctions and bends, pattern geometries needed for pattern transfer and integrated circuit fabrications, includes long lines, short line segments, periodic arrays of spots, and isolated spots as shown in FIG. 24B. Most integrated circuit layouts can be fabricated using these features. Spots, for example, can be used to for pattern transfer or fabrication of contacts or contact holes. These features may be required either as dense arrays or as isolated structures with sub-32 nm critical dimensions. Using the methods described herein, features including those shown in FIG. 24B may be self-assembled using block copolymer materials.

Figure 19A:
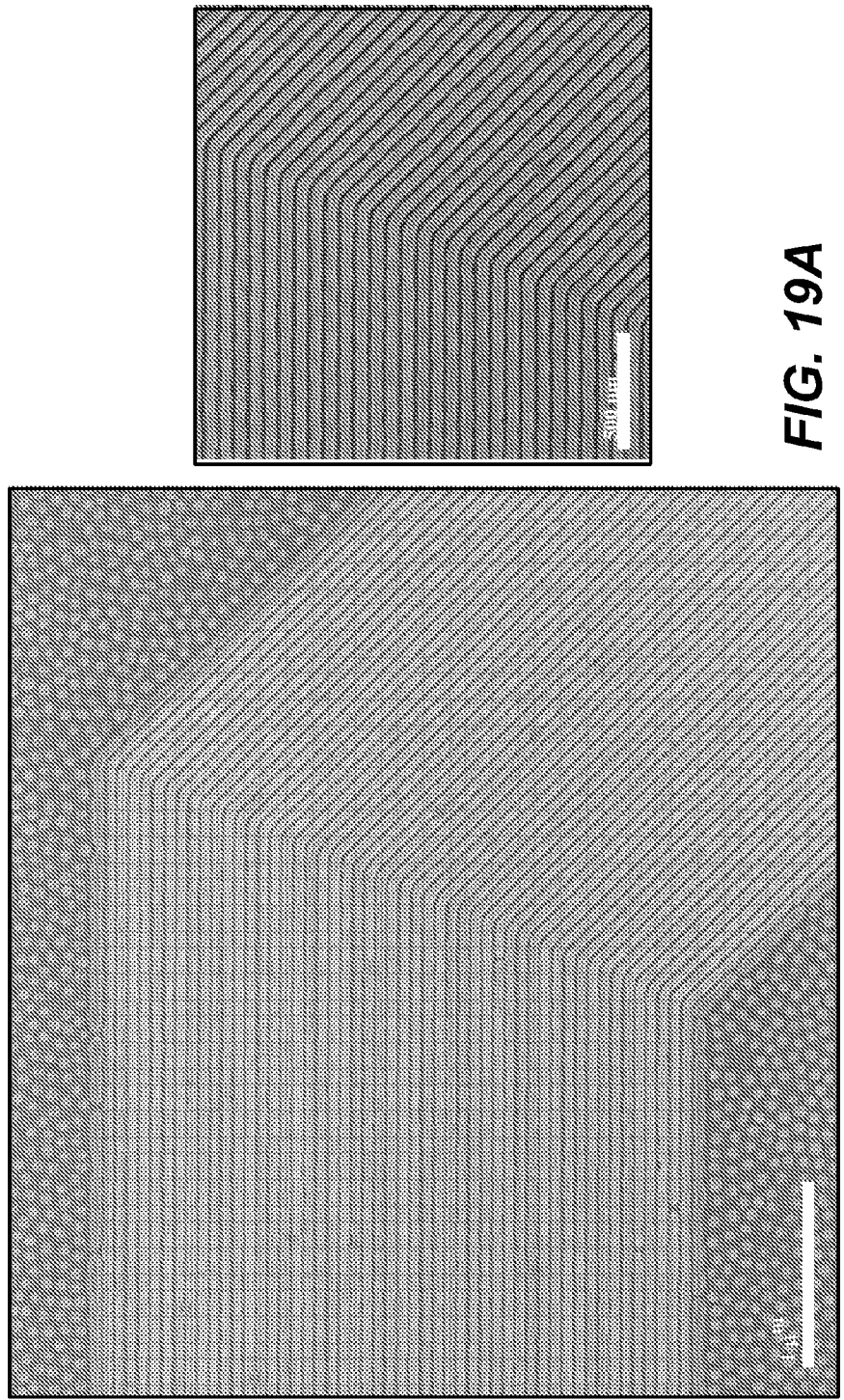
Figure 19D:
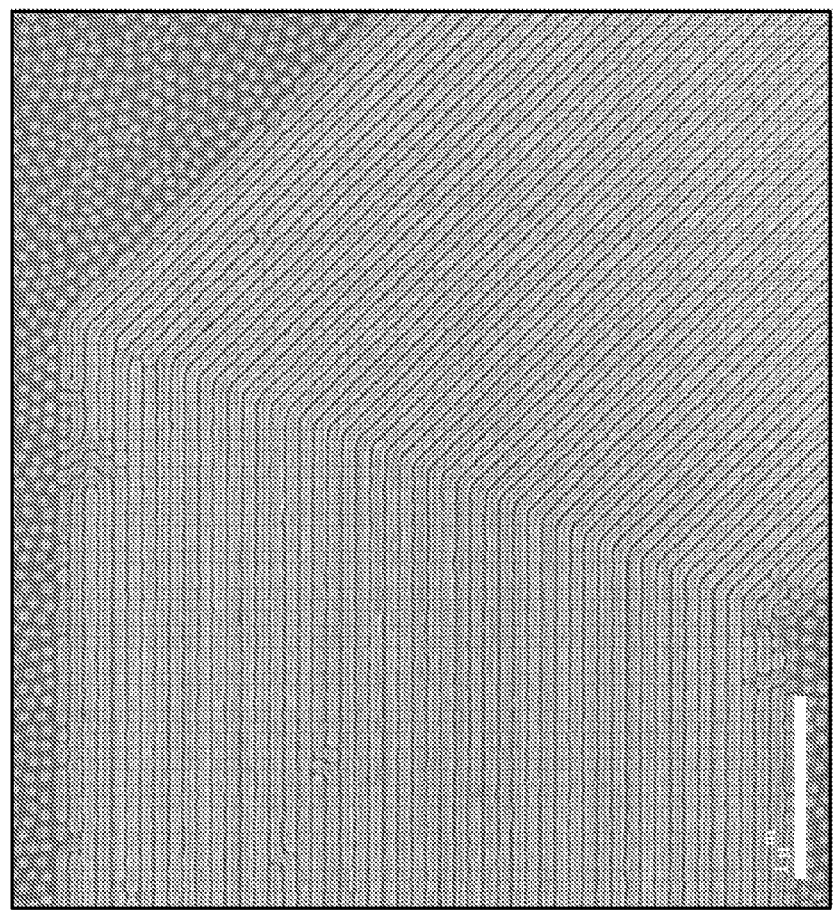
Figure 20A:
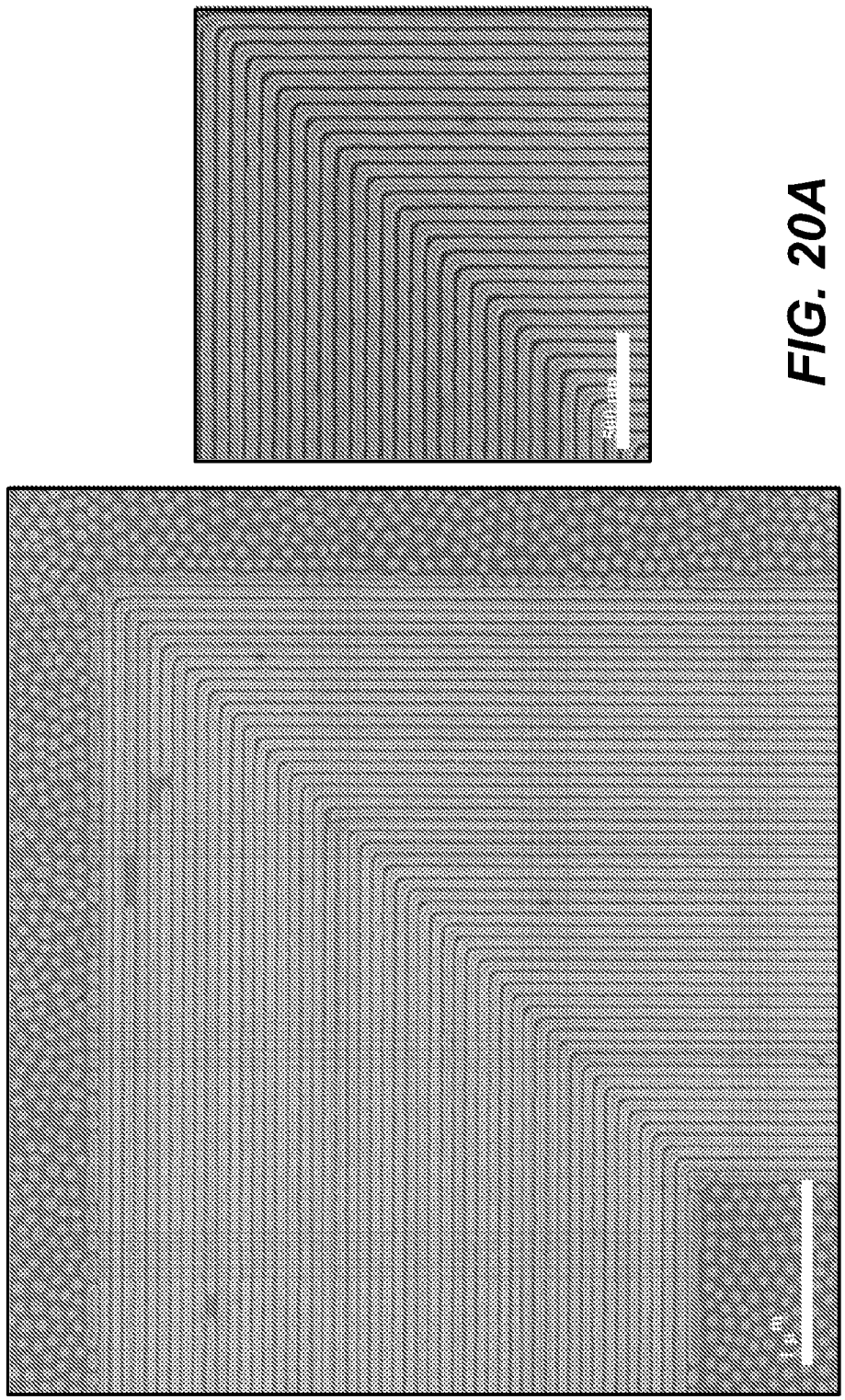
Figure 26:
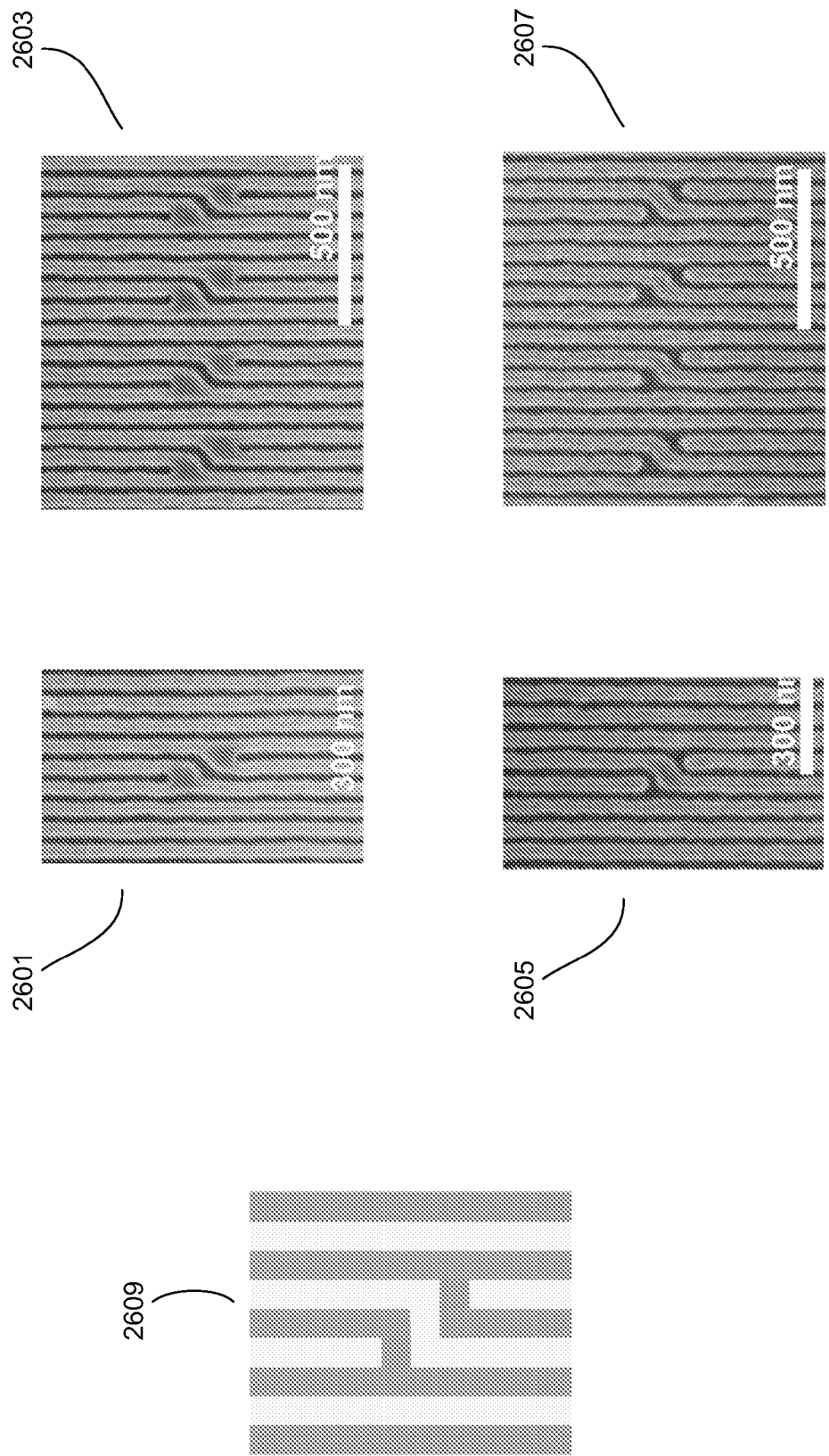
FIG. 26 shows top-down SEM images of a PS/PMMA ternary blend directed to assemble into isolated PMMA jogs or isolated PS jogs, and the chemical pattern used to direct the assembly.
Figure 27:
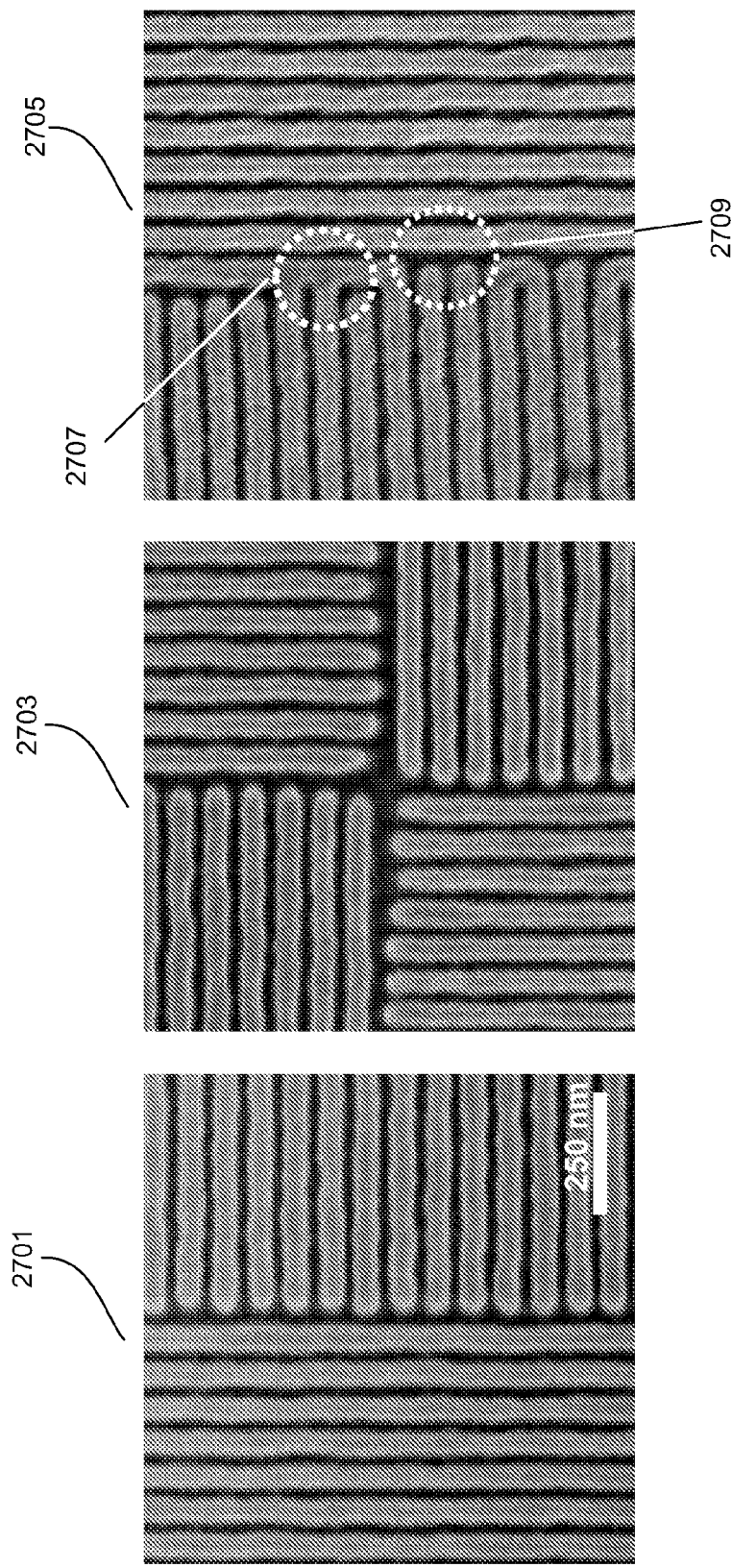
FIG. 27 shows top-down SEM images of a PS/PMMA ternary blend directed to assemble into arrays of T-junctions.

FIG. 9, discussed above, shows a dense nested array of 135° bends. (Similar dense nested arrays of other bends including sharp 90° bends are shown in FIGS. 19-20D and discussed below in the Examples.) In addition to the dense arrays of bends shown in these figures, nested arrays of jogs and t-junctions may be formed using the methods described herein. In FIG. 25, for example, a SEM images 2501 and 2503 of dense lines with nested jog features are shown. In the SEM images, the PS domains are displayed in light gray, while the PMMA domains are dark gray or black. As shown in FIG. 25, these features are nested over large areas of the substrate—similar to the bends shown in FIG. 9. The nested array of bends and jogs formed shows that these geometries can be assembled with a high degree of perfection and reproducibility. Features such as jogs may also be embedded or isolated within a dense array of a uniform patterned field, for example in a dense array of lines. FIG. 26 shows examples of copolymer films directed to assemble into a pattern having an embedded or isolated jog feature in a dense array of lines. A schematic of the pattern is shown at 2609: depending on which domain is removed, different structures can be obtained from the pattern. As can be seen, in FIG. 26, the substrate may be patterned such that the jog occurs in any of the copolymer material components (e.g., either in the PS or the PMMA): at 2601, an SEM image of a PS domain directed to assemble into a jog structure is shown and at 2605, an SEM image of a PMMA domain directed to assemble into a jog structure is shown. Also shown in 2603 and 2607 are SEM images of PS and PMMA domains, respectively, directed to assemble into structures having multiple isolated jog features. In the examples shown, the jog features isolated from each other by dense lines. Rather than repeat over arbitrarily large areas of the surface, as in FIG. 25, the jogs are isolated and embedded within the parallel lines. According to various embodiments, the isolated features may be embedded within another feature type, e.g., the dense array of lines shown in FIG. 26, or may be surrounded by a single component, e.g., an PS-rich region, or may be adjacent to another type of feature. Another dense pattern layout that may be used in pattern transfer or fabrication of devices is shown in FIG. 27, which shows arrays of t-junctions. At 2701, an SEM image of a PMMA t-junction (in black) is shown. A copolymer material directed to assemble into multiple t-junctions oriented in different directions is shown in the SEM image at 2703. SEM image 2705 shows directed assembly of a structure having both PS and PMMA t-junctions: PS t-junctions at 2707 and PMMA t-junctions at 2709. The PS domains are displayed in light grey, and the PMMA domains in dark grey or black. As shown in FIG. 27 at 2707, the grey PS domain forms t-junctions, while at 2709, the black PMMA domain forms t-junctions. T-junctions such as those shown in FIG. 27 can be combined with other features, including bends and jogs, to create complex interconnect systems.

In certain embodiments, the structures of the present invention may have single spots or arrays of spots. For example, a region of the structure may be an array of cylinders. FIGS. 28 and 29 provide examples of arrays of cylinders oriented perpendicular to the substrate. FIG. 28 shows the desired pattern, hexagonal array of circles, at 2801. Copolymer layers are shown in SEM images at 2803 and 2805; the layer shown in image 2803 formed from a ternary PS-b-PMMA blend and the layer shown in image 2805 from an asymmetrical PS-b-PMMA block copolymer. Similarly, FIG. 29 shows a pattern 2901 to form a square array of cylinders and the resulting copolymer layer in image 2903. The square arrays of cylinders shown in FIG. 29 is an example of a 'non-natural' geometry, i.e., a geometry that the bulk copolymer does not assume in the bulk, but using the methods described here and [by appropriately matching the natural dimensions of the blended material in the bulk to the desired pattern dimensions, such structures may be obtained. (See, also Square Arrays of Vertical Cylinders of PS-b-PMMA on Chemically Nanopatterned Surfaces Sang-Min Park, Gordon S. W. Craig, Young-Hye La, Harun H. Solak, and Paul F. Nealey Macromolecules; 2007; 40(14) pp 5084-5094, incorporated by reference herein). In certain embodiments, arrays of cylinders such as the shown in FIGS. 28 and 29, the substrate may be etched to form contact openings. By combining various discrete or isolated features, structures having multiple types of features, such as those in FIGS. 6 and 24, may be formed.

Dense pattern layouts including the nested arrays of features in FIG. 9 and the nested array of jogs in FIG. 25 as well as features embedded in dense arrays of another feature type, such as the patterns shown in FIGS. 26 and 27, benefit from a uniform block copolymer domain orientation and the length scale inherent to the material. That is to say, each of the PS/PMMA interfaces and domains shown in FIGS. 9 and 25-29 are oriented perpendicular to the substrate and the periodicity of $L_S$ is commensurate with $L_O$ or $L_B$. In certain embodiments, methods of directing assembly of isolated structures within large areas of the film uniform in composition are provided. Neighboring block copolymer structures with domain orientations parallel and perpendicular to the substrate are provided. For example, structures, e.g., oriented perpendicular to the substrate, neighbor regions of film oriented parallel to the substrate. In this way structures are isolated within homogenous regions of film. This is discussed further below with respect to FIG. 30.

Figure 30:
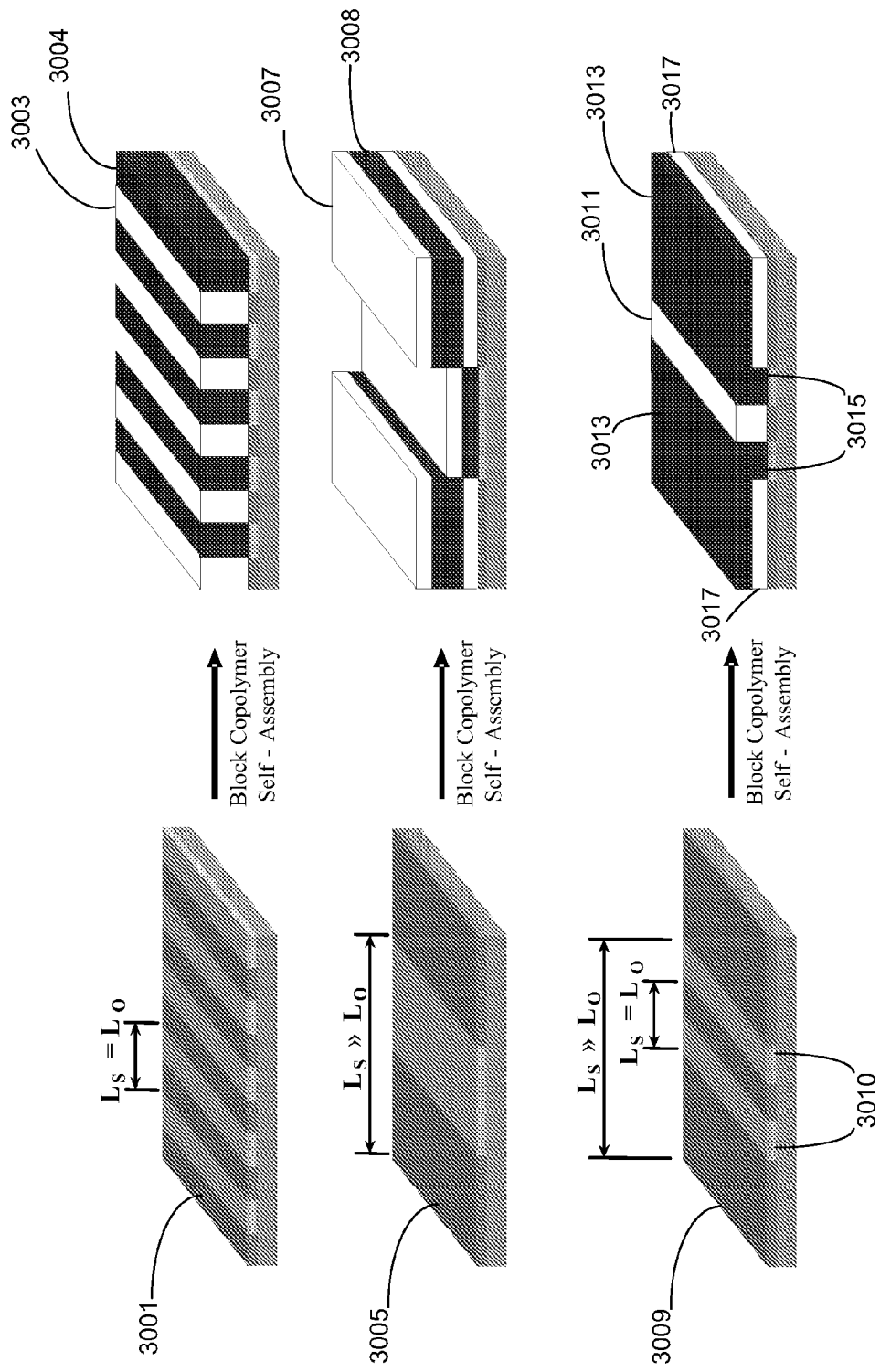
FIG. 30 is a schematic showing fabrication schemes for directing the assembly of block copolymers into 1) films having domains oriented perpendicular to the substrate, 2) films having domains oriented parallel to the substrate, and 3) films having mixed perpendicular and parallel domains.

Block copolymers form parallel oriented domains on homogeneous surfaces preferentially wet by one block of the copolymer or on chemically patterned surfaces with $L_S \gg L_O$. (Island or hole morphologies may be generated by the copolymer in films with thicknesses greater than $L_O$ to maintain both the copolymer's required lamellar periodicity ($L_O$), as well as the favored wetting of the substrate and the air or free surface by the copolymer domains. In the case of PS and PMMA systems, the lower surface energy PS component preferentially wets the free surface. Films with thicknesses less than $L_O$, such as those often used in thin film structures described herein, typically maintain uniform films thicknesses and do not form island or hole morphologies.) Parallel oriented block copolymer structures cannot be used as etch or deposition masks because there is no clear path from top of the film to the substrate even after selective removal of one of the copolymer domains. FIG. 30 shows a schematic of a pattern 3005 having a period $L_s$ incommensurate with the period $L_o$ of the copolymer material to be deposited on it. Because $L_s \gg L_o$, the PS and PMMA domains are oriented parallel to the surface. Parallel PS lamella 3007 and PMMA lamella 3008 are indicated.

Directed assembly of dense block copolymer structures on chemical surface patterns with $L_S$ commensurate with $L_O$ or $L_B$ is also illustrated in FIG. 30: substrate pattern 3001 has a period $L_s$ equal to the period $L_o$ of the copolymer material to be deposited on it. Directed assembly of dense block copolymer structures is also described above—see, e.g., FIGS. 9, 11, 15A and 15B, and the associated discussion. As shown in these figures, as well as FIGS. 25-29, the resulting structures are oriented perpendicular to the substrate—the PS or PMMA domain can be removed from the assembled film and the pattern directly transferred to the substrate by reactive ion etching or other etch technique. In FIG. 30, a PS lamella 3003 and PMMA lamella 3004 are indicated; either the PS or the PMMA domain may be selectively removed to create lines, or to transfer lines via etching to the underlying substrate.

As indicated, in certain embodiments, the fabrication of isolated features involves using chemically patterned or otherwise activated surfaces that are able to induce the morphology of the overlying films to assemble into the various features in certain regions or domains, and induce the film to assemble into unpatterned or relatively large patterned features, in other regions or domains. In this manner, small features, e.g., spots or t-junctions, may be surrounded or adjacent to unpatterned or relatively large-featured (compared to the dimensions of the small features) domains.

In certain embodiments, this involves patterning the chemically patterned substrate to induce the morphology of the overlying film 1) to be oriented parallel to the surface in unpatterned regions or for defining relatively large patterned features (compared to the dimensions of the domains of the block copolymer material or the dimensions of the smallest features), and 2) oriented perpendicular to the substrate to pattern the smallest features at dimensions commensurate with the dimensions of the domains of the block copolymer material. FIG. 30 provides an example of parallel and perpendicular block copolymer domains, as well as an example of simultaneous assembly of perpendicular and parallel block copolymer structures. Pattern 3009 has PMMA preferential lines or segments 3010 with a periodicity of $L_O$ chemically patterned into a PS brush imaging layer. Any number of PMMA preferential lines having period $L_O$ may patterned; as indicated there are two such lines in FIG. 30. The block copolymer assembled in these areas orients perpendicular to the substrate and is registered with the surface pattern: PS wets the PS-preferential stripe in pattern 3009 to form lamella 3011 and PMMA wets the PMMA preferential lines to form lamellae 3015. The lack of surface pattern outside of the PMMA preferential lines leaves a homogeneous, PS preferential surface that induces a parallel block copolymer domain orientation, with parallel PS domains 3017 and parallel PMMA domains 3013. The assembled lines can be transferred to the substrate after selective removal of one of the copolymer domains. Two pattern lines can be transferred to the substrate by the removal of the PMMA domains 3013 or, alternatively, the PS domain at 3011 could be removed leading to the transfer of a single isolated line to the substrate. The parallel domains are large areas that are preferentially wet by one of the components, whereas the perpendicular domains are patterned to define the desired features.

Thus, isolated structures can be directed to assemble in block copolymer films by using mixed perpendicular and parallel orientations achieved on surfaces that were chemically patterned at both $L_S=L_O$ and $L_S \gg L_O$ (e.g., $L_S$ is at least twice $L_O$) length scales. The perpendicular domains can be selectively removed to provide a suitable mask for etching or depositing material on the substrate.

In certain embodiments, the self-assembled block copolymer layer contains one or more distinct regions, the regions differing in one or more of type of feature, size, and/or pitch (pitch refers to the spacing of the features—e.g. a pattern of 5 mm lines separated by 5 mm has 1:1 pitch). An example is an isolated spot at one area of the substrate, and a t-junction at another area of the substrate. These features or regions of features may be separated by unpatterned or uniform fields, or may be adjacent to one another.

Figure 31:
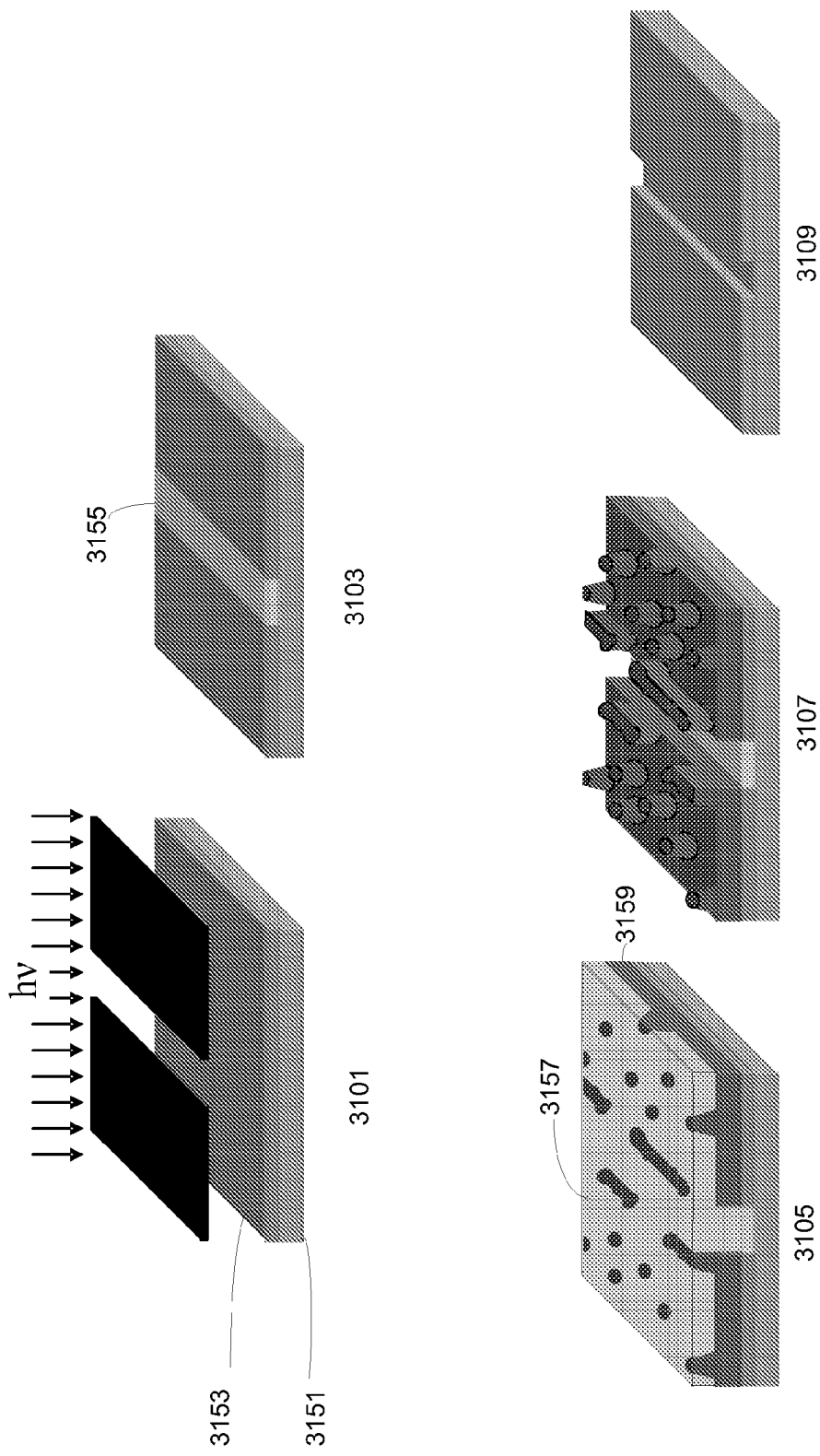
FIG. 31 is a schematic showing a fabrication approach for isolated features etched in substrates according to certain embodiments.

FIG. 31 provides an example of a fabrication approach for isolated features etched in substrates. An ultra-thin imaging layer 3153 is deposited on a substrate 3151. The imaging layer is exposed to radiation in to form the desired chemical surface pattern in the imaging layer. The exposure operation in illustrated at 3101, with the resulting chemical pattern shown at 3103. Here, the desired pattern is an isolated line 3155. A block copolymer material is then deposited on the patterned substrate and annealed to order the block copolymer material. This is illustrated at 3105, with the copolymer block domain that preferentially wets the isolated line indicated at 3157 and the copolymer block domain that preferentially wets the surrounding regions indicated at 3159. Block copolymer domain 3157 is then selectively removed, as indicated at 3107, leaving an isolated line. Reactive ion etching is used to etch the substrate, transferring the isolated line into the substrate, as shown in 3109.

Figure 32A:
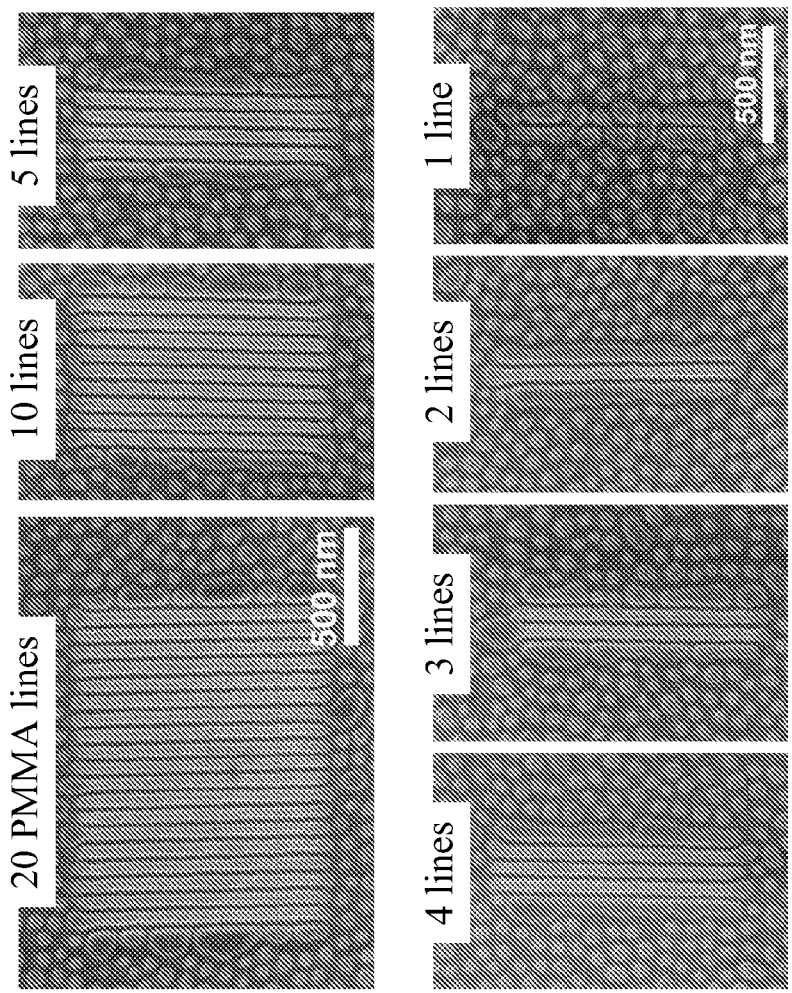
FIG. 32A shows top-down SEM images resulting from the directed assembly of PS/PMMA ternary blend into isolated segment geometries of 1 μm in length and ~35 nm in width.

Examples of isolated line features formed by this method are shown in FIG. 32A. FIG. 32A shows SEM images resulting from the directed assembly of PS-b-PMMA block copolymers into isolated segment geometries of 1 μm in length and ~35 nm in width. Sets of 20, 10, 5, 4, 3, 2, and 1 PMMA lines were fabricated in the block copolymer film as shown in FIG. 32A. The number of lines represents the number of PMMA preferential lines in the surface pattern and therefore the number of perpendicular PMMA domains that were assembled on the surface pattern. The isolated PMMA line structures are dark gray or black and are sandwiched between light gray PS domains.

Figure 32B:
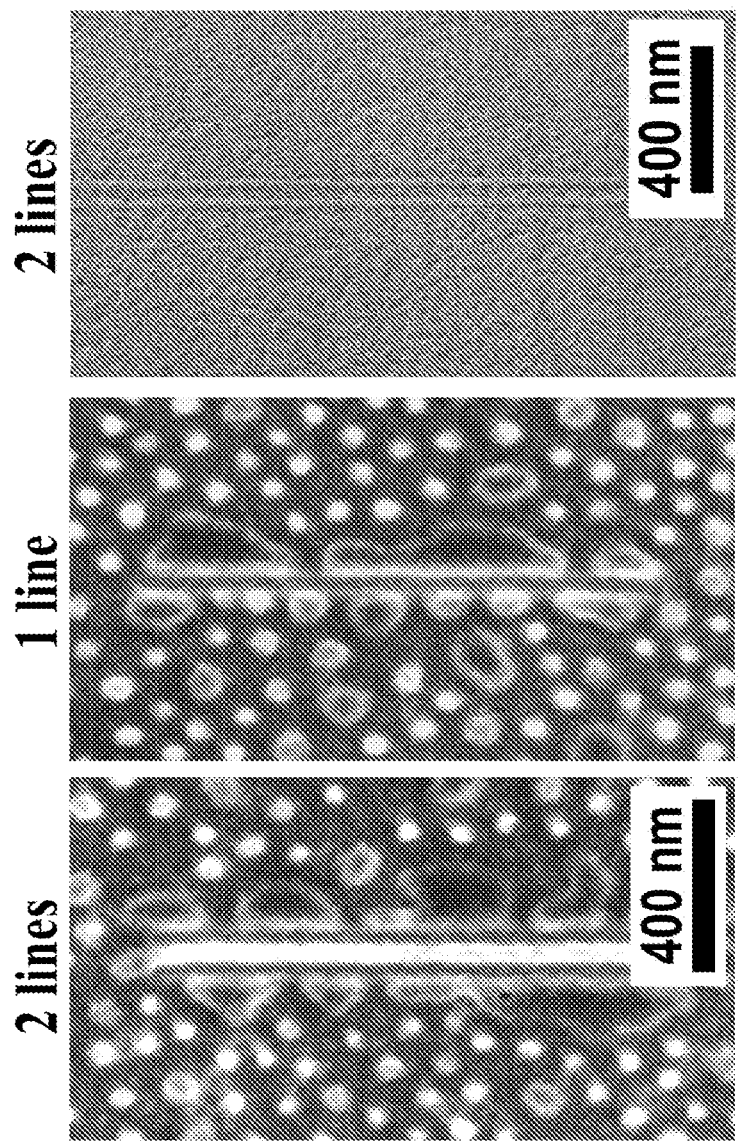
FIG. 32B shows top-down SEM images of the PS structures formed after selective removal of the PMMA domains from block copolymer blend films shown in FIG. 32A. A top-down SEM image of defect-free isolated line structures etched into a $SiO_2$ substrate using a PS template and HF wet etching is also shown.

FIG. 32B shows three SEM images: the left and middle images show the structures after selective PMMA removal. These structures are PS templates that can be used for selective etching or deposition processes. The rightmost image in FIG. 32B shows the transfer of a two line isolated segment geometry from the PS template into a silicon oxide using HF wet etching techniques. Experimental conditions and resulting structures shown in FIGS. 32A and 32B are discussed further below in the Examples.

The choice of block copolymer material can play an important role in the morphology and quality of the self-assembled features. As discussed below, a symmetric block copolymer/homopolymer blend (60% PS-b-PMMA, 20% PS, 20% PMMA) was used to form the structures shown in FIGS. 32A and 32B. PS ridges along the lengthwise edges of the patterned isolated structures (PMMA stripes) are observed in some of the images. For example, in the 2 line PMMA structure shown in FIG. 32A, three PS lines (light grey) are observed in the two PMMA lines (dark grey). These types of ridge defects may be eliminated with the use of asymmetric blends as demonstrated by single-chain-in-mean-field (SCMF) simulations. FIG. 33 shows predictions SCMF simulations of the defect morphologies that arise from the directed assembly of isolated two-line PMMA structures. The 2 line PMMA structure seen in FIG. 32A is shown in SEM image 3301 in FIG. 33. A SCMF prediction from a simulation predicting the experimental conditions used to form the structure shown in SEM image 3301 is shown at 3303. Cuts through the PS domain are shown in dark grey or black and the interface between the PS and PMMA domains are displayed in the lighter grey. The PMMA component has been removed from each film. In the simulation prediction, the location of the two PMMA line isolated structure is shown at 3309. In this case the simulation reproduced the experimental conditions using a 60% PS-b-PMMA, 20% PS, 20% PMMA symmetric block copolymer/homopolymer blend. PS ridge defects are observed at 3305 in the SEM image. These PS ridge defects are readily predicted by the SCMF simulation, and are observed at 3307. However, a blend with a composition of 60 wt. % PS-b-PMMA, 11 wt. % PS, and 29 wt. % PMMA is predicted to form the two PMMA line structures and to prohibit the formation of PS ridge defects. The predicted structure from the SCMF simulation of this asymmetric blend is shown at 3311. The ridge defects found in experiments and simulations using the symmetric blend are not observed the prediction shown at 3311. Although it is difficult to precisely estimate the polymer/substrate and polymer/air interactions necessary for performing SCMF simulations, this demonstrates that tailoring the blend composition may enhance the perpendicular to parallel transition and eliminate certain defects.

Another defect that may be observed in some of the SEM images are neck defects—the PS spots observed away from the patterned segments. The spots results from PS necks arising from the PS bottom layer and propagating to the free surface. It is believed that these necks form as a result of the lower surface energy of the PS component and its slight preference for wetting the free surface of the film. The thin film block copolymer/homopolymer blend systems in this symmetric wetting condition, in contrast to thick film and pure block copolymer systems, favors the formation of these neck defects to mitigate the unfavorable PMMA/free surface interactions rather than island and hole morphologies that have non-uniform film thicknesses. PS necks are not part of an idealized parallel domain structure—in the images shown, the PS/PMMA interface has significant fluctuations in contour, but nevertheless, the PS domain uniformly wets the PS brush substrate. For the system used, the minimum thickness of the PS layer wetting the substrate in these parallel oriented regions has been estimated from reactive ion etching tests to be between 5 and 8 nm.

The PS defects in the parallel oriented regions are connected to a substrate-wetting PS layer—seem as spots in the parallel regions in the SEM images—and do not have a negative effect upon the application of such self-assembled structures as masks for selective etching or deposition processes because the underlying parallel oriented PS layer serves as a mask regardless of the PS defects present at the top of the film. The leftmost image of FIG. 32B shows the PS mask generated after removal of the PMMA domains, and displays these neck and ridge defects. The pattern transferred from the PS mask into the substrate using wet etching techniques, as shown in the rightmost image in FIG. 32B does not display any of the defects observed in the block copolymer structures. Reactive ion etching with a high etch selectivity between the substrate and the polymer mask also is also capable of pattern transferring the isolated structures into the Si substrate with perfection and without any deleterious effects caused by the PS defects. The methods and films discussed above are not limited to PS-b-PMMA block copolymer materials. For example, in applications that require thicker masks than the PS mask, the PS component of the block copolymer could be replaced with a highly etch resistant iron- or silicon-containing component. Pattern transfer processes involving metal hard masks for industrial applications would enable the use of thin, polymeric masks such as those patterned here.

Figure 34:
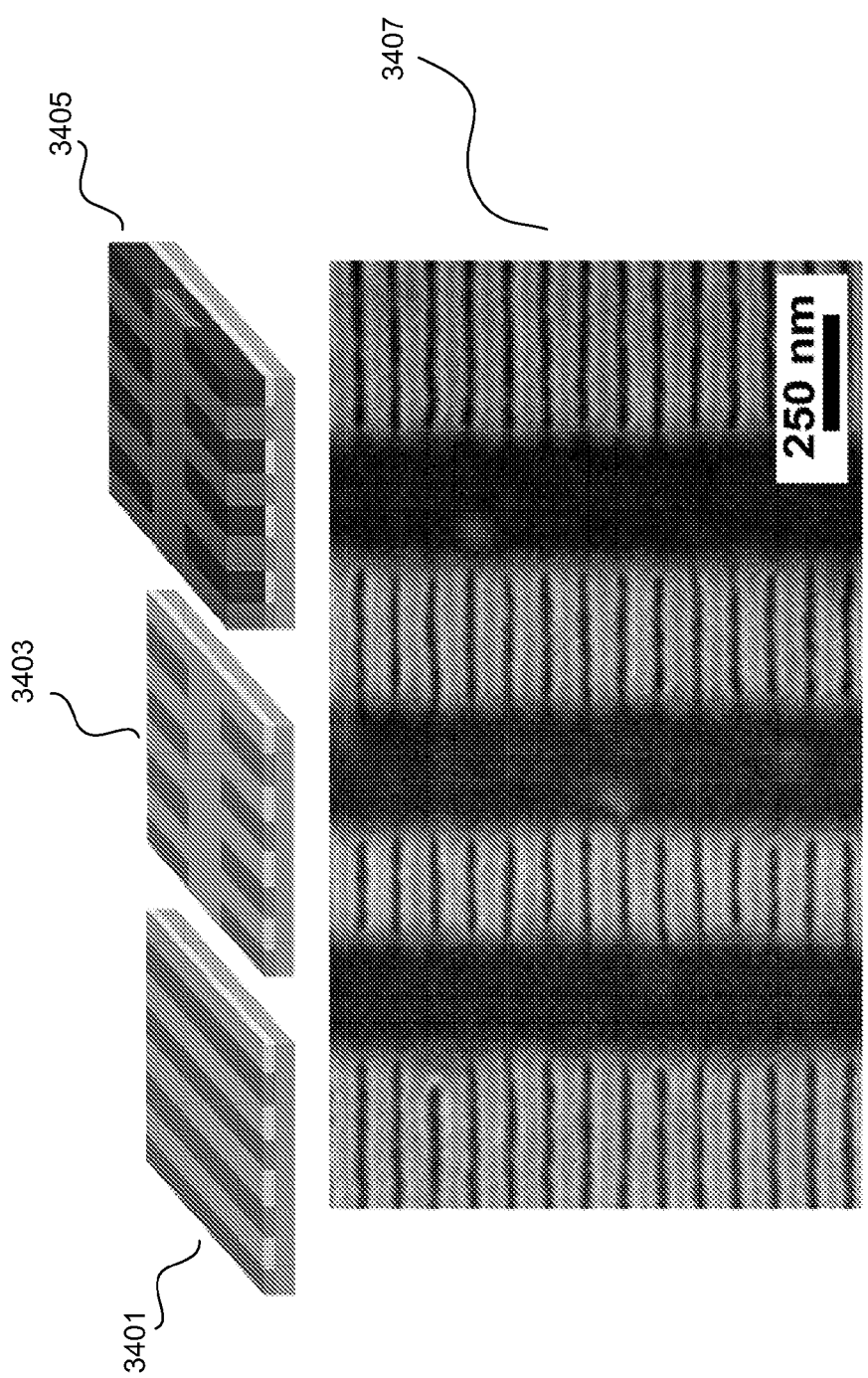
FIG. 34 shows a schematic of a multiple exposure approach to the directed assembly of isolated or dense device-oriented geometries. Also shown is a top-down SEM image of a PS/PMMA blend with $L_O$=70 nm was assembled on a chemical surface pattern fabricated using a two-step exposure process.

FIG. 34 shows an alternative approach for directing the assembly of block copolymers into isolated, device-oriented geometries. A multiple exposure process can be used to fabricate the chemically patterned surface as shown in the schematic of FIG. 34. First, large areas of the surface are chemically patterned at the desired critical dimension and with a high-degree of periodicity using a high-resolution lithographic step. Any appropriate lithographic method may be used including interference lithography or nanoimprint lithography. In the schematic of FIG. 34, the substrate patterned at the critical dimension is indicated at 3401. Next, a low-resolution lithographic step, e.g. using optical lithography, is applied to the preexisting chemically patterned surface to isolate the desired structures. In this second lithographic operation, the pattern is re-exposed at the lower resolution to define the areas that will be "blocked off." The blocked off areas are the parallel domains or the domains that will be unpatterned or have a relatively large scale pattern. Areas of any shape or size may be blocked off. The resulting pattern is indicated in schematic in FIG. 34 at 3403, with the thick stripe in the middle of the pattern isolating the high-resolution lines of the pattern. Any number of patterning steps or lithography techniques could be used to generate the chemically patterned surface. The copolymer is then deposited and self-assembled as shown in FIG. 34 at 3405. This may be followed by selective domain removal and substrate etching. Block copolymers directed to assemble on the final patterned surface can form dense, semi-dense, or isolated feature geometries.

Dense arrays of segments assembled by the lamellar-forming PS/PMMA blend on a chemical surface pattern generated with multiple overlapping exposures at different length scales are displayed in the top-down SEM image of FIG. 34 at 3407. These particular patterned structures could be used to fabricate nanowire field effect transistors. One difference between the parallel oriented domains assembled in FIG. 34 and those in FIG. 30 at 3017: the multiple exposure process used to chemically pattern the surface in FIG. 34 resulted in the wide vertical stripes being PMMA preferential, whereas the parallel orienting areas of the chemically patterned surface in FIG. 30 are PS preferential. The large areas of PMMA preferential surfaces resulted in lamellar domains oriented parallel to substrate, with a PMMA layer wetting the substrate and a PS layer wetting the free surface. No defects are observed in the parallel wetting regions in the SEM image shown in FIG. 34 because the free or air interface is favorably wet by a PS layer.

Parameters
Substrate

Any type of substrate may be used. In semiconductor applications, wherein the block copolymer film is to be used as a resist mask for further processing, substrates such as silicon or gallium arsenide may be used. According to various embodiments, the substrate may be provided with an imaging layer thereon. The imaging layer may comprise any type of material that can be patterned or selectively activated. In a preferred embodiment, the imaging layer comprises a polymer brush or a self-assembled monolayer. Examples of self-assembled monolayers include self-assembled monolayers of silane or siloxane compounds, such as self-assembled monolayer of octadecyltrichlorosilane. (See also Peters, R. D., Yang, X. M., Kim, T. K., Sohn, B. H., Nealey, P. F., Using Self-Assembled Monolayers Exposed to X-rays to Control the Wetting Behavior of Thin Films of Block Copolymers, Langmuir, 2000, 16, 4625-4631; Kim, T. K., Sohn, B. H., Yang, X. M., Peters, R. D., Nealey, P. F., Chemical Modification of Self-Assembled Monolayers by Exposure to Soft X-rays in Air, Journal of Physical Chemistry B, 2000, 104, 7403-7410. Peters, R. D., Yang, X. M., Nealey, P. F, Wetting behavior of block copolymers self-assembled films of alkylchlorosilanes: Effect of grafting density, Langmuir, 2000, 16, p. 9620-9626, each of which is hereby incorporated by reference in its entirety and for all purposes.)

In preferred embodiments, the imaging layer comprises a polymer brush. In a particularly improved embodiment, the polymer brush comprises homopolymers or copolymers of the monomers that comprise the block copolymer material. For example, a polymer brush comprised of at least one of styrene and methyl methylacrylate may be used where the block copolymer material is PS-b-PMMA. In a particularly preferred embodiment, the polymer brush is PSOH.

Patterning the Substrate

The aperiodic patterns substrates may be patterned by any method that can produce an aperiodic or irregularly featured pattern. Patterning includes all chemical, topographical, optical, electrical, mechanical patterning and all other methods of selectively activating the substrate. Of course, these methods are also appropriate to produce periodic patterns.

In embodiments where the substrate is provided with an imaging layer, patterning the substrate may comprise patterning the imaging layer. One method of patterning a polymer brush imaging layer is discussed above with respect to FIG. 16.

Alternatively, a substrate may be patterned by selectively applying the pattern material to the substrate.

Figure 17A:
FIGS. 17A-D show a process for creating sub-lithographic resolution patterns.
Figure 17B:
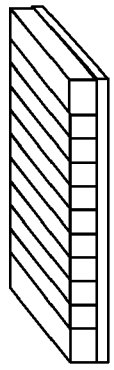
Figure 17C:
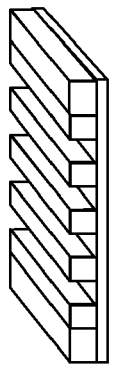
Figure 17D:
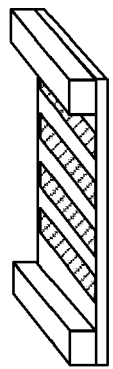

The substrate patterning may comprise top-down patterning (e.g. lithography), bottom-up assembly (e.g. block copolymer self-assembly), or a combination of top-down and bottom-up techniques. For example, FIGS. 17A-D show a process for directed self-assembly may be used in conjunction with lithography to create sub-lithographic resolution patterns. In this technique, lithography is used to activate desired regions on the substrate thereby defining gross features in FIG. 17A. A block copolymer material is then deposited on the activated regions and phase segregation is induced to direct self-assembly of the copolymer into domains (FIG. 17B). One block of the copolymer may then be selectively removed (FIG. 17C). The exposed regions of the substrate would then be selectively activated, thereby creating the pattern on the substrate (FIG. 17D). FIGS. 17A-D show a striped pattern to drive self-assembly of a lamellar domains; however this method is not limited to any particular pattern.

In certain embodiments, the substrate is patterned with x-ray lithography, extreme ultraviolet (EUV) lithography or electron beam lithography.

Methods of fabricating chemically patterned surfaces with patterns having isolated features is also discussed above in reference to FIG. 34.

Pattern

As discussed above, in some embodiments, the patterns used in accordance with the invention are aperiodic and/or contain irregular features. Aperiodic patterns may be thought of as patterns that do not have an underlying periodicity such as found in interference patterns. Irregular features include shapes or configurations found in undirected self-assembled copolymer film. Examples of irregular features include angles, corners, t-junctions and rings. In embodiments wherein the block copolymer material exhibits lamellar morphology, irregular features include all non-linear features, including corners, angles, t-junctions and rings. In embodiments wherein the block copolymer material exhibits parallel cylindrical array morphology, irregular features also include all non-linear features. Feature dimensions typically range from 5 to 100. The patterned area of a substrate may be arbitrarily large. Also in certain embodiments, the pattern contains isolated features and/or features having dense device-oriented geometries.

Block Copolymer Material

The block copolymer material comprises a block copolymer. The block copolymer may be comprised of any number of distinct block polymers (i.e. diblock copolymers, triblock copolymers, etc.). In a preferred embodiment, the block copolymer is a diblock copolymer. A specific example is the diblock copolymer PS-b-PMMA.

The block copolymer material may further comprise one or more additional block copolymers. In some embodiments, the material may be a block copolymer/block copolymer blend. An example of a block copolymer/block copolymer blend is PS-b-PMMA (50 kg/mol)/PS-b-PMMA (100 kg/mol).

The block copolymer material may also further comprise one or more homopolymers. In some embodiments, the material may be a block copolymer/homopolymer blend. In a preferred embodiment, the block copolymer material is a block copolymer/homopolymer/homopolymer blend. In a particularly preferred embodiment, the material is a PS-b-PMMA/PS/PMMA blend.

The block copolymer material may comprise any swellable material. Examples of swellable materials include volatile and non-volatile solvents, plasticizers and supercritical fluids. In some embodiments, the block copolymer material contains nanoparticles dispersed throughout the material. The nanoparticles may be selectively removed.

EXAMPLES

The following examples provide details illustrating aspects of the present invention. These examples are provided to exemplify and more clearly illustrate these aspects of the invention and are in no way intended to be limiting.

Example 1

A self-assembled monolayer imaging layer was patterned with electron beam lithography. The pattern period was 49 nm and the pattern contained a 90° bend. The pattern period refers to the distance between alternate interfaces on the linear portions of the pattern. Block copolymer film of thickness 60 nm was deposited on the substrate and annealed. FIG. 18 shows an image of results. The 90° bend (the area labeled "A") was duplicated in the copolymer film. Defects observed in the assembly are likely due to defects in the underlying chemical pattern.

Block copolymer film was deposited and annealed on patterned substrates containing bends of 45°, 90° and 135° and pattern periods of 65 nm, 70 nm, 75 nm and 80 nm. Surfaces were patterned in ~50 nm film of PMMA on a PSOH brush using the Nabity Nanowriter and a LEO VP-1550 FE-SEM. Standard lithographic processing was used to develop the photoresist. The polymer brush was then etched with a 10 s $O_2$ plasma. A PS-b-PMMA/PS/PMMA was deposited on the patterned surface and annealed for 7 days at 193° C. The block copolymer was a 100 k PS-b-PMMA, 40 k PS, and 40 k PMMA blend with a $\phi_H$ (homopolymer volume fraction) of 0.4. The period of the blend, $L_B$, was 70 nm.

FIGS. 19A-D are images of the self-assembled block copolymer film on patterns having a 135° bend and a $L_s$ of 65 nm, 70 nm, 75 nm and 80 nm. The films are well-ordered for all pattern periods, with some defects observed especially on the $L_s$=80 nm pattern. At least some defects are a result of defects in the underlying pattern and not necessarily due to imperfect duplication and registration. All of the films are virtually defect-free at the 135° bend.

FIGS. 20A-D are images of the self-assembled block copolymer film on patterns having a 90° bend and a $L_s$ of 65 nm, 70 nm, 75 nm and 80 nm. The films are well-ordered at the bends for pattern periods of 65 nm and 70 nm. Defects are observed in the bends at a pattern period of 75 nm and 80 nm. Dark areas are observed on the lighter stripes at the bends. These are believed to indicate the presence of homopolymer that has diffused from the (lower period) linear regions of the pattern to the (higher period) bends. As discussed above with respect to FIG. 6A, the effective $L_s$ at the bend is increased by a factor of $1/\sin(\theta/2)$. For a 90° bend, the effective period is over 40% greater at the bend than at a linear region.

FIGS. 21A-D are images of the self-assembled block copolymer film on patterns having a 45° bend and a $L_s$ of 65 nm, 70 nm, 75 nm and 80 nm. The effective period at the bends is over 160% greater than at the linear regions. The film is well-ordered with no defects at the bends for $L_s$=65 nm. This is because the 70 nm $L_B$ has enough homopolymer to diffuse from the 65 nm linear regions to the bends, it is believed. Some defects are observed at the bends for the 70 nm pattern, while almost all the lamellae contain defects at the bends in the 75 nm and 80 nm patterns. This is because there is not enough homopolymer available to diffuse from the linear regions to the bends, it is believed.

Example 2

CdSe nanoparticles were dispersed in a PS-b-PMMA/PS/PMMA blend. The composition of the ternary blend was 80% PS-b-PMMA, 10% PS and 10% PMMA. The nanoparticles comprised 5% of the material. The material was then deposited on a patterned substrate having a 55 nm period and a 900 bend and ordered. The nanoparticles, the surfaces of which are capped by hydrophobic molecules (tetradecyl phosphonic acid) selectively segregate to the PS domain of the self-assembled lamellae.

Figures 22A, 22B:
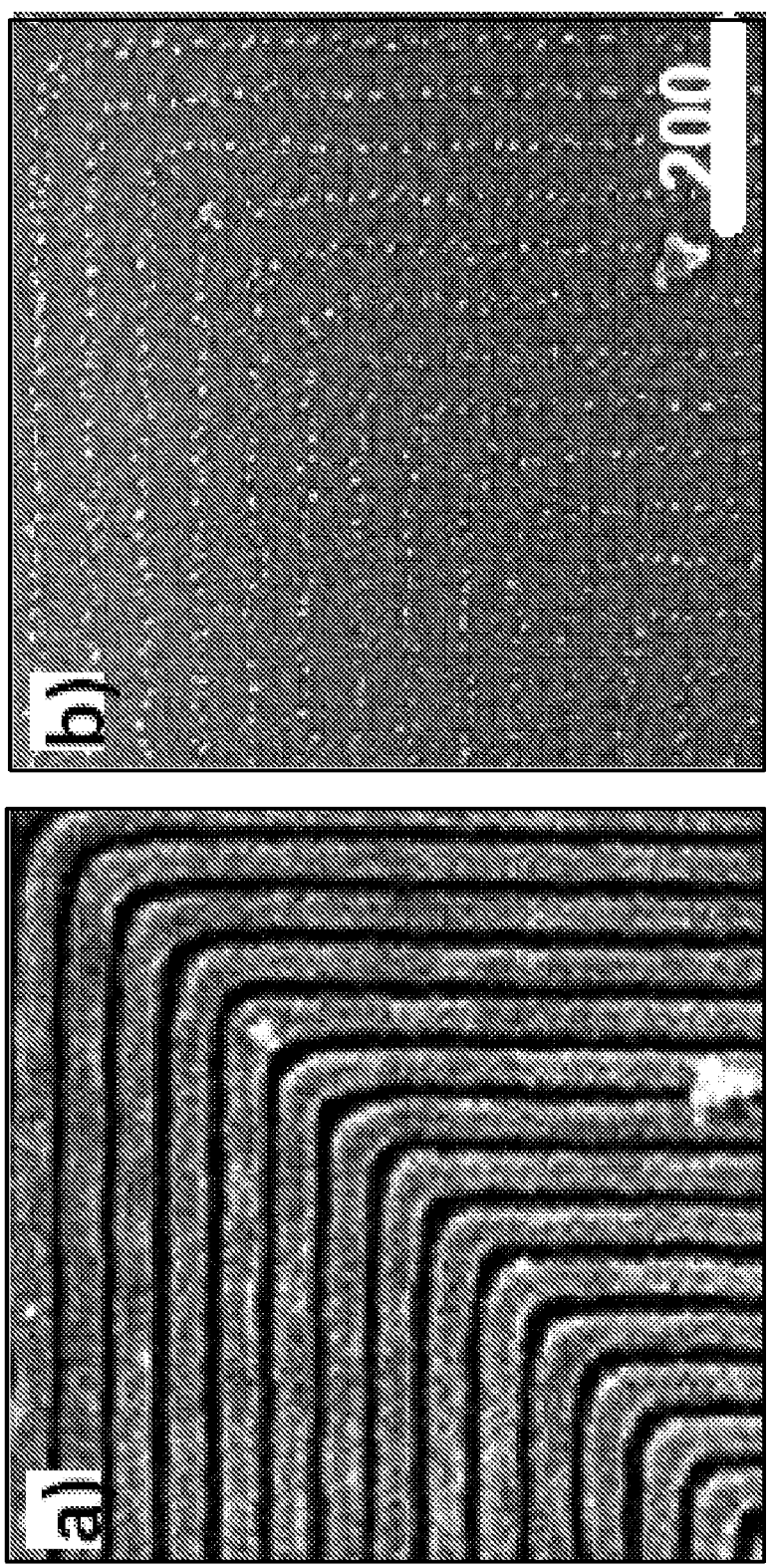
FIGS. 22A and 22B show SEM images of a block copolymer material containing nanoparticles as ordered on a pattern containing a 90° bend.

FIG. 22A shows a top-down SEM image of the ternary blend. FIG. 22B shows a top-down SEM image of the CdSe aligned around the 90° bend, which corresponds to the same region of FIG. 22A. The block copolymer used to align the nanoparticles was completely removed by O2 plasma treatment.

CdSe nanoparticles were aligned using PS-b-PMMA and ternary PS-b-PMMA/PS/PMMA blend thin films on chemically patterned substrate. The nanoparticles, the surfaces of which are capped by hydrophobic molecules (tetradecyl phosphonic acid), selectively segregate to the PS domain of the self-assembled lamellae. The polymer films were removed by $O_2$ plasma leaving the nanoparticles. Results are shown in FIG. 15B. The SEM image on the left shows CdSe nanoparticles aligned using PS-b-PMMA blend on a substrate having a period of 55 nm. The middle image shows CdSe nanoparticles aligned using a 80% PS-b-PMMA, 10% PS and 10% PMMA blend on a substrate having a period of 60 nm. The right image shows CdSe nanoparticles aligned using a 60% PS-b-PMMA, 20% PS and 20% PMMA blend on a substrate having a period of 75 nm. The insets are the top-down SEM images of the directed assembly of polymer films with nanoparticles before $O_2$ plasma treatment. The images show that the nanoparticles are aligned in accordance with the pattern period.

CdSe nanoparticles were aligned using a PS-b-PMMA thin film on chemically patterned substrates having different periods. The lamellar periodicity of PS-b-PMMA/CdSe material was about 51 nm. The block copolymer used to align the nanoparticles was completely removed by $O_2$ plasma treatment. Results are shown in FIGS. 23A-C. The pattern periodicity of the chemically patterned substrate is 50 nm (FIG. 23A), 55 nm (FIG. 23B) and 60 nm (FIG. 23C), respectively. The insets are top-down SEM images of the directed assembly of polymer films with nanoparticles before $O_2$ plasma treatment. (Since the pattern periodicity of (A) is smaller than the lamellar periodicity of PS-b-PMMA/CdSe (~51 nm), the nanoparticle arrays on (A) are slightly mismatched with PS domains. (B) and (C) are progressively more mismatched)

Example 3

A hydroxy-terminated polystyrene (PS, 9.5 kg $mol^{-1}$, Polymer Source, Inc.) brush imaging layer was chemically grafted to the native oxide of a piranha treated Si substrate by annealing under vacuum at 160° C. for ≧48 hr. Ungrafted polymer was removed using sonication in warm toluene for greater than 10 min total. The PS imaging layer was then chemically nanopatterned using traditional lithographic and pattern transfer techniques. A 50 nm thin film of photoresist (poly(methyl methacrylate) PMMA, 950 kg $mol^{-1}$) was spin coated on the PS brush coated substrate and baked at 160° C. for 60 s. Electron beam lithography (LEO 1550-VP field emission scanning electron microscope (SEM) operating with a J. C. Nabity pattern generation system) was performed with an accelerating voltage of 20 keV, a beam current of ~20 pA, and an array of line doses centered at 0.6-1.0 nC/cm. All samples were developed for 30 s in a 1:3 solution of methyl isobutyl ketone:isopropyl alcohol (IPA), followed by a 30 s rinse in IPA and nitrogen drying. The pattern in the photoresist was subsequently transferred to a chemical pattern in the PS brush imaging layer by oxygen plasma etching at 10 mTorr $O_2$ for 10 s. The PS imaging layer exposed to the oxygen plasma was chemically modified to include oxygen containing groups and had a higher surface energy than the chemically unmodified PS brush.

Ternary blends of a lamellar-forming poly(styrene)-block-poly(methyl methacrylate) (PS-b-PMMA, 50 kg $mol^{-1}$ PS and 54 kg $mol^{-1}$ PMMA, PDI 1.04) diblock copolymer and its corresponding homopolymers (PS, 45.0 kg $mol^{-1}$, PDI 1.05 and PMMA, 46.5 kg $mol^{-1}$, PDI 1.04) were prepared as 0.8 or 1.5 wt. % solutions in toluene. This symmetric blend contained 60 wt. % block copolymer and 20 wt. % of each homopolymer and formed a lamellar phase with a periodicity of ~73 nm. The polymers were acquired from Polymer Source, Inc. and used as received. The ternary blend was spin coated on the chemically patterned surface to a thickness of 40 to 45 nm as measured by ellipsometry (Rudolph Auto EL). Thermal annealing was performed under vacuum at 190-195° C. for 3-7 days and was sufficient to achieve equilibrium self-assembled morphologies. The PMMA and PS domains of the block copolymer preferentially wet the chemically oxygenated and the unmodified PS brush regions of the chemical surface pattern, respectively.

Example 4

Imaging layers were patterned and a ternary blend was directed to assemble on the substrate using the methods discussed in Example 3. 40-45 nm thick films of a symmetric ternary blend PS-b-PMMA/PS copolymer material was deposited on a patterned end-grafted polystyrene (PS, 9.5 kg $mol^{-1}$) brush imaging layer. A symmetric block copolymer ternary blend with 60 wt. % poly(styrene-block-methyl methacrylate) (PS-b-PMMA, 104 kg $mol^{-1}$ total, 48 wt. % PS), 20 wt. % PS homopolymer (45 kg $mol^{-1}$), and 20 wt. % poly (methyl methacrylate) homopolymer (PMMA, 46.5 kg $mol^{-1}$) was used. This blend on neutral wetting surfaces assembles into a lamellar morphology with a periodicity of $L_O$=73 nm. The blend assembled on chemically patterned surfaces such that the PS domains wet the regions of the PS brush imaging layer that were not chemically modified, while the PMMA domains wet the regions of imaging layer that had been chemically oxygenated in an oxygen plasma process. SEM images show the results—the PS domains are displayed in light grey, and the PMMA domains in dark grey or black.

Substrates were patterned with a nested array of jogs and a block copolymer material was directed to self assemble on the pattern. FIG. 25 shows SEM images of the resulting structure: the deposited PS-b-PMMA/PS/PMMA ternary blend at 2501 and the structure after PMMA removal at 2503.

Substrates were patterned with one or more jogs embedded in dense arrays of lines and a block copolymer material was directed to self assemble on the pattern. FIG. 26 shows the resulting SEM images. An SEM image of a PS domain directed to assemble into a jog structure is shown at 2601 and at 2605, an SEM image of a PMMA domain directed to assemble into a jog structure is shown. Also shown in 2603 and 2607 are SEM images of PS and PMMA domains, respectively, directed to assemble into structures having multiple isolated jog features.

Substrates were patterned with patterns having t-junctions, including multiple perpendicular t-junctions. Resulting SEM images are shown in FIG. 27. Image 2705 shows both PS and PMMA domains directed to assemble into a t-junction structure, at 2707 and 2709, respectively.

Example 5

Imaging layers were patterned and a ternary blend was directed to assemble on the substrate using the methods discussed in Example 3. The directed assembly of PS/PMMA block copolymers into isolated segment geometries that were 1 µm in length and ~35 nm in width was performed. Sets of 20, 10, 5, 4, 3, 2, and 1 PMMA lines were fabricated in the block copolymer film. Resulting SEM image are shown in FIG. 32A. The isolated line structures appear as vertical, dark gray lines and are sandwiched between light gray lines.

An ultraviolet exposure with a wavelength of 254 nm and a dose of 0.875 $J/cm^2$ was used to degrade the PMMA and partially crosslink the PS domains. An acetic acid wash and deionized water rinse for 1 min each removed the degraded PMMA domains. Reactive ion etching for 4 s with an oxygen plasma (50 W and a PS etch rate of 100 nm/min) was used to etch through the PS brush imaging layer. The resulting PS templates (shown in FIG. 32B in the left and middle SEM images) were suitable masks for the wet etching of isolated structures into substrates consisting of a silicon oxide ($SiO_2$) layer deposited on Si wafers. Structures ~10 nm in depth were etched into the $SiO_2$ substrate with a solution of 50 to 1 deionized water to hydrofluoric acid (HF, 48%). The remaining PS templates were removed by oxygen plasma or piranha cleaning processes. A resulting SEM image of a 2 line structure is shown in the right image in FIG. 32B. The etch depth in the patterned lines was ~5 nm, and the root-mean-square roughness outside of the lines was <0.4 nm and was comparable to a bulk unpatterned Si wafer.

Discussion and further examples of replication of irregular patterns may be found in Stoykovich, M. P., Müller, M., Kim, S. O., Solak, H. H., Edwards, E. W., de Pablo, J. J., Nealey, P. F., Directed Assembly of Block Copolymer Blends into Nonregular Device Oriented Structures, *Science* (2005, 308, 1442), which is hereby incorporated by reference in its entirety and for all purposes.

Although the foregoing invention has been described in some detail for purposes of clarity of understanding, it will be apparent that certain changes and modifications may be practiced within the scope of the invention. It should be noted that there are many alternative ways of implementing both the process and compositions of the present invention. Accordingly, the present embodiments are to be considered as illustrative and not restrictive, and the invention is not to be limited to the details given herein.

All references cited are incorporated herein by reference in their entirety and for all purposes.

The invention claimed is:

1. A method of forming a copolymer structure on a substrate comprising:
   a) providing a patterned substrate, said pattern having a first patterned region comprising one or more patterned features and a second patterned region comprising one or more patterned features, wherein the first and second patterned regions differ in one or more of feature geometry, feature size, or feature pitch;
   b) depositing a layer of a block copolymer material onto the patterned substrate; and
   c) directing the assembly of the block copolymer material in accordance with the underlying pattern such that the underlying pattern including the patterned features of the first patterned region and the patterned features of the second patterned region are replicated in the assembled block copolymer material.

2. The method of claim 1 wherein the feature geometry of the first patterned region is selected from the following: a jog, a bend, a t-junction, a line segment, and a spot.

3. The method of claim 1 wherein the first and second patterned regions are separated by uniformly patterned or unpatterned regions.

4. The method of claim 1 wherein the first patterned region comprises a plurality of patterned features.

5. The method of claim 4 wherein the second patterned region comprises a plurality of patterned features.

6. The method of claim 4 wherein the first patterned region is adjacent to the second patterned region.

7. The method of claim 1 wherein the first patterned region comprises parallel line features.

8. The method of claim 7 wherein the second patterned region comprises an array of spots.

9. The method of claim 1 wherein the first patterned region comprises an array of spots.

10. The method of claim 1 wherein the first patterned region comprises a bend.

11. The method of claim 1 wherein the first patterned region comprises a t-junction.

12. The method of claim 1 wherein the first and second patterned regions differ in feature geometry.

13. The method of claim 1 wherein each of the first and second patterned regions comprises two adjacent differently activated areas.

14. The method of claim 1 wherein each of the first and second patterned regions comprises two adjacent areas having different surface chemistries.

15. The method of claim 1 wherein the first and second patterned regions are separated by an unpatterned region.

16. A method of forming a copolymer structure on a substrate comprising:
   a) providing a patterned substrate;
   b) depositing a layer of a block copolymer material onto the said patterned substrate; and
   c) directing the assembly of the block copolymer material in accordance with the underlying pattern to form a copolymer structure, wherein the copolymer structure comprises a first ordered region comprising linear domains of the block copolymer material having a first direction and a second ordered region comprising linear domains of the block copolymer material having a second direction, wherein said first direction is different from said second direction, and wherein the domains of the first and second ordered regions of the copolymer structure are registered with the patterned substrate.

17. The method of claim 16 wherein the first ordered region is adjacent to the second ordered region.

18. The method of claim 16 wherein the first direction is perpendicular to the second direction.

19. A method of forming a copolymer structure on a substrate comprising:
   depositing a layer of a block copolymer material onto a patterned substrate;
   inducing the assembly of the block copolymer material to form a copolymer structure replicating the underlying substrate pattern and having a domain oriented parallel to and contacting the patterned substrate and a perpendicular-oriented domain oriented perpendicular to and contacting the patterned substrate.

20. The method of claim 19 wherein the copolymer structure comprises perpendicular-oriented domains separated by parallel-oriented domains.

21. The method of claim 19 further comprising etching the substrate, wherein the parallel-oriented domains act as an etch mask.

22. The method of claim 19 wherein the copolymer structure comprises parallel-oriented domains separated by perpendicular-oriented domains.

* * * * *